US012610705B2

(12) United States Patent
Xiao et al.

(10) Patent No.: US 12,610,705 B2
(45) Date of Patent: Apr. 21, 2026

(54) DISPLAY PANEL, DISPLAY MODULE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bangqing Xiao, Beijing (CN); Lili Du, Beijing (CN); Ni Yang, Beijing (CN); Minghui Wang, Beijing (CN)

(73) Assignees: (A) NAMENSDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 428 days.

(21) Appl. No.: 18/256,124

(22) PCT Filed: Jan. 24, 2022

(86) PCT No.: PCT/CN2022/073590
§ 371 (c)(1),
(2) Date: Jun. 6, 2023

(87) PCT Pub. No.: WO2023/137766
PCT Pub. Date: Jul. 27, 2023

(65) Prior Publication Data
US 2024/0381717 A1 Nov. 14, 2024

(51) Int. Cl.
*H10K 59/13* (2023.01)
*H10K 59/131* (2023.01)

(52) U.S. Cl.
CPC ................................. *H10K 59/131* (2023.02)

(58) Field of Classification Search
CPC ..................................................... H10K 59/131
USPC ........................................................... 257/72
See application file for complete search history.

(56) References Cited

FOREIGN PATENT DOCUMENTS

CN 111769148 A * 10/2020 ........... H10K 59/123
WO WO-2021184930 A1 * 9/2021 ........... H10K 59/878

* cited by examiner

*Primary Examiner* — Phuc T Dang
(74) *Attorney, Agent, or Firm* — Dority & Manning, P.A.

(57) ABSTRACT
A display panel includes a plurality of first pixel circuits, a plurality of second pixel circuits, a plurality of first light-emitting devices, a plurality of second light-emitting devices, a plurality of first initial signal lines and a plurality of second initial signal lines. A first pixel circuit is electrically connected to a first initial signal line and a first light-emitting device, and is configured to transmit a first initial signal transmitted by the first initial signal line to the first light-emitting device. A second pixel circuit is electrically connected to a second initial signal line and a second light-emitting device, and is configured to transmit a second initial signal transmitted by the second initial signal line to the second light-emitting device. A voltage value of the second initial signal is greater than a voltage value of the first initial signal.

20 Claims, 45 Drawing Sheets

Poly

Gate1

ILD

SD1

PLN1

H3

Y

H1   H2   H1   H2   H1   H2   H1   H2

X

G-G'(100)

PLN1

(SD1)HC1

ILD (Gate2)Vinit2

Vinit2

Vinit3

Vinit3

GI2

Reset(n+1)

Gate1

GI1

T1(Poly)

101

SD2

Data     VDD

Y

X

K-K'

Z（SD1）

PLN2
SD2
PLN1
ILD
Gate2
GI2
C1(Cst)
GI1
Poly
101

Gate1

(T2)d2

SD2
PLN1
ILD
SD1
Gate2
Gate1
GI2
GI1
Poly

}102

M-M'

VDD(SD2)

Data

SD1 s5

PLN2

PLN1

ILD

GI2

EM
GI1
d6(Poly)
101

PLN2

Y

X

CO1

PLN3

<u>CO2</u>

PLN4

CO3

Y

X

ILD
Vinit1(n-1)
Vinit2(n-1)
Reset(n)
Vinit3(n)
PLN1
Scan(n)
EM
CO3
Vinit1(n)
Vinit2(n)
Reset(n+1)
Vinit3(n+1)
Y
X    Gate1    Poly    Gate2    SD1    SD2

PLN5

AND

Y

X

PDL

EL

SD1 (421)

SD2 (412)

DISPLAY PANEL, DISPLAY MODULE AND DISPLAY APPARATUS

CROSS-REFERENCE TO RELATED APPLICATION

This application is a national phase entry under 35 USC 371 of International Patent Application No. PCT/CN2022/073590, filed on Jan. 24, 2022, which is incorporated herein by reference in its entirety.

TECHNICAL FIELD

The present disclosure relates to the field of display technologies, and in particular, to a display panel, a display module and a display apparatus.

BACKGROUND

With the development of display technologies, a full display with a camera (FDC) has been gradually applied to display products due to its advantage of having a relatively large screen-to-body ratio. A full-screen display apparatus is generally provided with an optical element such as a camera in an under-screen region of a display panel, so that the screen-to-body ratio is greatly improved.

SUMMARY

In an aspect, a display panel is provided. The display panel has a main display region and an auxiliary display region. The display panel includes: a plurality of pixel circuits located in the main display region, the plurality of pixel circuits including a plurality of first pixel circuits and a plurality of second pixel circuits; a plurality of light-emitting devices including a plurality of first light-emitting devices located in the main display region and a plurality of second light-emitting devices located in the auxiliary display region, the plurality of first pixel circuits being electrically connected to the plurality of first light-emitting devices, and the plurality of second pixel circuits being electrically connected to the plurality of second light-emitting devices; and a plurality of first initial signal lines and a plurality of second initial signal lines. A first pixel circuit is electrically connected to a first initial signal line and a first light-emitting device, and is configured to transmit a first initial signal transmitted by the first initial signal line to the first light-emitting device, so as to reset the first light-emitting device. A second pixel circuit is electrically connected to a second initial signal line and a second light-emitting device, and is configured to transmit a second initial signal transmitted by the second initial signal line to the second light-emitting device, so as to reset the second light-emitting device. A voltage value of the second initial signal is greater than a voltage value of the first initial signal.

In some embodiments, the display panel further includes a plurality of connection lines. The second pixel circuit is electrically connected to the second light-emitting device via a connection line. A material of the plurality of connection lines includes a light-transmissive conductive material.

In some embodiments, a difference between the voltage value of the second initial signal and the voltage value of the first initial signal is positive correlation with a length of the connection line.

In some embodiments, the display panel includes a plurality of light-emitting device columns that are sequentially arranged in a first direction; a light-emitting device column includes first light-emitting devices, of the plurality of first light-emitting devices located in the main display region, and second light-emitting devices, of the plurality of second light-emitting devices located in the auxiliary display region, that are sequentially arranged in a second direction. The display panel further includes a plurality of data lines each extending in the second direction. The first direction intersects the second direction. First pixel circuits electrically connected to the first light-emitting devices in the light-emitting device column and second pixel circuits electrically connected to the second light-emitting devices in the light-emitting device column are electrically connected to a same data line.

In some embodiments, a portion, electrically connected to the second pixel circuits, of the data line is located in the main display region.

In some embodiments, the second pixel circuits electrically connected to the second light-emitting devices in the light-emitting device column are sequentially arranged in the second direction, and are located on a side of the auxiliary display region in the first direction. The data line includes: a first data sub-line and a second data sub-line that extend in the second direction and are respectively located on two opposite sides of the auxiliary display region in the second direction, a third data sub-line extending in the second direction and located on a side of the auxiliary display region in the first direction, a first transfer line extending in the first direction and connected to the first data sub-line and the third data sub-line, and a second transfer line extending in the first direction and connected to the second data sub-line and the third data sub-line. The first data sub-line and the second data sub-line are electrically connected to the first pixel circuits in the light-emitting device column, and the third data sub-line is electrically connected to the second pixel circuits in the light-emitting device column.

In some embodiments, the display panel further includes a substrate, and a first source-drain conductive layer and a second source-drain conductive layer that are sequentially arranged, in a direction away from the substrate, on a side of the substrate. The first data sub-line, the second data sub-line and the third data sub-line are located in the second source-drain conductive layer, and the first transfer line and the second transfer line are located in the first source-drain conductive layer.

In some embodiments, a pixel circuit includes a compensation transistor; the compensation transistor includes an active pattern and a gate pattern that are arranged in sequence in a direction away from the substrate. The active pattern includes a first semiconductor portion, a conductor portion and a second semiconductor portion that are connected in sequence; the gate pattern includes a first sub-gate and a second sub-gate that are connected to each other; the first semiconductor portion is partially opposite to the first sub-gate, and the second semiconductor portion is partially opposite to the second sub-gate. The display panel further includes a third initial signal line electrically connected to the pixel circuit and a shielding block electrically connected to the third initial signal line; the shielding block is partially opposite to the conductor portion.

In some embodiments, the shielding block and the third initial signal line are of a one-piece structure.

In some embodiments, the first initial signal lines, the second initial signal lines and the third initial signal line are located in a same layer. The plurality of pixel circuits are arranged in a plurality of rows. In a first initial signal line, a second initial signal line and the third initial signal line that are located between two adjacent rows of pixel circuits, the third initial signal line is closer to the compensation transistor electrically connected to the third initial signal line than the first initial signal line and the second initial signal line.

In some embodiments, the pixel circuit further includes a second reset transistor; a first electrode of the second reset transistor is electrically connected to the third initial signal line, and a second electrode of the second reset transistor is electrically connected to a second electrode of the compensation transistor. The display panel further includes a reset signal line electrically connected to a control electrode of the second reset transistor; the second reset transistor is configured to transmit a third initial signal transmitted by the third initial signal line to the second electrode of the compensation transistor under control of a reset signal transmitted by the reset signal line. An orthographic projection of the reset signal line on the substrate is located between an orthographic projection of the first initial signal line on the substrate and an orthographic projection of the second initial signal line on the substrate or located between the orthographic projection of the second initial signal line on the substrate and an orthographic projection of the third initial signal line on the substrate.

In some embodiments, the display panel further includes a substrate, and a first gate conductive layer and a second gate conductive layer that are sequentially arranged, in a direction away from the substrate, on a side of the substrate. The reset signal line is located in the first gate conductive layer. The first initial signal lines, the second initial signal lines and the third initial signal line are located in the second gate conductive layer.

In some embodiments, the plurality of pixel circuits are arranged in a plurality of rows and a plurality of columns. Each pixel circuit includes a storage capacitor; the storage capacitor includes a first plate and a second plate that are arranged in sequence. Second plates of at least two storage capacitors in a same row of pixel circuits are connected to each other to be of a one-piece structure.

In some embodiments, the display panel further includes a plurality of voltage signal lines each extending in a second direction; a voltage signal line is electrically connected to second plates of storage capacitors in a column of pixel circuits; the column of pixel circuits extend in the second direction.

In some embodiments, the display panel further includes a substrate, and a second gate conductive layer and a second source-drain conductive layer that are sequentially arranged, in a direction away from the substrate, on a side of the substrate. The second plates are located in the second gate conductive layer; the plurality of voltage signal lines are located in the second source-drain conductive layer.

In some embodiments, the pixel circuit further includes a compensation transistor and a transfer portion that is connected to a second electrode of the compensation transistor and the first plate of the storage capacitor. The display panel further includes a first source-drain conductive layer located between the second gate conductive layer and the second source-drain conductive layer. The transfer portion is located in the first source-drain conductive layer; an orthographic projection of the transfer portion on the substrate is located within an orthographic projection of a voltage signal line electrically connected to the pixel circuit on the substrate.

In some embodiments, the display panel further includes a first gate conductive layer disposed on a side of the second gate conductive layer away from the second source-drain conductive layer and a first planarization layer disposed between the second gate conductive layer and the second source-drain conductive layer. The pixel circuit further includes a first light-emitting control transistor and a second light-emitting control transistor. The first planarization layer is provided with first via holes and second via holes therein; a first electrode of the first light-emitting control transistor is electrically connected to a voltage signal line electrically connected to the pixel circuit through a first via hole, and a second electrode of the second light-emitting control transistor is electrically connected to a light-emitting device through a second via hole. The display panel further includes an enable signal line electrically connected to a control electrode of the first light-emitting control transistor and a control electrode of the second light-emitting control transistor; the enable signal line is located in the first gate conductive layer; orthogonal projections of the first via hole and the second via hole on the substrate are located within an orthographic projection of the enable signal line on the substrate.

In some embodiments, the display panel further includes a plurality of data lines each extending in the second direction, and a plurality of third initial signal lines, a plurality of scan signal lines and a plurality of reset signal lines each extending in a first direction; the first direction intersects the second direction. The pixel circuit further includes a driving transistor, a compensation transistor, a first reset transistor, a second reset transistor and a switching transistor. A control electrode of the compensation transistor is electrically connected to a scan signal line, and a second electrode of the compensation transistor is electrically connected to a first node; a control electrode of the second reset transistor is electrically connected to a reset signal line, a first electrode of the second reset transistor is electrically connected to a third initial signal line, and a second electrode of the second reset transistor is electrically connected to the first node; a second electrode of the first light-emitting control transistor is electrically connected to a second node; a control electrode of the driving transistor is electrically connected to the first node, a first electrode of the driving transistor is electrically connected to the second node, and a second electrode of the driving transistor is electrically connected to a third node; a control electrode of the switching transistor is electrically connected to the scan signal line, a first electrode of the switching transistor is electrically connected to a data line, and a second electrode of the switching transistor is electrically connected to the second node; a first electrode of the second light-emitting control transistor is electrically connected to the third node; the first plate of the storage capacitor is electrically connected to the first node; a control electrode of the first reset transistor is electrically connected to the scan signal line; a first electrode of a first reset transistor of the first pixel circuit is electrically connected to the first initial signal line, and a second electrode of the first reset transistor of the first pixel circuit is electrically connected to a first light-emitting device; a first electrode of a first reset transistor of the second pixel circuit is electrically connected to the second initial signal line, and a second electrode of the first reset transistor of the second pixel circuit is electrically connected to a second light-emitting device.

In another aspect, a display module is provided. The display module includes the display panel as described in any one of the above embodiments, a cover plate located on a light exit side of the display panel and a protective layer located on a non-light exit side of the display panel.

In yet another aspect, a display apparatus is provided. The display apparatus includes the display module as described in the above embodiment and an optical element located on the non-light exit side of the display panel of the display module. The optical element is located in the auxiliary display region of the display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products involved in the embodiments of the present disclosure.

DETAILED DESCRIPTION

Figure 1:
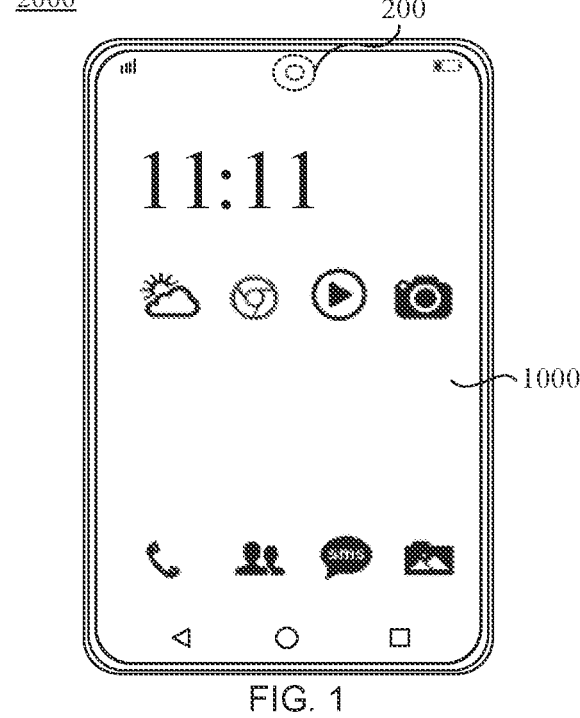
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B. and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "perpendicular" or "equal" includes a stated condition and a condition similar to the stated condition, a range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

In a circuit structure (e.g., a pixel circuit) provided in the embodiments of the present disclosure, transistors used in the circuit structure may be thin film transistors (TFTs), field effect transistors (FETs) or other switching devices with the same characteristics. The embodiments of the present disclosure are all described by considering the TFTs as examples.

In the circuit structure provided in the embodiments of the present disclosure, a control electrode of each transistor that is used is a gate, a first electrode of the transistor is one of a source and a drain, and a second electrode of the transistor is the other of the source and the drain. Since a source and a drain of a transistor may be symmetrical in structure, there may be no difference in structure between the source and the drain thereof. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For another example, in a case where the transistor is an N-type transistor, the first electrode of the transistor is the drain, and the second electrode of the transistor is the source.

In the circuit structure provided in the embodiments of the present disclosure, a first node, a second node and other nodes do not represent components that actually exist, but represent junction points of relevant electrical connections in a circuit diagram. That is, these nodes are nodes equivalent to the junction points of the relevant electrical connections in the circuit diagram.

The transistors included in the circuit structure provided in the embodiments of the present disclosure may be all the N-type transistors or the P-type transistors. Alternatively, a part of the transistors are the N-type transistors, and the other part of the transistors are the P-type transistors. In the embodiments of the present disclosure, the phrase "effective level" refers to a level that enables a transistor to be turned on. The P-type transistor may be turned on under control of a low-level signal; the N-type transistor may be turned on under control of a high-level signal.

Hereinafter, the description will be made by taking an example where the transistors included in the circuit structure provided in the embodiments of the present disclosure are all the P-type transistors.

Some embodiments of the present disclosure provide a display panel 100, a display module 1000 and a display apparatus 2000, and the display panel 100, the display module 1000 and the display apparatus 2000 are respectively described below.

Some embodiments of the present disclosure provide a display apparatus 2000 as shown in FIG. 1. The display apparatus 2000 may be any display apparatus that displays text or images whether in motion (e.g., a video) or stationary (e.g., a still image). More specifically, it is anticipated that the display apparatus of the embodiments may be implemented in a variety of electronic apparatuses or associated with a variety of electronic apparatuses. The variety of electronic apparatuses include, but are not limited to, mobile phones, wireless apparatuses, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

In some embodiments, as shown in FIG. 1, the display apparatus 2000 includes a display module 1000.

For example, the display module 1000 may be an organic light emitting diode (OLED) display module, a quantum dot light emitting diodes (QLED) display module, a micro light emitting diodes (Micro LED) display module or a mini light emitting diodes (Mini LED) display module, which is not specifically limited in the embodiments of the present disclosure.

The display apparatus 2000 further includes a frame, a display driver integrated circuit (IC) and other electronic accessories.

Hereinafter, some embodiments of the present disclosure are described by taking an example where the display module 1000 is the OLED display module.

Figure 2:
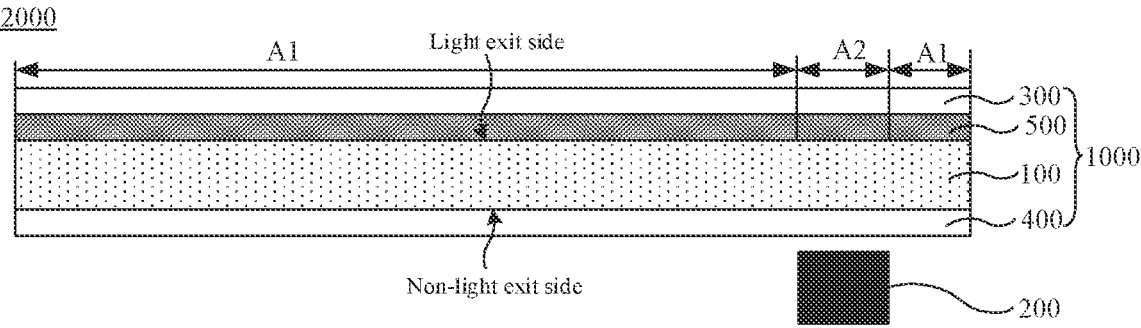
FIG. 2 is a structural diagram of a display module, in accordance with some embodiments of the present disclosure.

In some embodiments, as shown in FIG. 2, the display module 1000 includes a display panel 100.

Figure 3A:
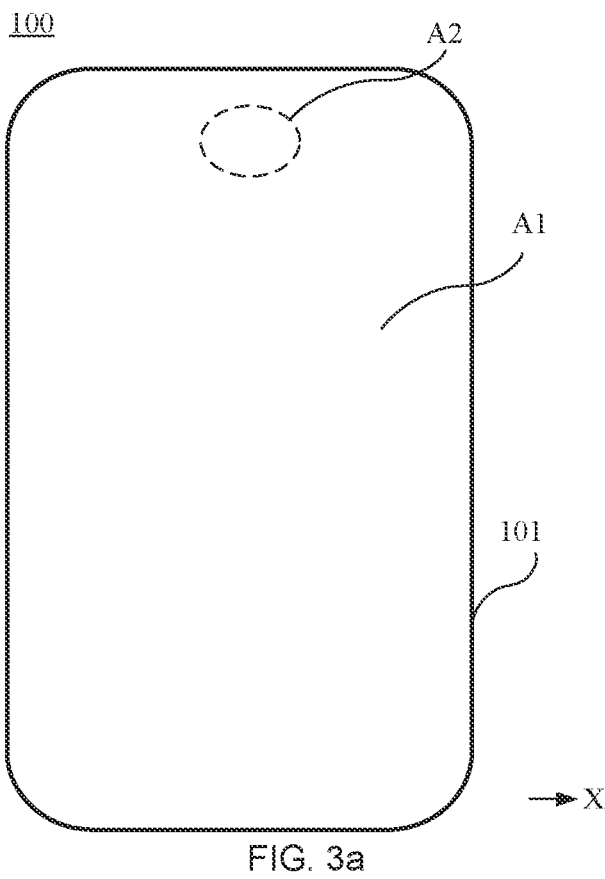
FIG. 3a is a structural diagram of a display panel, in accordance with some embodiments of the present disclosure.
Figure 3B:
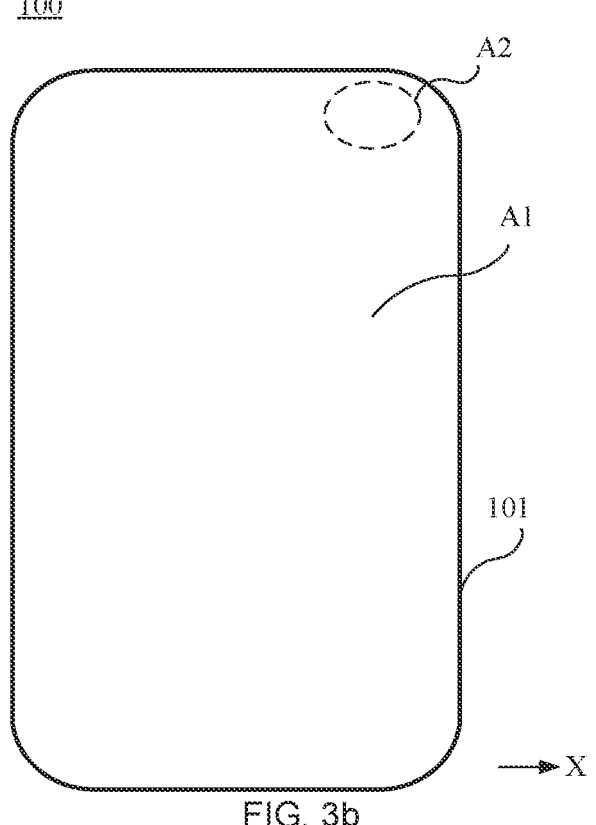
FIG. 3b is a structural diagram of another display panel, in accordance with some embodiments of the present disclosure.

In some examples, as shown in FIGS. 2, 3a and 3b, the display panel 100 has a main display region A1 and an auxiliary display region A2.

For example, as shown in FIGS. 3a and 3b, the main display region A1 may surround the auxiliary display region A2.

For example, as shown in FIG. 3a, the auxiliary display region A2 may be located in a middle of the main display region A1 in a first direction X. Alternatively, as shown in FIG. 3b, the auxiliary display region A2 may be located on a side of the main display region A1 in the first direction X.

For example, a portion of the display panel 100 located in the main display region A1 and a portion of the display panel 100 located in the auxiliary display region A2 may be both used for displaying images.

For example, a light transmittance of the portion of the display panel 100 located in the auxiliary display region A2 is greater than a light transmittance of the portion of the display panel 100 located in the main display region A1. External light may pass through the portion of the display panel 100 located in the auxiliary display region A2 from a side of the display panel 100 and be incident on the other side of the display panel 100.

In some embodiments, as shown in FIG. 2, the display module 1000 further includes a cover plate 300 located on a light exit side of the display panel 100 and a protective layer 400 located on a non-light exit side of the display panel 100.

For example, the light exit side of the display panel 100 is a side of the display panel 100 that displays images, and the non-light exit side of the display panel 100 refers to a side opposite to the light exit side of the display panel 100.

For example, a material of the cover plate may be transparent glass, or may be a transparent organic material. For example, the transparent organic material includes polyimide (PI). In this way, it is possible to avoid a reduction of a luminous efficiency of the display panel 100, thereby preventing image display of the display panel 100 from being affected.

For example, a material of the protective layer may be a transparent organic material. For example, the transparent organic material includes polyethylene terephthalate (PET). The protective layer may not only support the display panel 100, but also prevent the display panel 100 from being subjected to external pollutions and/or scratches.

In some examples, as shown in FIG. 2, the display module 1000 further includes a polarizer 500 located between the display panel 100 and the cover plate 300.

For example, the external light entering the display panel 100 is prone to be reflected by internal structures of the display panel 100 and exists from the light exit side of the display panel 100, which affects the display quality of the display panel 100.

In the embodiments of the present disclosure, the polarizer is disposed between the display panel 100 and the cover plate. Thus, after the external light passes through the cover plate and the polarizer, enters the display panel 100 and is reflected by the internal structures of the display panel 100, the reflected external light may be blocked by the polarizer, so that the reflected external light is prevented from existing from the light exit side of the display panel 100. As a result, the display quality of the display panel 100 is improved.

For example, as shown in FIG. 2, the display apparatus 2000 further includes an optical element 200 located on the non-light exit side of the display panel 100 of the display module 1000, and the optical element 200 is located in the auxiliary display region A2 of the display panel 100.

In some examples, the optical element 200 is located in the auxiliary display region A2. In this way, external light may pass through the portion of the display panel 100 located in the auxiliary display region A2, enter the optical element 200 and be collected by the optical element 200, so that the optical element 200 is able to operate normally.

For example, the optical element 200 may be a camera, a fingerprint identification sensor, an infrared sensor or the like.

The embodiments of the present disclosure is described by taking an example where the optical element 200 is the camera.

For example, during an operation process of the camera, external light may pass through the portion of the display panel 100 located in the auxiliary display region A2. In this way, the camera may collect the light, so as to achieve a photographing function. For example, in a case where the camera is operating (for example, a user is taking a selfy), a black image may be displayed in the auxiliary display region A2, and an image of the selfy of the user is displayed in the main display region A1, so that a position where the camera is located is shown clearly. Alternatively, the image of the selfy of the user is displayed both in the main display region A1 and the auxiliary display region A2, so that the position where the camera is located is not shown.

For example, in a case where the camera is not operating, the portion of the display panel 100 located in the main display region A1 may perform display, so that the entire display panel 100 and the entire display module 1000 are each capable of displaying images.

In the embodiments of the present disclosure, it is possible to set the light transmittance of the portion of the display panel 100 located in the auxiliary display region A2, and provide the optical element 200 in the auxiliary display region A2. In this way, it is possible to not only ensure the optical element 200 to operate normally, but also improve a display area of each of the display panel 100, the display module 1000 and the display apparatus 2000, so as to improve a screen-to-body ratio.

Figure 4A:
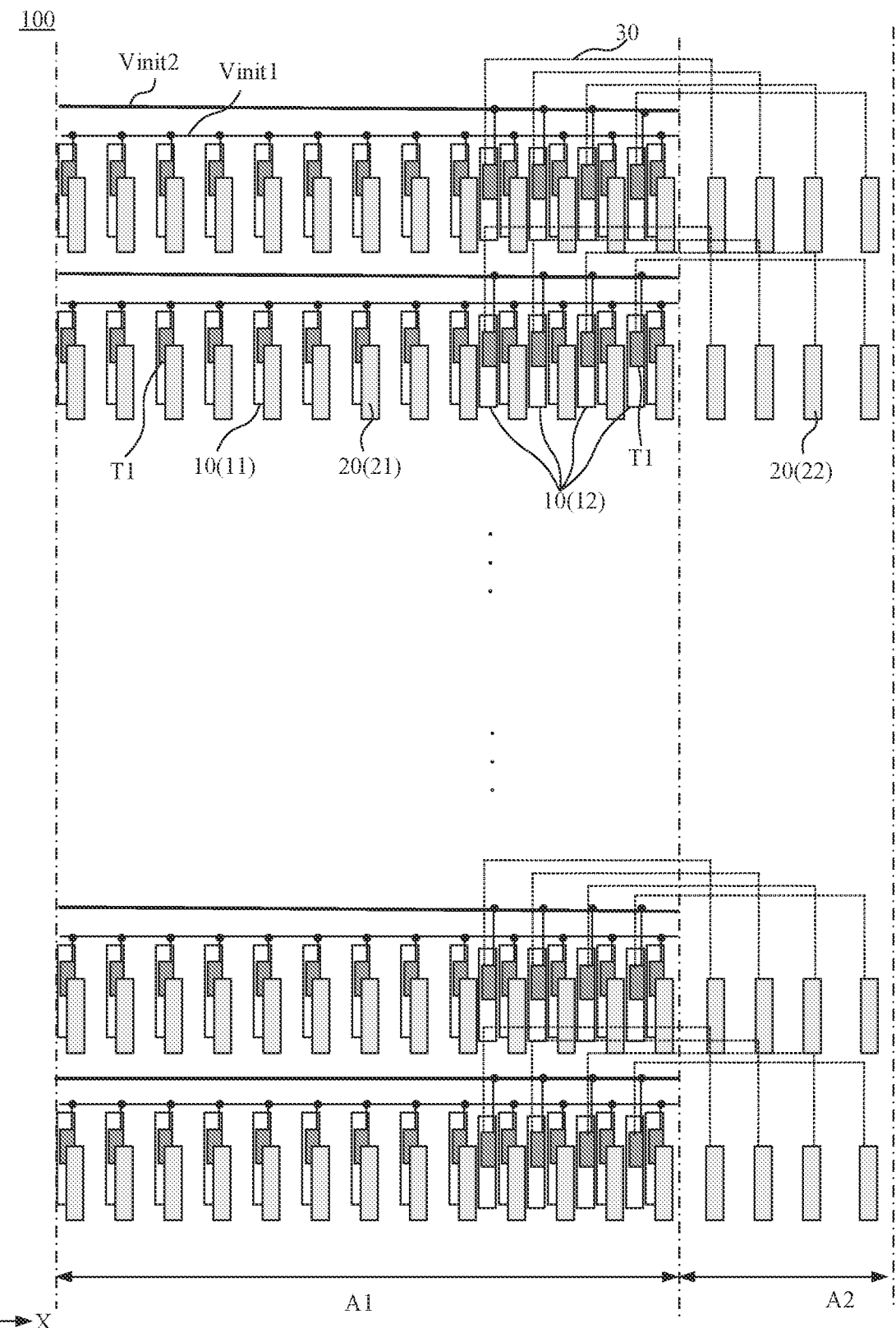
FIG. 4a is a structural diagram of yet another display panel, in accordance with some embodiments of the present disclosure.
Figure 4B:
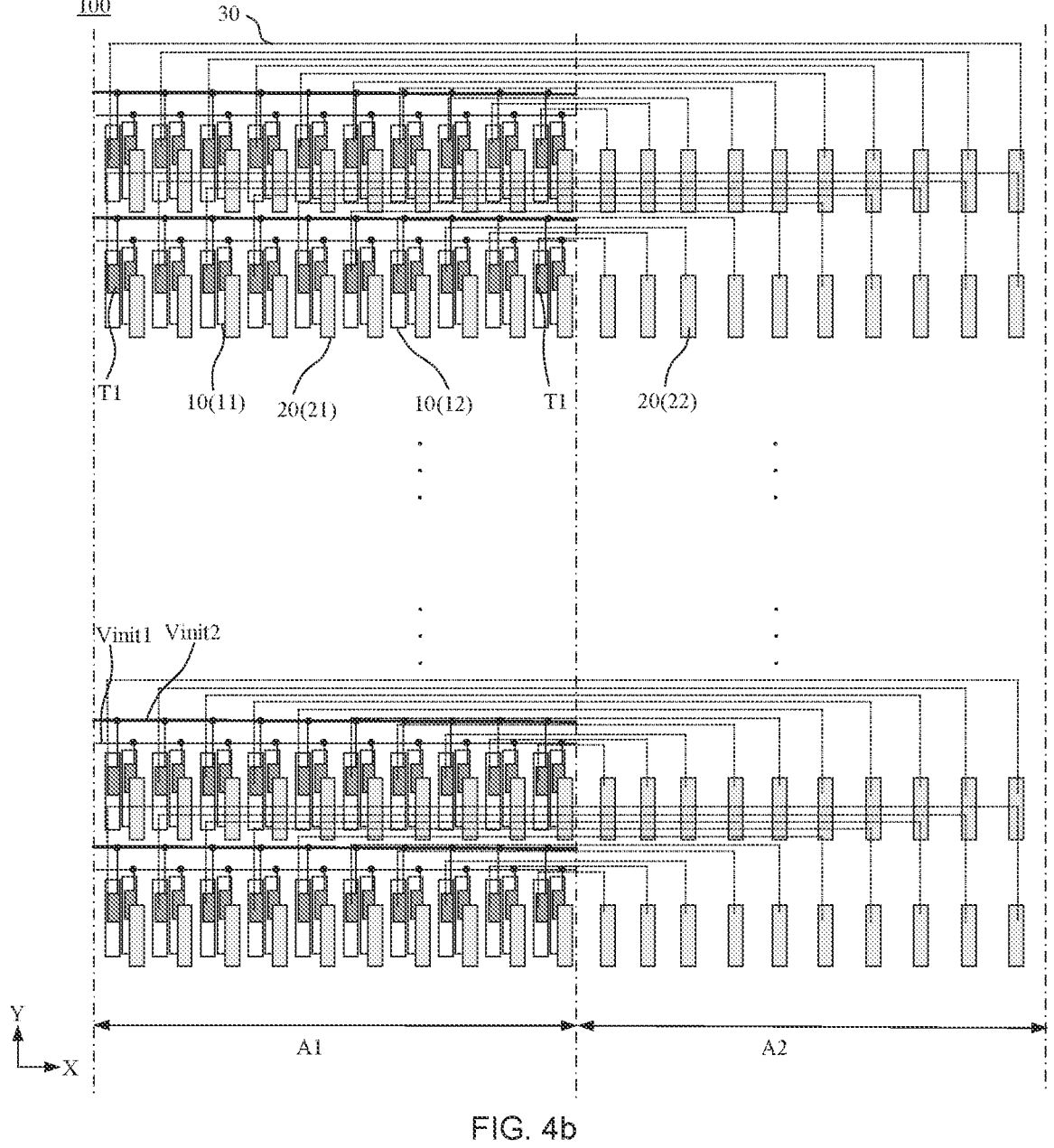
FIG. 4b is a structural diagram of yet another display panel, in accordance with some embodiments of the present disclosure.

For example, as shown in FIGS. 4a and 4b, the display panel 100 includes a plurality of pixel circuits 10 and a plurality of light-emitting devices 20.

For example, the plurality of pixel circuits 10 may be electrically connected to the plurality of light-emitting devices 20 in a one-to-one correspondence. For another example, in the embodiments of the present disclosure, a single pixel circuit 10 may be electrically connected to multiple light-emitting devices 20; alternatively, multiple pixel circuits 10 may be electrically connected to a single light-emitting device 20.

In the embodiments of the present disclosure, a structure of the display panel 100 will be described below by taking an example where a pixel circuit 10 is electrically connected to a light-emitting device 20.

For example, in the display panel 100, each light-emitting device 10 may emit light due to a driving action of a respective pixel circuit 20, and light emitted by the plurality of light-emitting devices 10 interacts, so that the display panel 100 is enabled to achieve a display function.

For example, the light-emitting device 20 may include an anode, a light-emitting functional layer and a cathode that are stacked in sequence. The light-emitting functional layer may include a light-emitting layer. Optionally, the light-emitting functional layer may further include at least one of a hole injection layer, a hole transporting layer, an electron transporting layer and an electron injection layer.

A common voltage is applied to the cathode of the light-emitting device 20, and the respective pixel circuit 10 is used for applying a driving voltage to the anode of the light-emitting device 20, so that an electric field may be created between the anode and the cathode, and the electric field may drive different carriers (i.e., holes and electrons) to recombine in the light-emitting layer. As a result, the light-emitting device 20 is able to emit light.

In some examples, as shown in FIGS. 4a and 4b, the plurality of pixel circuits 10 include a plurality of first pixel circuits 11 and a plurality of second pixel circuits 12; the plurality of light-emitting devices 20 include a plurality of first light-emitting devices 21 and a plurality of second light-emitting devices 22. The first pixel circuits 11 are electrically connected to the respective first light-emitting devices 21, and the first light-emitting devices 21 each emit light due to a driving action of the respective first pixel circuit 11. The second pixel circuits 12 are electrically connected to the respective second light-emitting devices 22, and the second light-emitting devices 22 each emit light due to a driving action of the respective second pixel circuit 12.

For example, as shown in FIGS. 4a and 4b, the plurality of first pixel circuits 11 and the plurality of second pixel circuits 12 are located in the main display region A1, the plurality of first light-emitting devices 21 electrically connected to the first pixel circuits 11 are located in the main display region A1, and the second light-emitting devices 22 electrically connected to the second pixel circuits 12 are located in the auxiliary display region A2.

It will be understood that a material forming the pixel circuit 10 includes a metal material, so as to ensure a good transmission of an electrical signal in the pixel circuit 10. A light transmittance of the metal material is relatively low, so that the metal material has a relatively good effect of blocking light. With the above arrangement used in the embodiments of the present disclosure, the plurality of pixel circuits 10 including the plurality of first pixel circuits 11 and the plurality of second pixel circuits 12 are disposed in the main display region A1, which reduces the number of structures capable of blocking light in the auxiliary display region A2, so that external light may pass through a gap between any two adjacent second light-emitting devices 12 from a side (e.g., a light exit side) of the portion of the display panel 100 located in the auxiliary display region A2, and exists from the other side (e.g., a non-light exit side) of the portion of the display panel 100 located in the auxiliary display region A2. As a result, the portion of the display panel 100 located in the auxiliary display region A2 has the relatively high light transmittance.

In this way, in a case where the display panel 100 is applied to the display module 1000, and the optical element 200 is disposed on the non-light exit side of the display panel 100 and in the auxiliary display region A2, external light may enter the optical element 200 through the portion of the display panel 100 located in the auxiliary display region A2 and be collected by the optical element 200, so that the optical element 200 is able to operate normally.

For example, a structure of the first light-emitting device 21 and a structure of the second light-emitting device 22 may be the same or different. For example, in the embodiments of the present disclosure, the structure of the first light-emitting device 21 and the structure of the second light-emitting device 22 are the same. In this way, it is conducive to reducing a manufacturing difficulty of the display panel 100, and simplifying a manufacturing process of the display panel 100.

For example, a structure of the pixel circuit 10 may vary, which may be set according to actual needs. For example, a structure of the first pixel circuit 21 or the second pixel circuit 22 may include a structure of "2T1C", "6T1C", "7T1C", "6T2C" or "7T2C". Here, "T" represents a transistor, the number before "T" represents the number of transistors, "C" represents a storage capacitor, and the number before "C" represents the number of storage capacitors.

Figure 7:
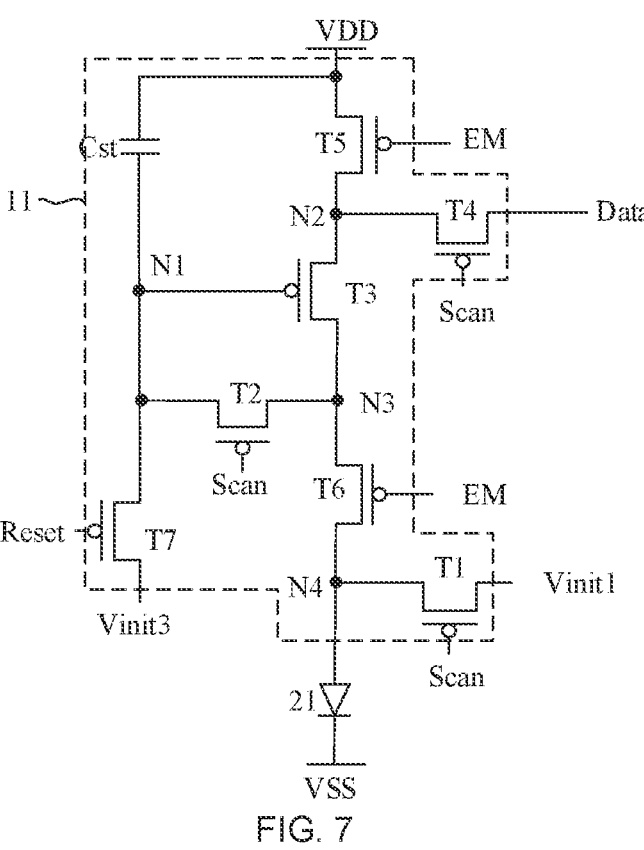
FIG. 7 is an equivalent structural diagram of a first pixel circuit, in accordance with some embodiments of the present disclosure.
Figure 8:
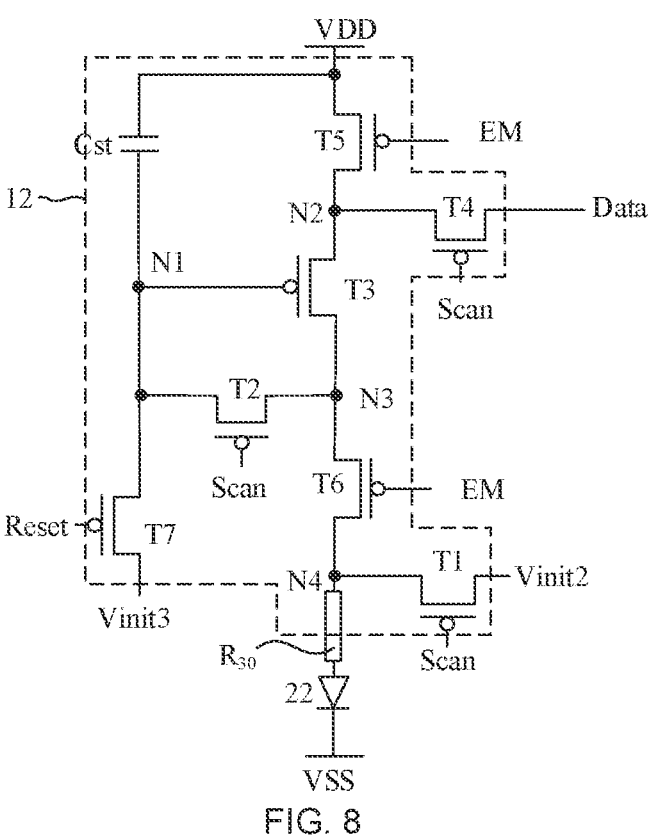
FIG. 8 is an equivalent structural diagram of a second pixel circuit, in accordance with some embodiments of the present disclosure.

For example, the structure of the first pixel circuit 11 may be the same as or different from the structure of the second pixel circuit 12, and an operation process of the first pixel circuit 11 may be the same as or different from an operation process of the second pixel circuit 12. For example, the structure of the first pixel circuit 11 is the same as the structure of the second pixel circuit 12, and the operation process of the first pixel circuit 11 is the same as the operation process of the second pixel circuit 12. FIG. 7 is an equivalent circuit diagram of the first pixel circuit 11; FIG. 8 is an equivalent circuit diagram of the second pixel circuit 12.

Hereinafter, with reference to FIG. 7, the structure and an operation process of the pixel circuit 10 are described by taking an example where the first pixel circuit 11 of the pixel circuits 10 has the structure of "7T1C". It will be noted that there may be other electrical connection relationships, that are not limited to electrical connection relationships shown in this example, among seven transistors and one storage capacitor that are included in the pixel circuit 10.

It will be noted that during the operation process of the pixel circuit 10, signal lines are needed to provide respective electrical signals for the pixel circuit 10. For example, the display panel 100 further includes first initial signal lines each used for transmitting a first initial signal, third initial signal lines each used for transmitting a third initial signal, scan signal lines each used for transmitting a scan signal, reset signal lines each used for transmitting a reset signal, enable signal lines each used for transmitting an enable signal, data lines each used for transmitting a data signal and voltage signal lines each used for transmitting a voltage signal.

For example, as shown in FIG. 7, the first pixel circuit 11 includes a first reset transistor T1, a compensation transistor T2, a driving transistor T3, a switching transistor T4, a first light-emitting control transistor T5, a second light-emitting control transistor T6, a second reset transistor T7 and a storage capacitor Cst.

For example, as shown in FIG. 7, a control electrode of the second reset transistor T7 is electrically connected to the reset signal line Reset, a first electrode of the second reset transistor T7 is electrically connected to the third initial signal line Vinit3, and a second electrode of the second reset transistor T7 is electrically connected to a first node N1 (i.e., which is electrically connected to a second electrode of the compensation transistor T2). The second reset transistor T7 is configured to be turned on under control of the reset signal transmitted by the reset signal line Reset, and transmit the third initial signal received from the third initial signal line Vinit3 to the first node N1, so as to reset the first node N1.

For example, as shown in FIG. 7, a control electrode of the first reset transistor T1 is electrically connected to the scan signal line Scan, a first electrode of the first reset transistor T1 is electrically connected to the first initial signal line Vinit1, and a second electrode of the first reset transistor T1 is electrically connected to a fourth node N4. The first reset transistor T1 is configured to be turned on under control of the scan signal transmitted by the scan signal line Scan, and transmit the first initial signal received from the first initial signal line Vinit1 to the fourth node N4, so as to reset the fourth node N4.

For example, as shown in FIG. 7, a control electrode of the switching transistor T4 is electrically connected to the scan signal line Scan, a first electrode of the switching transistor T4 is electrically connected to the data line Data, and a second electrode of the switching transistor T4 is electrically connected to a second node N2. The switching transistor T4 is configured to be turned on under the control of the scan signal transmitted by the scan signal line Scan, and transmit the data signal transmitted by the data line Data to the second node N2.

For example, as shown in FIG. 7, a control electrode of the driving transistor T3 is electrically connected to the first node N1, a first electrode of the driving transistor T3 is electrically connected to the second node N2, and a second electrode of the driving transistor T3 is electrically connected to a third node N3. The driving transistor T3 is configured to be turned on under control of a voltage of the first node N1, and transmit a signal (e.g., the data signal) from the second node N2 to the third node N3.

For example, as shown in FIG. 7, a control electrode of the compensation transistor T2 is electrically connected to the scan signal line Scan, a first electrode of the compensation transistor T2 is electrically connected to the third node N3, and the second electrode of the compensation transistor T2 is electrically connected to the first node N1. The compensation transistor T2 is configured to be turned on under the control of the scan signal transmitted by the scan signal line Scan, and transmit a signal (e.g., the data signal) from the third node N3 to the first node N1.

For example, as shown in FIG. 7, a control electrode of the first light-emitting control transistor T5 is electrically connected to the enable signal line EM, a first electrode of the first light-emitting control transistor T5 is electrically connected to the voltage signal line VDD, and a second electrode of the first light-emitting control transistor T5 is electrically connected to the second node N2. The first light-emitting control transistor T5 is configured to be turned on under control of the enable signal transmitted by the enable signal line EM, and transmit the voltage signal received from the voltage signal line VDD to the second node N2.

For example, as shown in FIG. 7, a control electrode of the second light-emitting control transistor T6 is electrically connected to the enable signal line EM, a first electrode of the second light-emitting control transistor T6 is electrically connected to the third node N3, and a second electrode of the second light-emitting control transistor T6 is electrically connected to the fourth node N4. The second light-emitting control transistor T6 is configured to be turned on under the control of the enable signal transmitted by the enable signal line EM, and transmit the voltage signal from the third node N3 to the fourth node N4.

For example, as shown in FIG. 7, a first electrode of the storage capacitor Cst is electrically connected to the first node N1, and a second electrode of the storage capacitor Cst is electrically connected to the voltage signal line VDD.

For example, the operation process of the first pixel circuit 11 includes a reset phase, a data writing and compensation phase and a light-emitting phase that are performed in sequence.

For example, in the reset phase, the second reset transistor T7 is turned on under the control of the reset signal, and transmits the third initial signal to the first node N1, so as to reset the first node N1. Since the first node N1 is electrically connected to the storage capacitor Cst, the control electrode of the driving transistor T3 and the second electrode of the compensation transistor T2, the storage capacitor Cst, the control electrode of the driving transistor T3 and the second electrode of the compensation transistor T2 may be reset when the first node N1 is reset. The driving transistor T3 may be turned on under control of the third initial signal.

For example, in the data writing and compensation phase, the first reset transistor T1, the switching transistor T4 and the compensation transistor T2 are all turned on under the control of the scan signal. The first reset transistor T1 transmits the first initial signal to the fourth node N4. Since the fourth node N4 is electrically connected to an anode of a first light-emitting device 21, the anode of the first light-emitting device 21 may be reset when the fourth node N4 is reset. The switching transistor T4 transmits the data signal to the second node N2; the driving transistor T3 is turned on under the control of the voltage of the first node N1, and transmits the data signal from the second node N2 to the third node N3. The compensation transistor T2 transmits the data signal from the third node N3 to the first node N1 to charge the driving transistor T3 until the driving transistor T3 is in a turn-off state, so that a compensation for a threshold voltage of the driving transistor T3 is completed.

For example, in the light-emitting phase, the first light-emitting control transistor T5 and the second light-emitting control transistor T6 are all turned on under the control of the enable signal. The first light-emitting control transistor T5 transmits the voltage signal to the second node N2. The driving transistor T3 transmits the voltage signal from the second node N2 to the third node N3. The second light-emitting control transistor T6 transmits the voltage signal from the third node N3 to the fourth node N4.

The first light-emitting device 21 emits light due to actions of the voltage signal from the fourth node N4 and a common voltage from a common voltage line VSS.

In an implementation, the first electrode of the first reset transistor of the first pixel circuit and a first electrode of a first reset transistor of the second pixel circuit are both electrically connected to the first initial signal line. The first initial signal received by the first reset transistor of the first pixel circuit and the first initial signal received by the first reset transistor of the second pixel circuit are the same. That is, voltage values of the first initial signals received by the two are equal. The first light-emitting device and the first pixel circuit are both located in the main display region, so that a distance between the two is relatively small, and a distance between the first light-emitting device and a position to which the fourth node of the first pixel circuit corresponds is relatively small accordingly. As a result, after the first initial signal provided by the first initial signal line is transmitted to the first light-emitting device via the fourth node of the first pixel circuit, a loss of the voltage value of the first initial signal is relatively small. However, the second light-emitting device is located in the auxiliary display region, and a second pixel circuit electrically connected thereto is located in the main display region, so that a distance between the second pixel circuit and the second light-emitting device is relatively large, and a distance between a position to which a fourth node of the second pixel circuit corresponds and the second light-emitting device is relatively large accordingly. As a result, after the first initial signal provided by the first initial signal line is transmitted to the second light-emitting device via the fourth node of the second pixel circuit, the loss of the voltage value of the first initial signal is relatively large. Thus, there is a deviation between an actual voltage value of the first initial signal received by the second light-emitting device and a preset voltage value of the first initial signal received by the second light-emitting device, so that an effect of resetting an anode of the second light-emitting device is poor. As a result, the anode of the second light-emitting device cannot has a preset voltage in the light-emitting phase, so that luminance of the second light-emitting device cannot reach the preset luminance. In a case where the preset luminance of the first light-emitting device is equal to the preset luminance of the second light-emitting device, luminance in the auxiliary display region is prone to be different from luminance in the main display region, which causes display effects in the main display region and the auxiliary display region to be different, so that a problem of uneven display of the display panel is generated.

In light of this, in the display panel 100 provided in some embodiments of the present disclosure, as shown in FIGS. 4a and 4b, the display panel 100 further includes a plurality of first initial signal lines Vinit1 and a plurality of second initial signal lines Vinit2. The plurality of first initial signal lines Vinit1 and the plurality of second initial signal lines Vinit2 may each extend, for example, in the first direction X.

In some examples, as shown in FIGS. 4a and 4b, the first pixel circuit 11 is electrically connected to a first initial signal line Vinit1 and a first light-emitting device 21, and is configured to transmit a first initial signal transmitted by the first initial signal line Vinit1 to the first light-emitting device 21, so as to reset the first light-emitting device 21. The second pixel circuit 12 is electrically connected to a second initial signal line Vinit2 and a second light-emitting device 22, and is configured to transmit a second initial signal transmitted by the second initial signal line Vinit2 to the second light-emitting device 22, so as to reset the second light-emitting device 22.

For example, as shown in FIG. 7, the first reset transistor T1 (e.g., the first electrode of the first reset transistor T1) in the first pixel circuit 11 is electrically connected to the first initial signal line Vinit1. As shown in FIG. 8, a first reset transistor T1 (e.g., a first electrode of the first reset transistor T1) in the second pixel circuit 12 is electrically connected to the second initial signal line Vinit2, and the first reset transistor T1 (e.g., a second electrode of the first reset transistor T1) in the second pixel circuit 12 is electrically connected to the second light-emitting device 22; the first reset transistor T1 in the second pixel circuit 12 is configured to transmit the second initial signal transmitted by the second initial signal line Vinit2 to the second light-emitting device 22. For example, the second initial signal may be used for resetting an anode of the second light-emitting device 22.

For example, as for connection relationships among other transistors and a storage capacitor in the second pixel circuit 12 and the operation process of the second pixel circuit 12, reference may be made to the description of the first pixel circuit 11 in some of the above examples, and details will not be repeated here.

In some examples, a voltage value V2 of the second initial signal is greater than a voltage value V1 of the first initial signal.

For example, the anode of the first light-emitting device 21 is reset due to an action of the first initial signal transmitted by the first initial signal line Vinit1; after the first initial signal is transmitted to the first light-emitting device 21, a loss value of V1 is ΔV1. The anode of the second light-emitting device 22 is reset due to an action of the second initial signal transmitted by the second initial signal line Vinit2; after the second initial signal is transmitted to the second light-emitting device 22, a loss value of V2 is ΔV2. The second light-emitting device 22 is located in the auxiliary display region A2, and the second pixel circuit 12 electrically connected thereto is located in the main display region A1, which makes a distance between the second pixel circuit 12 and the second light-emitting device 22 relatively large, so that the loss value ΔV2 of the voltage value of the second initial signal is greater than the loss value ΔV1 of the voltage value of the first initial signal (ΔV2>ΔV1). On this basis, in the embodiments of the present disclosure, the voltage value V2 is set to be greater than the voltage value V1 (V2>V1), so that a voltage value (V2−ΔV2) of a signal received by the second light-emitting device 22 is equal or approximately equal to a voltage value (V1−ΔV1) of a signal received by the first light-emitting device 21. As a result, an effect of resetting the first light-emitting device 21 and an effect of resetting the second light-emitting device 22 are the same or substantially the same. In this way, in the light-emitting phase, a voltage of the anode of the second light-emitting device 22 may reach or be close to the preset luminous voltage, so that the luminance of the second light-emitting device 22 may reach the preset luminance. In a case where the preset luminance of the first light-emitting device 21 is equal to the preset luminance of the second light-emitting device 22, actual luminance of the first light-emitting device 21 and actual luminance of the second light-emitting device 22 may be equal or approximately equal. Therefore, it is conducive to enabling display effects in the main display region A1 and the auxiliary display region A2 to be the same or substantially the same, so that the display quality of the display panel 100 may be improved.

In the display panel 100 provided in some embodiments of the present disclosure, the first pixel circuit 11 is electrically connected to the first light-emitting device 21 located in the main display region A1, and the second pixel circuit 12 is electrically connected to the second light-emitting device 22 located in the auxiliary display region A2; the first initial signal line Vinit1 and the second initial signal line Vinit2 are provided; the first initial signal line Vinit1 is electrically connected to the first pixel circuit 11 to provide the first initial signal for the first pixel circuit 11, so that the first light-emitting device 21 may be reset due to the action of the first initial signal; the second initial signal line Vinit2 is electrically connected to the second pixel circuit 12 to provide the second initial signal for the second pixel circuit 12, so that the second light-emitting device 22 is reset due to the action of the second initial signal. Moreover, in the embodiments of the present disclosure, the voltage value V2 of the second initial signal is set to be greater than the voltage value V1 of the first initial signal, so that the effect of resetting the first light-emitting device 21 by the first initial signal is the same or substantially the same as the effect of resetting the second light-emitting device 22 by the second initial signal. Thus, in the light-emitting phase, the voltage of the anode of the second light-emitting device 22 may reach or be close to the preset luminous voltage, so that the actual luminance of the second light-emitting device 22 reaches or is close to the preset luminance. As a result, the display effects in the main display region A1 and the auxiliary display region A2 may be ensured to be the same or substantially the same, thereby improving the display quality of the display panel 100.

In some examples, as shown in FIGS. 4a and 4b, the display panel 100 further includes a plurality of connection lines 30.

For example, as shown in FIGS. 4a and 4b, the second pixel circuit 12 is electrically connected to the second light-emitting device 22 via a connection line 30, and a driving voltage provided by the second pixel circuit 12 may be transmitted to the respective second light-emitting device 22 via the respective connection line 30, so as to drive the respective second light-emitting device 22 to emit light. The second initial signal transmitted by the first reset transistor T1 of the second pixel circuit 12 may be transmitted to the respective second light-emitting device 22 via the respective connection line 30, so as to reset the respective second light-emitting device 22.

For example, a material of the plurality of connection lines 30 includes a light-transmissive conductive material.

For example, the light-transmissive conductive material may be a material such as indium tin oxide (ITO).

The light-transmissive conductive material has a relatively high light transmittance, and the light-transmissive conductive material is used for forming the connection lines, so that the connection lines 30 may have a relatively high light transmittance. Thus, after light passes through the connection line 30, a loss of the light itself is relatively low. As a result, it is possible to ensure that an amount of the light passing through the portion of the display panel located in the auxiliary display region and entering the optical element 200 is relatively sufficient, and thereby ensure the optical element 200 to operate normally.

For example, an electrical connection manner of the second pixel circuit 12, the second light-emitting device 22 and the connection line 30 varies, which is not limited in the embodiments of the present disclosure.

For example, as shown in FIG. 4b, the second pixel circuits 12 may be connected to the respective second light-emitting devices 22 in a manner in which a second pixel circuit and a second light-emitting device that are close to each other are connected and a second pixel circuit and a second light-emitting device that are far away from each other are connected. That is, in FIG. 4b, of the second pixel circuits 12 and the second light-emitting devices 22 that are respectively located on two opposite sides of a boundary between the main display region A1 and the auxiliary display region A2, a second pixel circuit 12 that is the closest to the boundary and a second light-emitting device 22 that is the closest to the boundary are electrically connected to each other, and in this case, a length of a connection line 30 connected to the two is the smallest; a second pixel circuit 12 that is the second closest to the boundary and a second light-emitting device 22 that is the second closest to the boundary are electrically connected to each other, and in this case, a length of a connection line 30 connected to the two is the second smallest; by parity of reasoning, a second pixel circuit 12 that is the farthest away from the boundary and a second light-emitting device 22 that is the farthest away from the boundary are electrically connected to each other, and in this case, a length of a connection line 30 connected to the two is the largest.

For another example, as shown in FIG. 4a, of the second pixel circuits 12 and the second light-emitting devices 22 that are respectively located on two opposite sides of a boundary between the main display region A1 and the auxiliary display region A2, a second pixel circuit 12 that is the closest to the boundary and a second light-emitting device 22 that is the farthest away from the boundary are electrically connected to each other; a second pixel circuit 12 that is the second closest to the boundary and a second light-emitting device 22 that is the second farthest away from the boundary are electrically connected to each other; by parity of reasoning, a second pixel circuit 12 that is the farthest away from the boundary and a second light-emitting device 22 that is the closest to the boundary are electrically connected to each other. Lengths of the plurality of connection lines are equal, for example.

In some examples, a difference $\Delta V$ between the voltage value V2 of the second initial signal and the voltage value V1 of the first initial signal is positive correlation with a length of the connection line 30. That is, the greater the length of the connection line 30, the greater the difference $\Delta V$ between the voltage value V2 of the second initial signal and the voltage value V1 of the first initial signal, and the greater the voltage value V2 of the second initial signal accordingly.

It will be understood that the connection line 30 has a resistance. In a case where the connection line 30 is disposed between the second pixel circuit 12 and the second light-emitting device 22, the resistance will be created between the second pixel circuit 12 and the second light-emitting device 22, and the resistance is equivalent to a resistor $R_{30}$ between the fourth node N4 and the second light-emitting device 22 in FIG. 8.

For example, the greater the distance between the second pixel circuit 12 and the second light-emitting device 22, the greater the length of the connection line 30 connected to the two, and the greater the resistance $R_{30}$ of the connection line 30 accordingly. Thus, the greater the loss value $\Delta V2$ generated during a transmission process of transmitting the second initial signal to the second light-emitting device 22 via the connection line 30. For example, the loss value $\Delta V1$ of the voltage value V1 of the first initial signal may be negligible relative to the loss value $\Delta V2$. In this case, the difference $\Delta V$ between the voltage value V2 of the second initial signal and the voltage value V1 of the first initial signal is equal to the loss value $\Delta V2$. Therefore, by setting the difference $\Delta V$ between the voltage value V2 of the second initial signal and the voltage value V1 of the first initial signal to be positive correlation with the length of the connection line 30, it is possible to provide the second initial signal having a relatively small voltage value in a case where the length of the connection line 30 is relatively small, and provide the second initial signal having a relatively large voltage value in a case where the length of the connection line 30 is relatively large. In this way, the actual voltage value (V2−$\Delta V2$) of the second initial signal received by the second light-emitting device 22 may be equal or approximately equal to the voltage value V1, so that the effect of the second initial signal on resetting the second light-emitting device 22 and the effect of the first initial signal on resetting the first light-emitting device 21 may be the same or substantially the same. Thus, in the light-emitting phase, the voltage of the anode of the second light-emitting device 22 may reach or be close to the preset luminous voltage, so that the actual luminance of the second light-emitting device 22 reaches or is close to the preset luminance. As a result, a display difference between the main display region A1 and the auxiliary display region A2 may be reduced, thereby improving the display quality of the display panel 100.

Figure 25A:
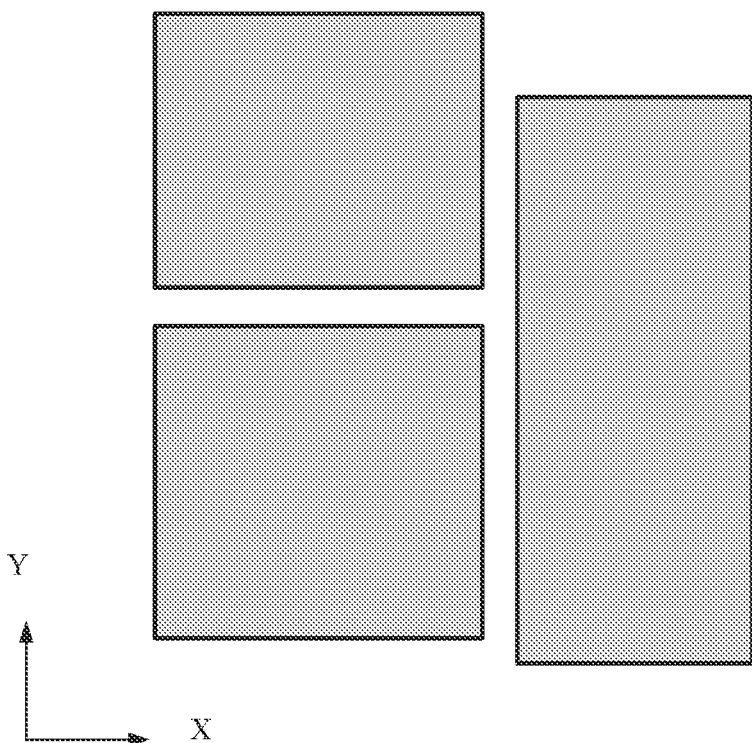
FIG. 25*a* is a top view of yet another film layer in a display panel, in accordance with some embodiments of the present disclosure.
Figure 25B:
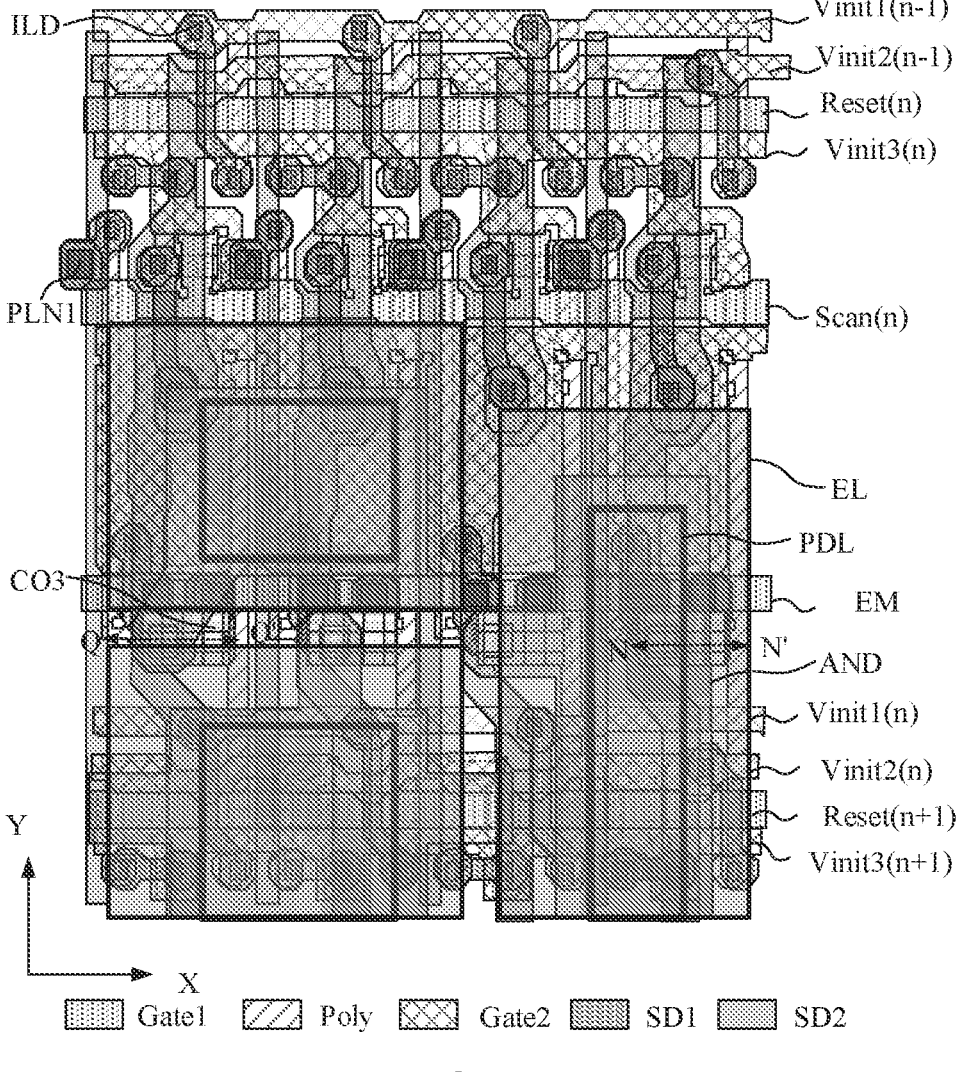
FIG. 25*b* is a top view of yet another part of film layers in a display panel, in accordance with some embodiments of the present disclosure.
Figure 25C:
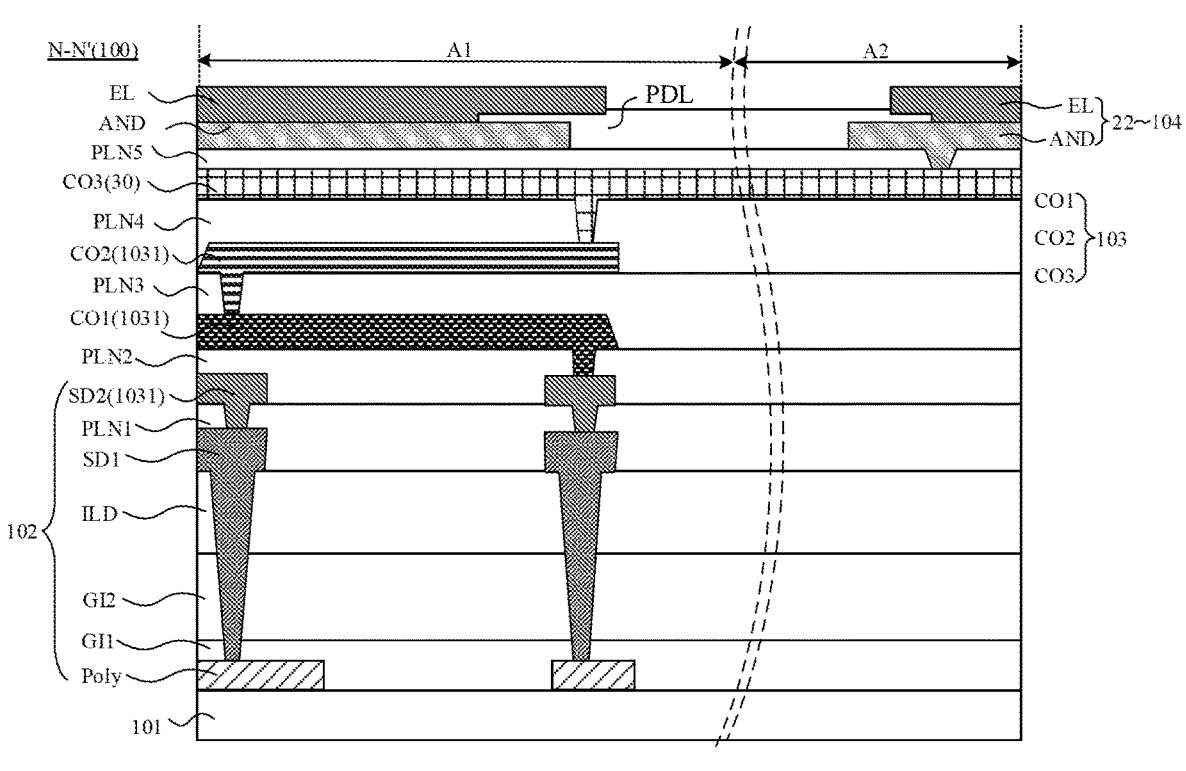
FIG. 25*c* is a sectional view of the top view shown in FIG. 25*b* taken along the line N-N'.

In some embodiments, as shown in FIG. 25c, the display panel 100 includes a substrate 101, a pixel circuit layer 102, a plurality of connection layers 103 and a light-emitting device layer 104 that are arranged in sequence.

In some examples, the substrate 101 may be a flexible substrate or a rigid substrate.

For example, in a case where the substrate 101 is the flexible substrate, a material of the substrate 101 may be a material having a high elasticity such as dimethyl siloxane, PI and PET.

For example, in a case where the substrate 101 is the rigid substrate, the material of the substrate 101 may be glass or the like.

For example, the plurality of pixel circuits 10 included in the display panel 100 may be located in the pixel circuit layer, the plurality of light-emitting devices 20 included in the display panel 100 may be located in the light-emitting device layer, and the plurality of connection lines included in the display panel 100 may be located in the plurality of connection layers.

Hereinafter, the pixel circuit layer 102, the connection layers 103 and the light-emitting device layer 104 will be respectively described with reference to accompanying drawings.

Figure 15A:
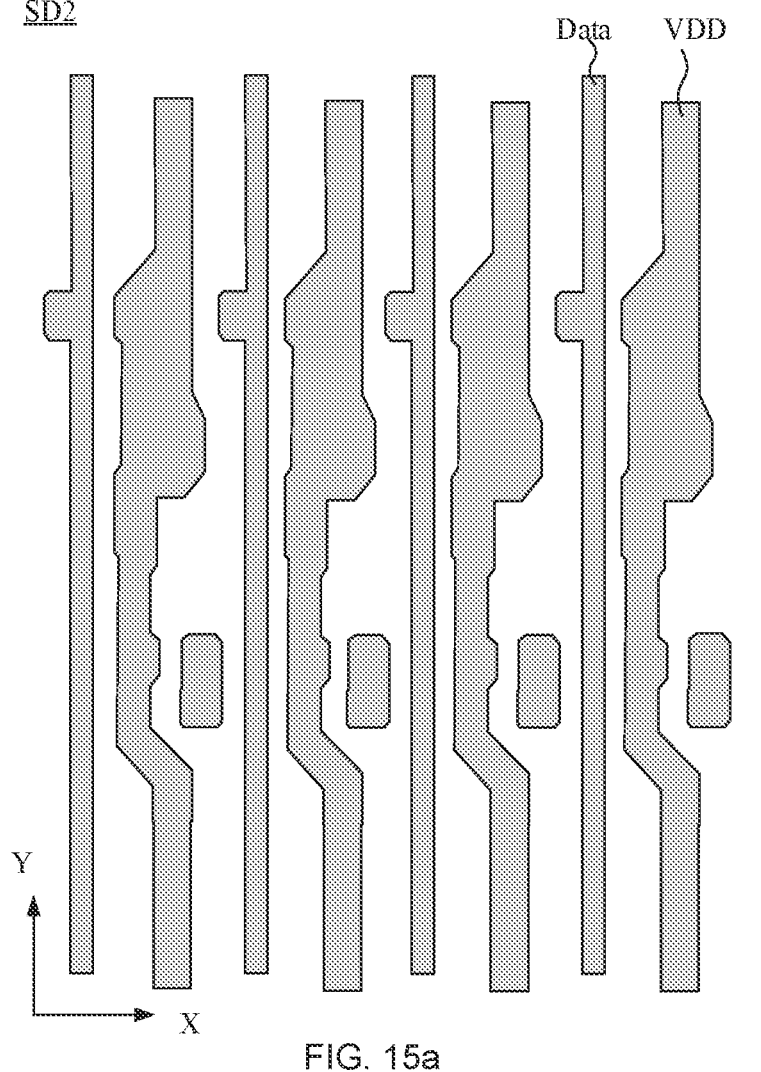
FIG. 15a is a top view of yet another film layer in a display panel, in accordance with some embodiments of the present disclosure.
Figure 15B:
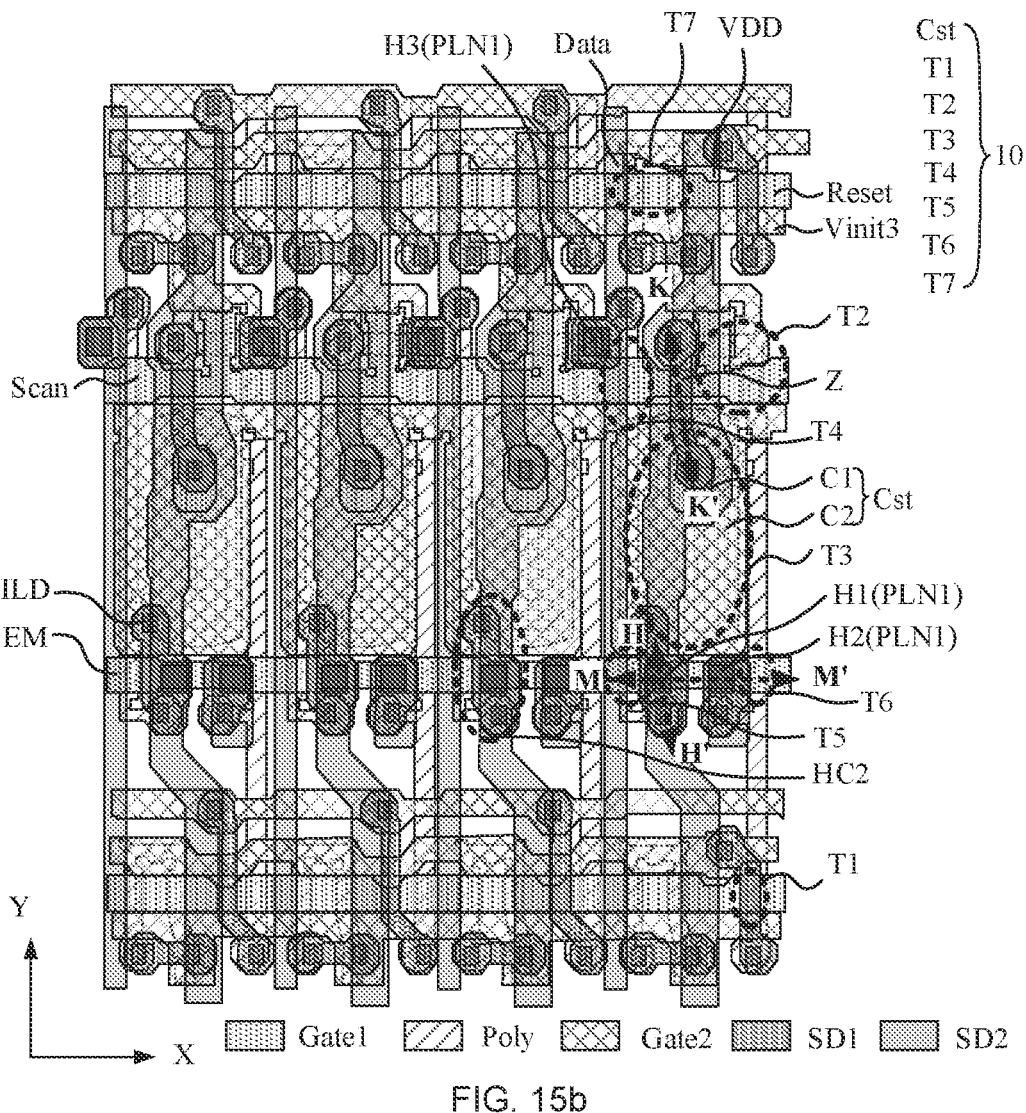
FIG. 15b is a top view of yet another part of film layers in a display panel, in accordance with some embodiments of the present disclosure.
Figure 15C:
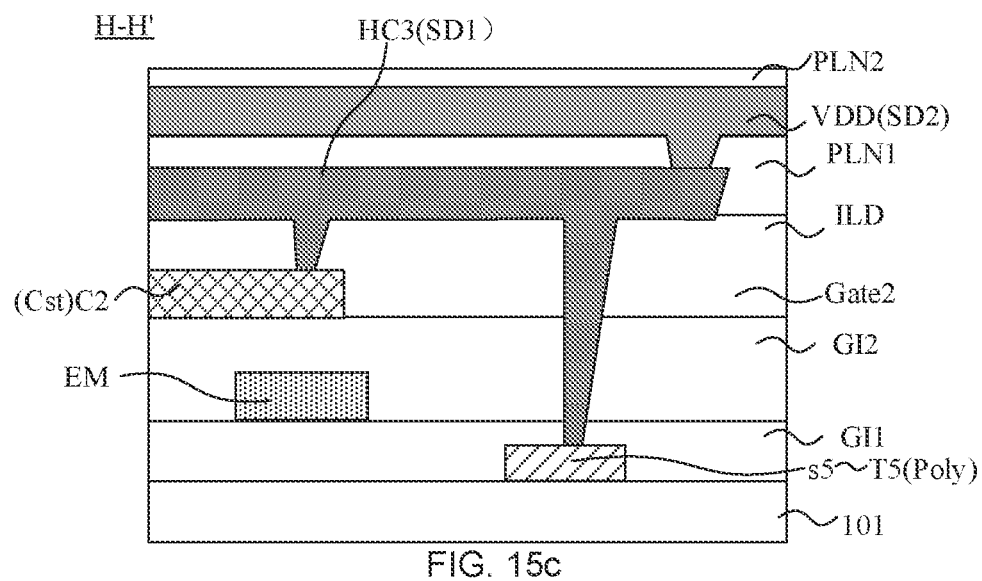
FIG. 15c is a sectional view of the top view shown in FIG. 15b taken along the line H-H.
Figure 15D:
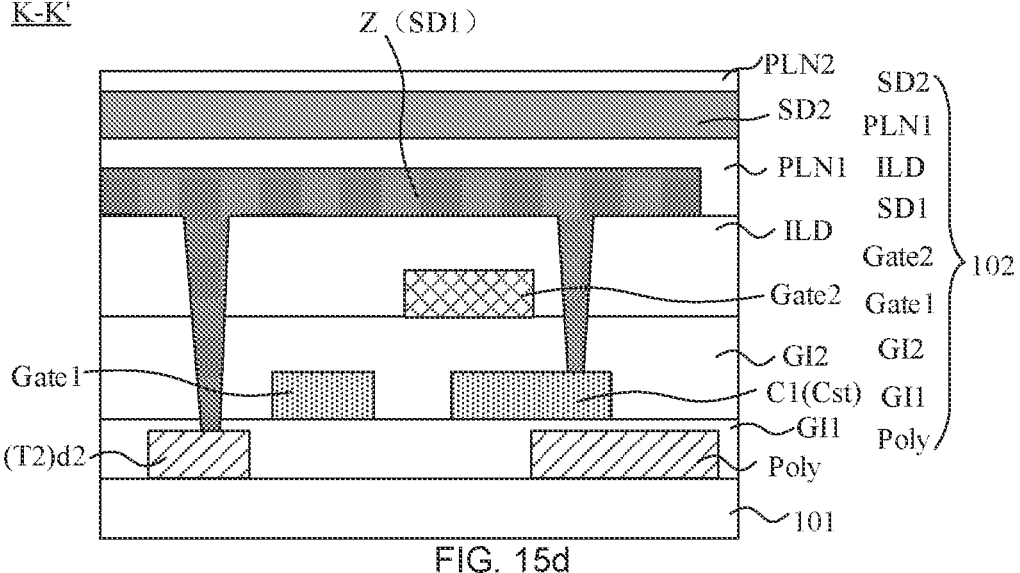
FIG. 15d is a sectional view of the top view shown in FIG. 15b taken along the line K-K'.

In some embodiments, as shown in FIG. 15d, the pixel circuit layer 102 includes a semiconductor layer Poly, a first gate conductive layer Gate1, a second gate conductive layer Gate2, an interlayer dielectric layer ILD, a first source-drain conductive layer SD1, a first planarization layer PLN1 and a second source-drain conductive layer SD2 that are sequentially arranged on a side of the substrate 101. A first gate insulating layer GI1 may be provided between the semiconductor layer Poly and the first gate conductive layer Gate1, and a second gate insulating layer GI2 may be provided between the first gate conductive layer Gate1 and the second gate conductive layer Gate2.

For example, the first gate insulating layer GI1, the second gate insulating layer GI2, the interlayer dielectric layer ILD and the first planarization layer PLN1 may each isolate conductive layers located on respective two opposite sides, so as to avoid a short circuit generated between the conductive layers located on the respective two opposite sides.

Figure 9:
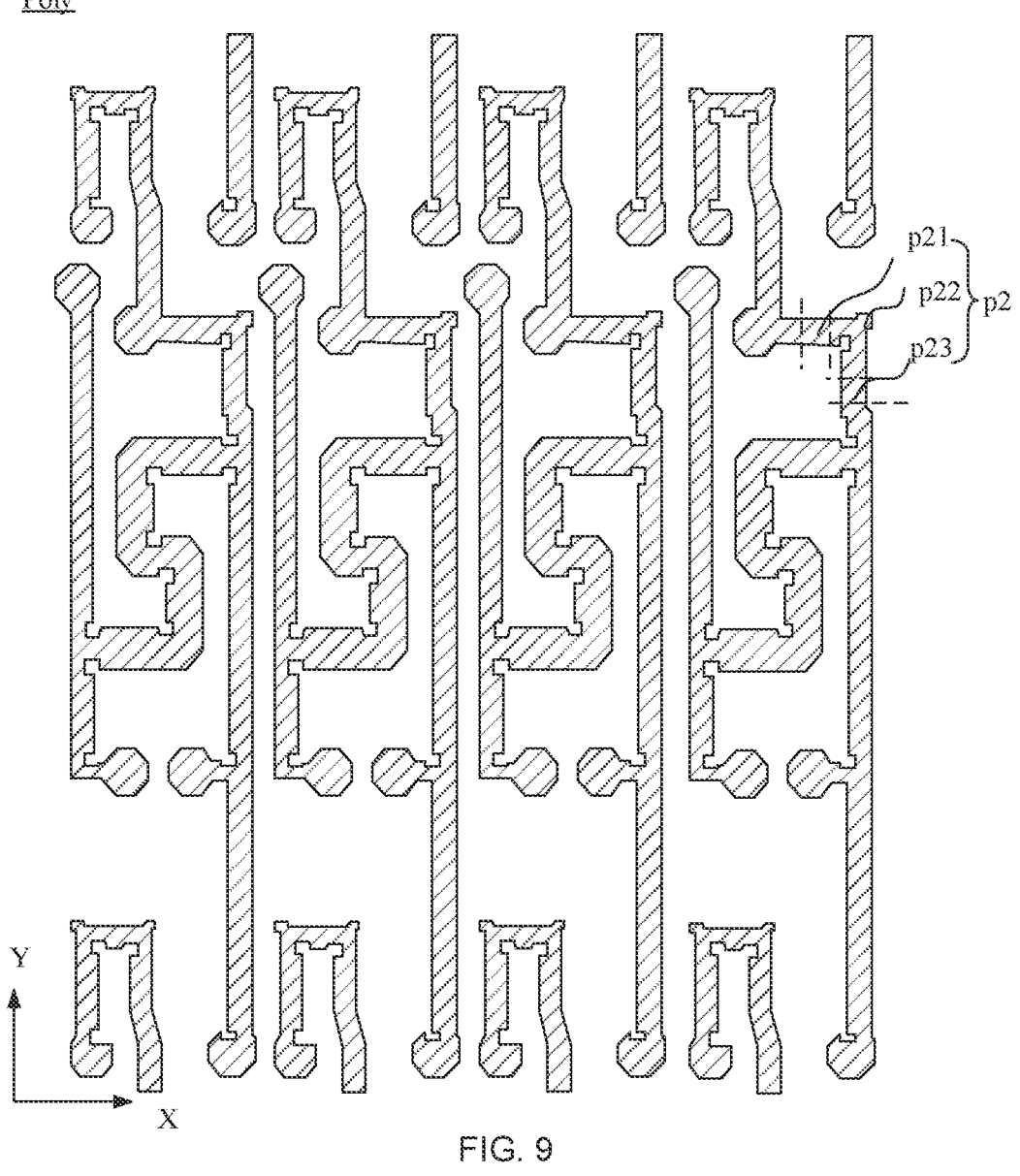
FIG. 9 is a top view of a film layer in a display panel, in accordance with some embodiments of the present disclosure.
Figure 10A:
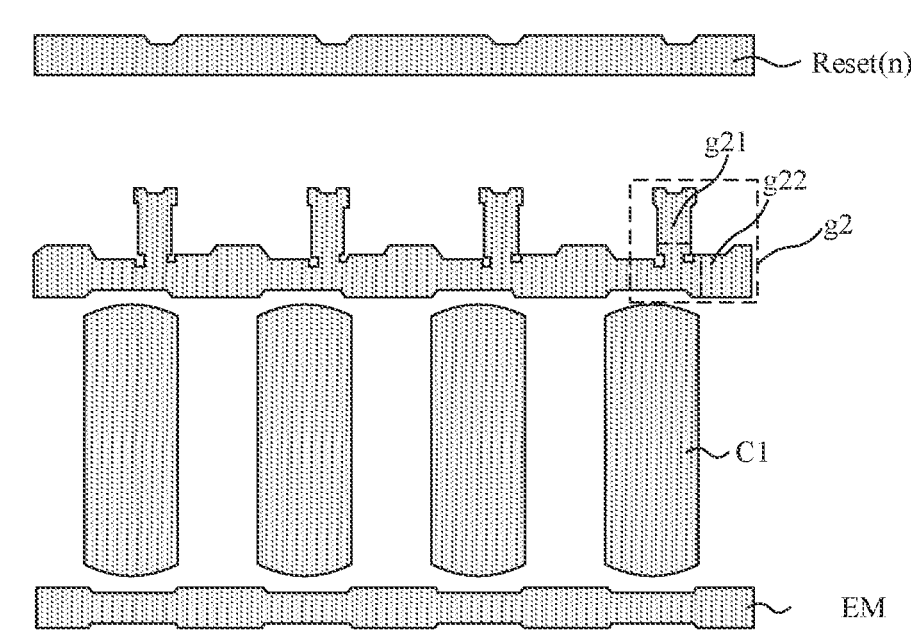
FIG. 10a is a top view of another film layer in a display panel, in accordance with some embodiments of the present disclosure.
Figure 10A:
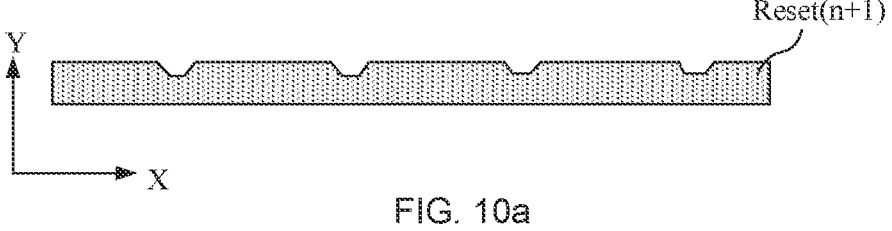
Figure 10B:
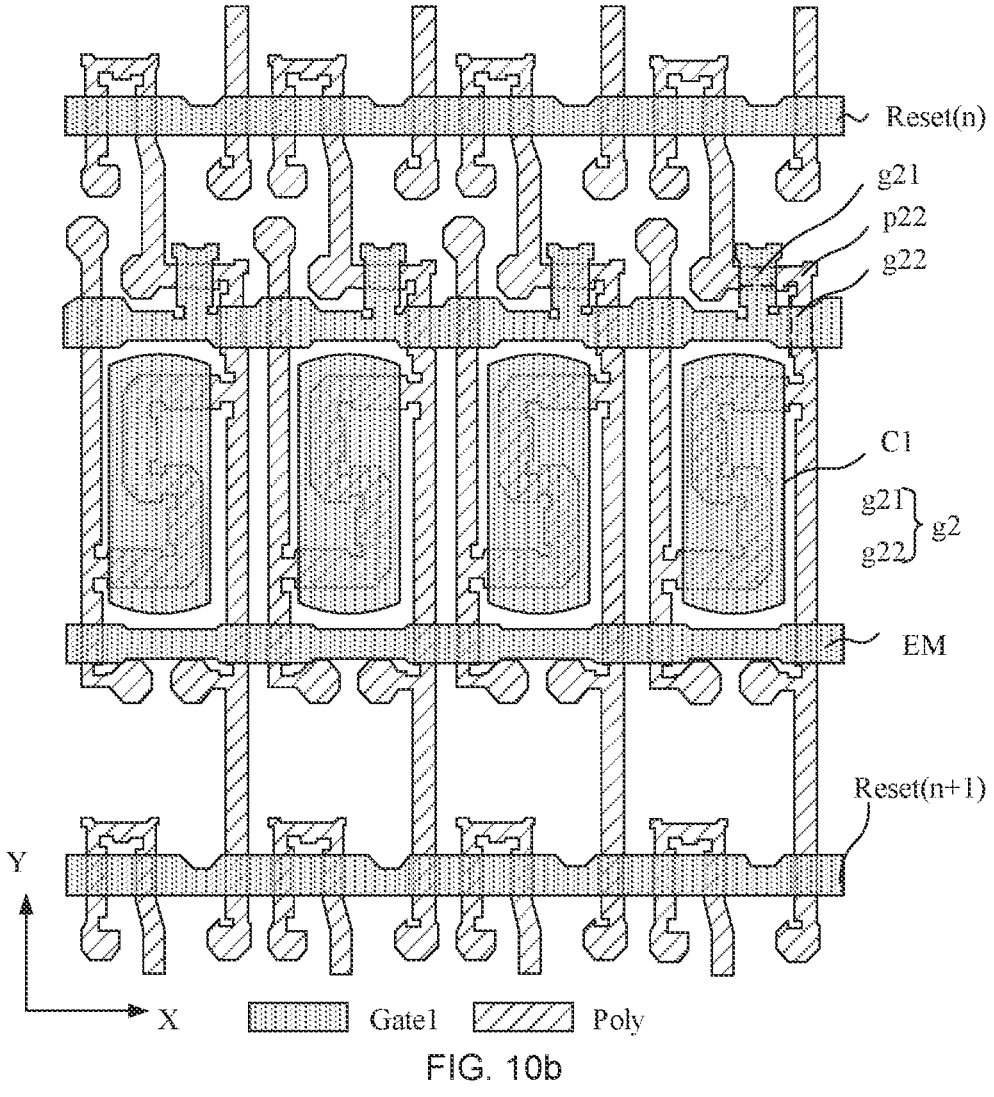
FIG. 10b is a top view of a part of film layers in a display panel, in accordance with some embodiments of the present disclosure.
Figure 11A:
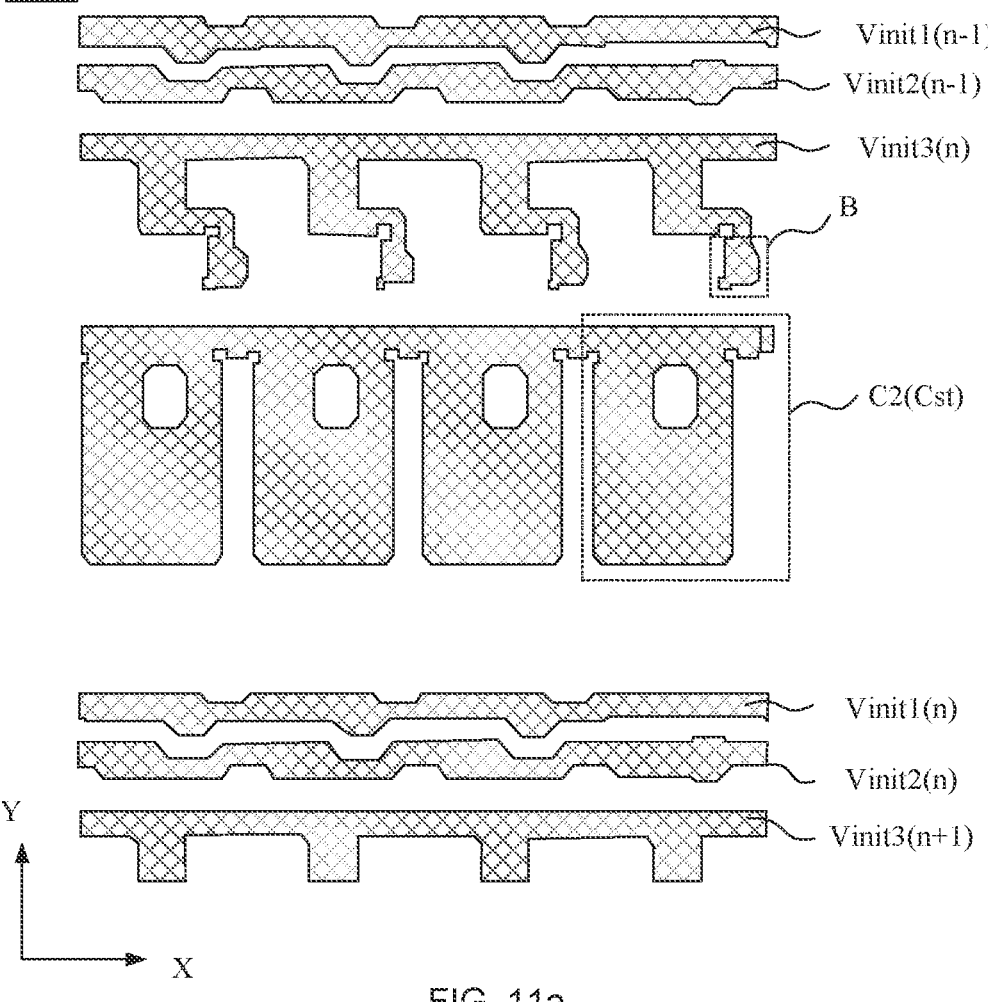
FIG. 11a is a top view of yet another film layer in a display panel, in accordance with some embodiments of the present disclosure.
Figure 11B:
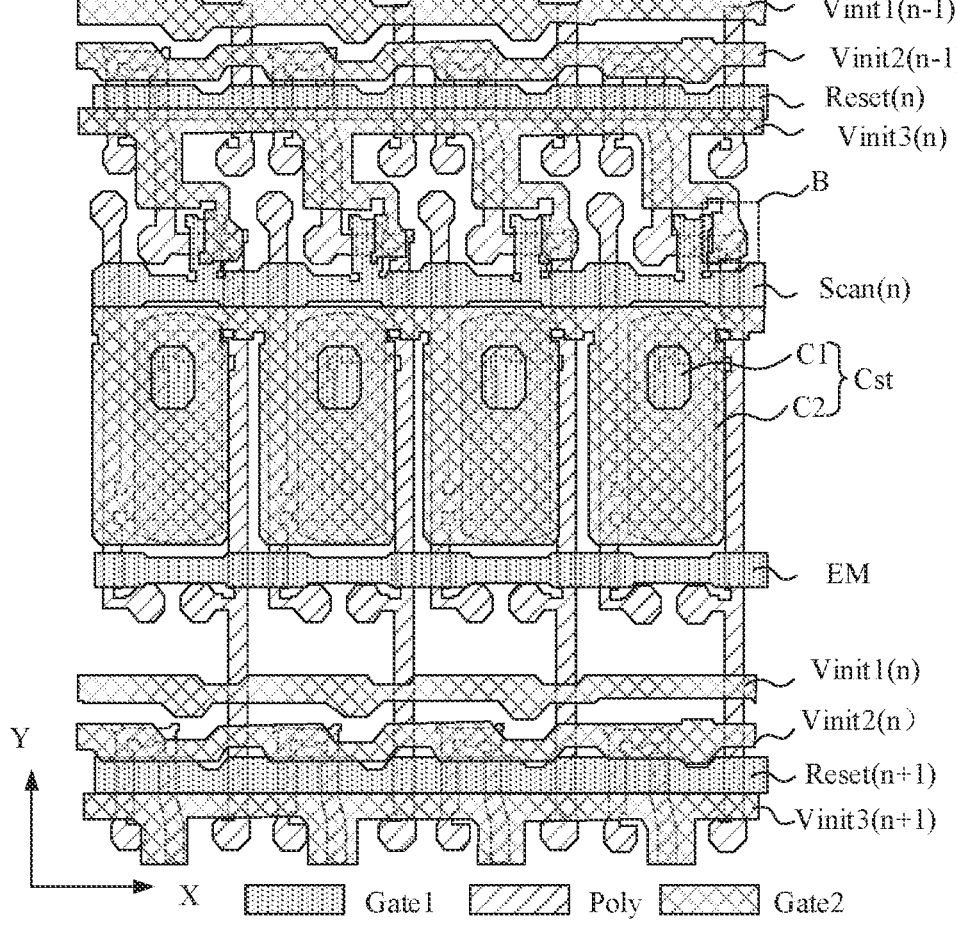
FIG. 11b is a top view of another part of film layers in a display panel, in accordance with some embodiments of the present disclosure.
Figure 12A:
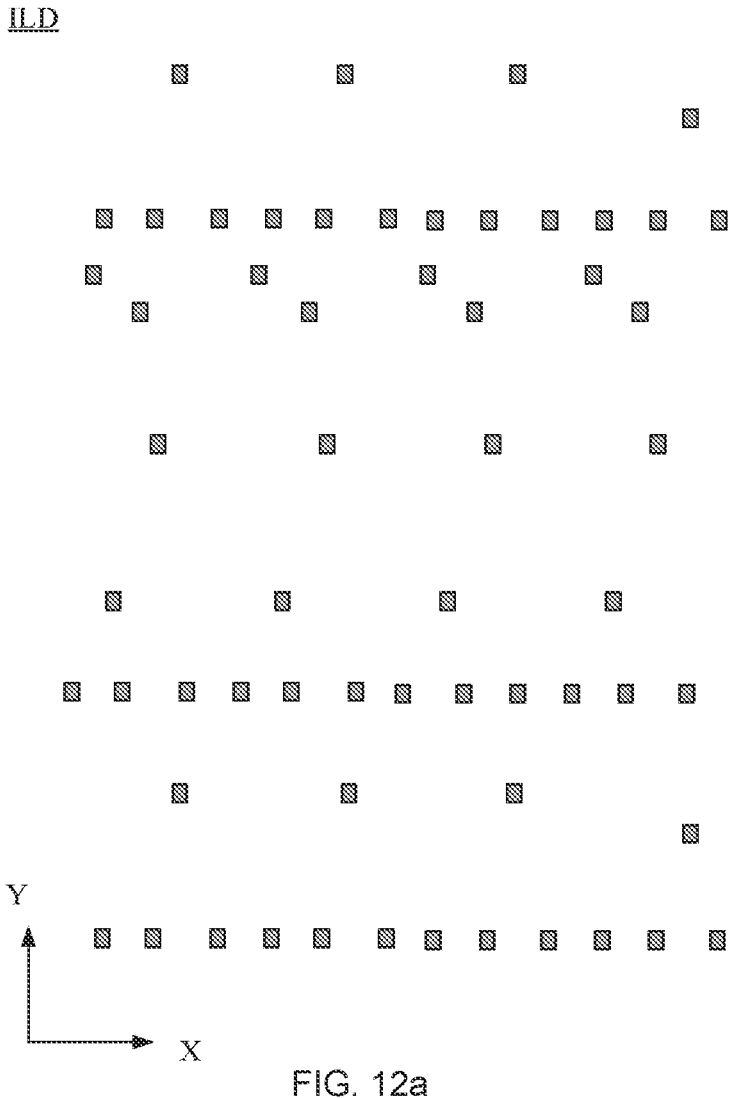
FIG. 12a is a top view of yet another film layer in a display panel, in accordance with some embodiments of the present disclosure.
Figure 12B:
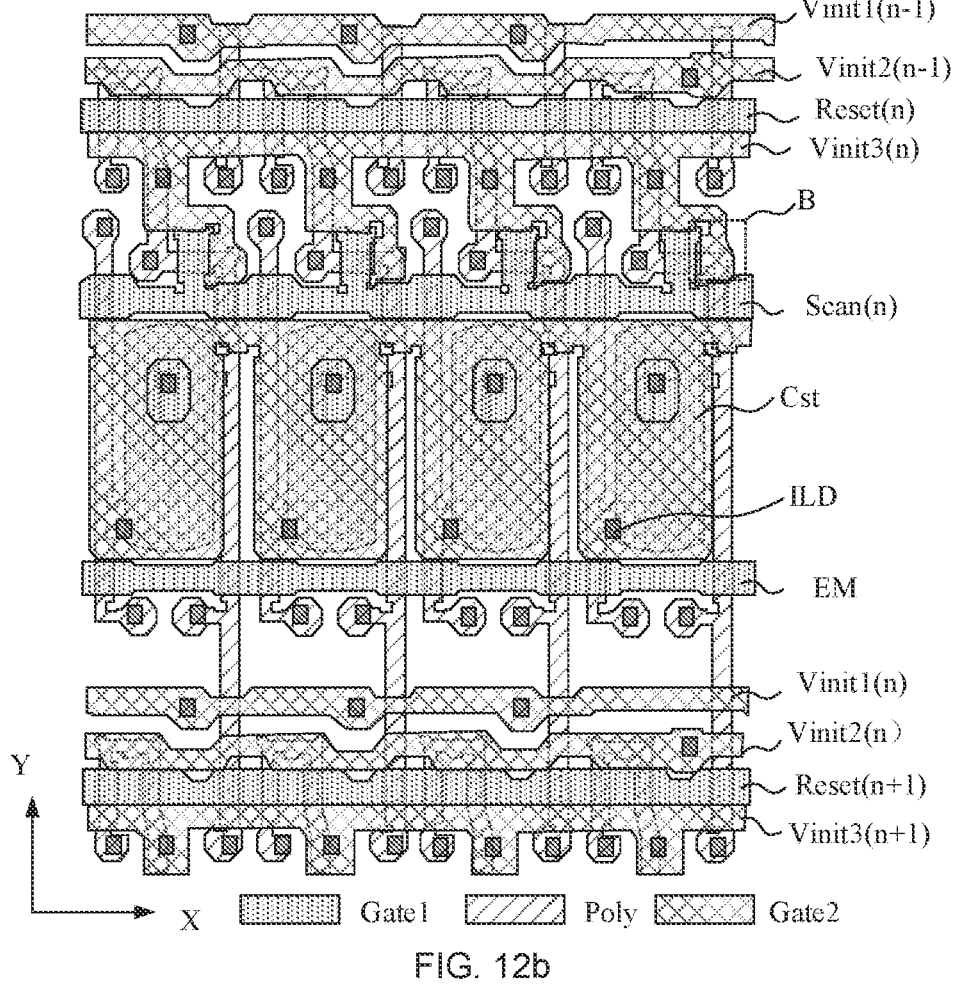
FIG. 12b is a top view of yet another part of film layers in a display panel, in accordance with some embodiments of the present disclosure.
Figure 13A:
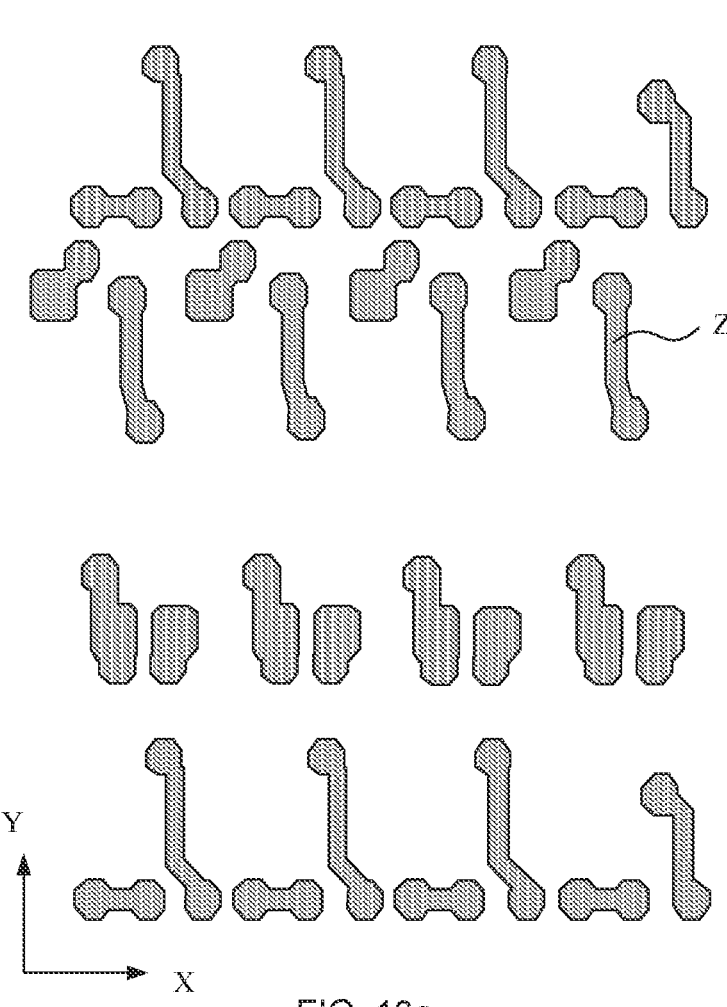
FIG. 13a is a top view of yet another film layer in a display panel, in accordance with some embodiments of the present disclosure.
Figure 13B:
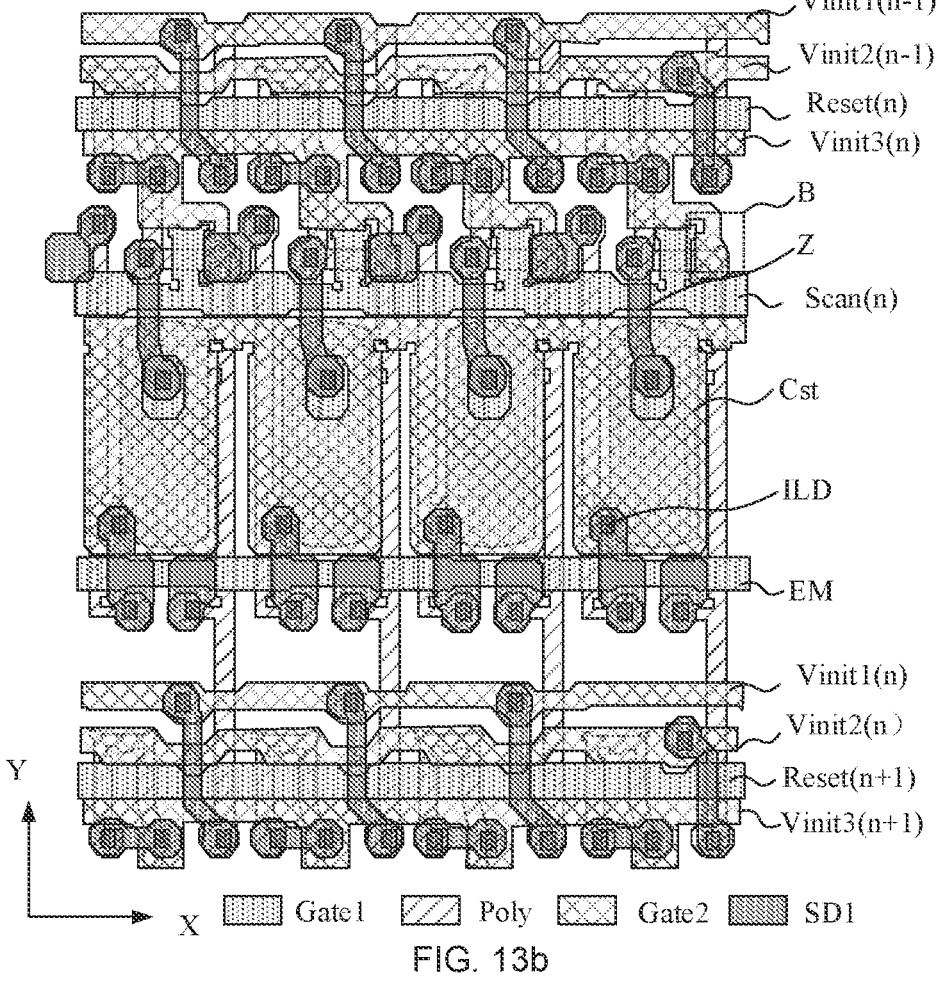
FIG. 13b is a top view of yet another part of film layers in a display panel, in accordance with some embodiments of the present disclosure.
Figure 14A:
FIG. 14a is a top view of yet another film layer in a display panel, in accordance with some embodiments of the present disclosure.
Figure 14A:
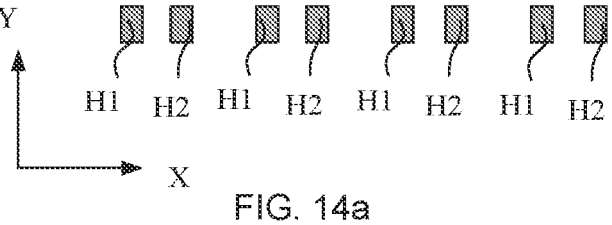
Figure 14B:
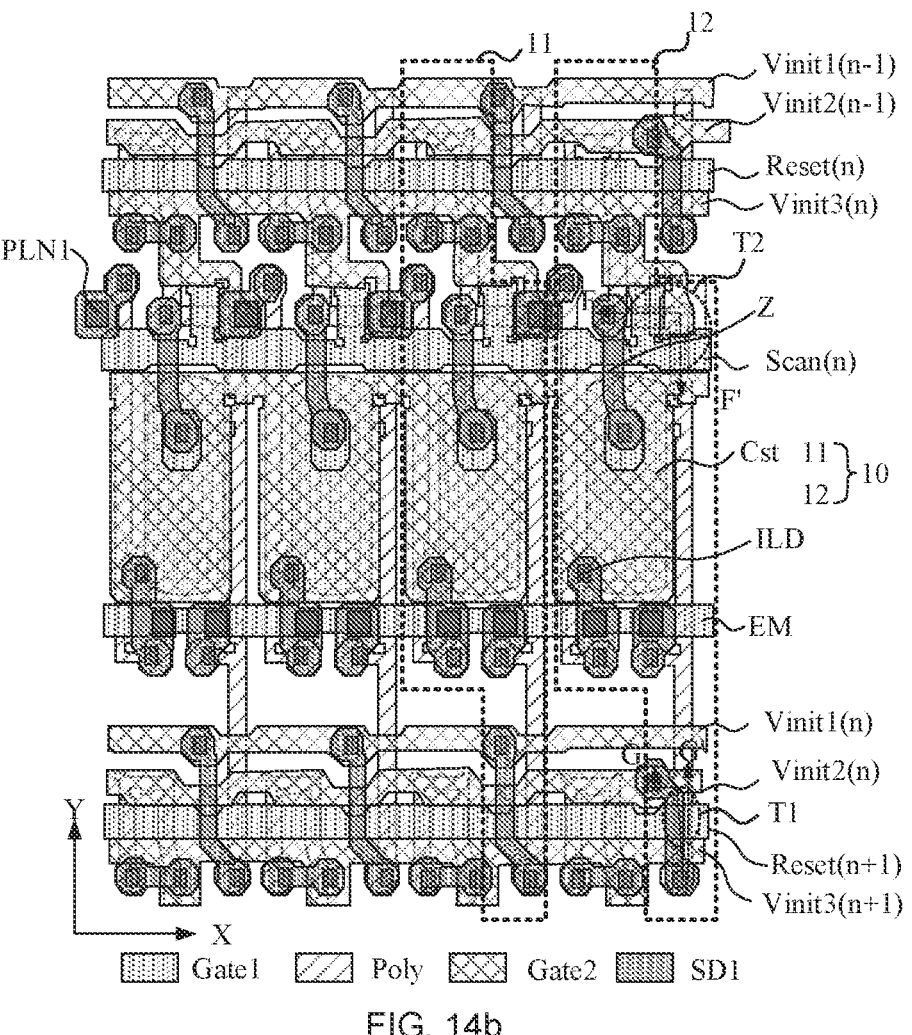
FIG. 14b is a top view of yet another part of film layers in a display panel, in accordance with some embodiments of the present disclosure.

FIG. 9 illustrates a top view of a structure of the semiconductor layer Poly. FIG. 10a illustrates a top view of a structure of the first gate conductive layer Gate1. FIG. 10b illustrates a top view of a structure of which the semiconductor layer Poly and the first gate conductive layer Gate1 are stacked in sequence. FIG. 11a illustrates a top view of a structure of the second gate conductive layer Gate2. FIG. 11b illustrates a top view of a structure of which the semiconductor layer Poly, the first gate conductive layer Gate1 and the second gate conductive layer Gate2 are stacked in sequence. FIG. 12a illustrates a top view of a structure of the interlayer dielectric layer ILD. FIG. 12b illustrates a top view of a structure of which the semiconductor layer Poly, the first gate conductive layer Gate1, the second gate conductive layer Gate2 and the interlayer dielectric layer ILD are stacked in sequence. FIG. 13a illustrates a top view of a structure of the first source-drain conductive layer SD1. FIG. 13b illustrates a top view of a structure of which the semiconductor layer Poly, the first gate conductive layer Gate1, the second gate conductive layer Gate2, the interlayer dielectric layer ILD and the first source-drain conductive layer SD1 are stacked in sequence. FIG. 14a illustrates a top view of a structure of the first planarization layer PLN1. FIG. 14b illustrates a top view of a structure of which the semiconductor layer Poly, the first gate conductive layer Gate1, the second gate conductive layer Gate2, the interlayer dielectric layer ILD, the first source-drain conductive layer SD1 and the first planarization layer PLN1 are stacked in sequence. FIG. 15a illustrates a top view of a structure of the second source-drain conductive layer SD2. FIG. 15b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1 and the second source-drain conductive layer SD2 are stacked in sequence.

For example, a material of the semiconductor layer Poly may include amorphous silicon, monocrystalline silicon, polycrystalline silicon or a metal oxide semiconductor material.

For example, a material of the first gate conductive layer Gate1, a material of the second gate conductive layer Gate2, a material of the first source-drain conductive layer SD1 and a material of the second source-drain conductive layer SD2 are each a conductive material. The material of the first gate conductive layer Gate1 and the material of the second gate conductive layer Gate2 may be, for example, the same. The material of the first source-drain conductive layer SD1 and the material of the second source-drain conductive layer SD2 may be, for example, the same.

For example, the material of the first gate conductive layer Gate1, the second gate conductive layer Gate2, the first source-drain conductive layer SD1 or the second source-drain conductive layer SD2 may be a metal material such as aluminum (Al), argentum (Ag), cuprum (Cu) and chromium (Cr).

It will be noted that an orthographic projection of the semiconductor layer Poly on the substrate overlaps with an orthographic projection of the first gate conductive layer Gate1 on the substrate. After the first gate conductive layer Gate1 is formed on a side of a film layer forming the semiconductor layer Poly away from the substrate, the film layer forming the semiconductor layer Poly may be doped by using the first gate conductive layer Gate1 as a mask, so that a portion of the film layer forming the semiconductor layer Poly covered by the first gate conductive layer Gate1 constitutes active patterns of all the transistors, and another portion of the film layer forming the semiconductor layer Poly not covered by the first gate conductive layer Gate1 forms conductors that may constitute first electrodes and second electrodes of all the transistor. A portion of the first gate conductive layer Gate1 of which an orthographic projection on the substrate overlaps with the orthographic projection of the semiconductor layer Poly on the substrate constitutes gate patterns (i.e., control electrodes) of all the transistor.

For example, a relative positional relationship among all the transistors and the storage capacitor included in the pixel circuit 10 is as shown in FIG. 15b. As shown in FIG. 15b, in the first direction X, the compensation transistor T2 and the switching transistor T4 are arranged in a same row, and the first light-emitting control transistor T5 and the second light-emitting control transistor T6 are arranged in a same row. In the second direction Y, the switching transistor T4 and the first light-emitting control transistor T5 are arranged in a same row, and the compensation transistor T2, the second light-emitting control transistor T6 and the first reset transistor T1 are arranged in a same row in sequence. In the first direction X, the driving transistor T3 is located between the compensation transistor T2 and the switching transistor T4; in the second direction Y, the driving transistor T3 is located between the switching transistor T4 and the first light-emitting control transistor T5. In the first direction X, the second reset transistor T7 is located between the compensation transistor T2 and the switching transistor T4; in the second direction Y, the second reset transistor T7 is located on a side of the switching transistor T4 away from the first light-emitting control transistor T5. A position of an orthographic projection of the storage capacitor Cst on the substrate is the same as a position of an orthographic projection of the driving transistor T3 on the substrate, and the storage capacitor Cst is located on a side of the driving transistor T3 away from the substrate.

Figure 14C:
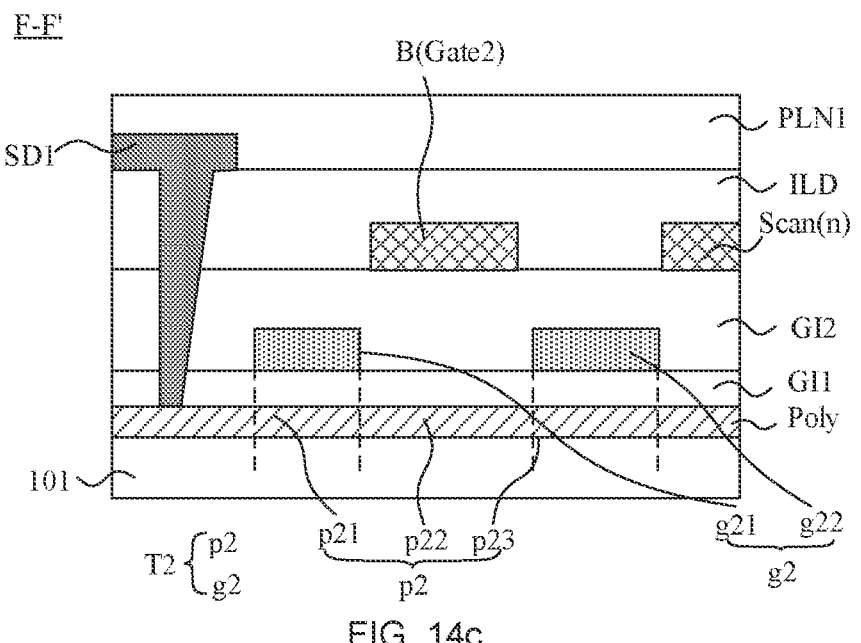
FIG. 14c is a sectional view of the top view shown in FIG. 14b taken along the line F-F'.

In some embodiments, as shown in FIG. 14c, the compensation transistor T2 in the pixel circuit includes an active pattern p2 and a gate pattern 92 that are arranged in sequence.

For example, as shown in FIGS. 9 and 14c, the active pattern p2 may be located in the semiconductor layer Poly of the display panel; as shown in FIG. 10a, the gate pattern g2 may be located in the first gate conductive layer Gate1 of the display panel.

In some examples, as shown in FIGS. 9 and 14c, the active pattern p2 includes a first semiconductor portion p21, a conductor portion p22 and a second semiconductor portion p23 that are connected in sequence.

For example, a shape of the active pattern p2 varies, which may be set according to actual needs.

For example, the active pattern p2 is in a shape of a straight line. Optionally, the first semiconductor portion p21, the conductor portion p22 and the second semiconductor portion p23 are sequentially arranged in the first direction X or the second direction Y.

For another example, the active pattern p2 is in a shape of a broken line. Optionally, as shown in FIG. 9, the first semiconductor portion p21 may extend in the first direction X; the second semiconductor portion p23 may extend in the second direction Y; the conductor portion p22 may be in a shape of a broken line, one end of the conductor portion p22 is connected to the first semiconductor portion p21, and the other end of the conductor portion p22 is connected to the second semiconductor portion p23. In this way, it is conducive to reducing an occupied area of the active pattern p2 in the first direction X or the second direction Y.

For example, the first direction X intersects the second direction Y. For example, an included angle between the first direction X and the second direction Y may be 85°, 90°, 95° or the like.

The embodiments of the present disclosure are described by taking an example where the included angle between the first direction X and the second direction Y is 90°.

In some examples, as shown in FIGS. 10a and 10b, the gate pattern g2 includes a first sub-gate g21 and a second sub-gate g22 that are connected to each other. As shown in FIG. 14c, the first semiconductor portion p21 is partially opposite to the first sub-gate g21, and the second semiconductor portion p23 is partially opposite to the second sub-gate g22.

For example, an arrangement of the gate pattern 92 corresponds to the shape of the active pattern p2.

For example, in a case where the active pattern p2 is in a shape of a straight line, the first sub-gate g21 and the second sub-gate g22 may extend in a same direction, which intersects a direction in which the first semiconductor portion p21, the conductor portion p22 and the second semiconductor portion p23 of the active pattern p2 are arranged.

For another example, as shown in FIG. 10a, in a case where the active pattern p2 is in a shape of a broken line, the first sub-gate g21 and the second sub-gate g21 may each extend in a different direction. Optionally, the first sub-gate g21 may extend in the second direction Y, and the second sub-gate g22 may extend in the first direction X. A junction pattern between the first sub-gate g21 and the second sub-gate g22 is in a shape of a broken line, an orthographic projection of the junction pattern on the substrate is non-overlapping with an orthographic projection of the conductor portion p22 on the substrate, and a corner of the junction pattern is opposite to a corner of conductor portion p22.

It will be noted that, a description "the first semiconductor portion p21 is partially opposite to the first sub-gate g21" refers to that an orthographic projection of the first sub-gate g21 on the substrate 101 partially coincides with an orthographic projection of the first semiconductor portion p21 on the substrate 101, and a border of the orthographic projection of the first sub-gate g21 on the substrate 101 partially intersects a border of the orthographic projection of the first semiconductor portion p21 on the substrate 101; a description "the second semiconductor portion p23 is partially opposite to the second sub-gate g22" refers to that an orthographic projection of the second sub-gate g22 on the substrate 101 partially coincides with an orthographic projection of the second semiconductor portion p23 on the substrate 101, and a border of the orthographic projection of the second sub-gate g22 on the substrate 101 partially intersects a border of the orthographic projection of the second semiconductor portion p23 on the substrate 101.

For example, the compensation transistor T2 is a double-gate transistor. The double-gate transistor is used as the compensation transistor T2, which may improve anti-leakage performance of the pixel circuit 10, so as to reduce a leakage current of the first node N1 via the compensation transistor T2 or avoid an electric leakage of the first node N1 via the compensation transistor T2. As a result, in the light-emitting phase, a stability of the voltage of the first node N1 may be ensured, thereby ensuring the light-emitting device 20 to emit light normally.

In some examples, as shown in FIGS. 11a, 11b, 12b, 13b and 14c, the display panel further includes a shielding block B electrically connected to a third initial signal line Vinit3. As shown in FIG. 14c, the shielding block B is partially opposite to the conductor portion p22.

For example, an orthographic projection of the conductor portion p22 on the substrate 101 partially coincides with an orthographic projection of the shielding block B on the substrate 101, and a border of the orthographic projection of the conductor portion p22 on the substrate 101 partially intersects a border of the orthographic projection of the shielding block B on the substrate 101.

For example, the shielding block B is made of a metal material, and an insulating layer is provided between the shielding block B and the conductor portion p22. In this case, the shielding block B and the conductor portion p22 may constitute a capacitor.

A third initial signal transmitted by the third initial signal line Vinit3 is a constant voltage signal, and the shielding block B is electrically connected to the third initial signal line Vinit3, so that the shielding block B also has the constant voltage signal. Since a voltage difference between two ends of the capacitor is kept substantially constant, a voltage of the conductor portion p22 is substantially a constant voltage.

The conductor portion p22 of the compensation transistor T2 is blocked by the shielding block B. In this way, a holding effect of the capacitor composed of the shielding block B and the conductor portion p22 on the voltage of the conductor portion p22 may be improved, so that the voltage of the conductor portion p22 of the compensation transistor T2 remains relatively stable with respect to voltages of the first electrode and the second electrode of the compensation transistor T2. As a result, it is possible to reduce a risk of generating the leakage current, so as to ensure that the pixel circuit 10 has a relatively high reliability during operating.

In some examples, the shielding block B and the third initial signal line Vinit3 are of a one-piece structure.

For example, the phrase "one-piece structure" refers to that two patterns that are connected to each other are disposed in a same layer, and the two patterns are continuous and not separated. That is, in the embodiments of the present disclosure, the shielding block B and the third initial signal line Vinit3 are located in a same film layer (e.g., the second gate conductive layer Gate2), the shielding block B and the third initial signal line Vinit3 are electrically connected to each other, and the two are continuous and not separated.

In this way, it is possible to not only simplify the manufacturing process of the display panel 100, but also reduce a dimension of a region occupied by both the shielding block B and the third initial signal line Vinit3 in the second direction Y and reduce an area occupied by both the shielding block B and the third initial signal line Vinit3, so that it is possible to provide a relatively large space for a layout of other film layers, and effectively utilizes a design space of the display panel 100.

In some examples, as shown in FIGS. 11a, 11b, 12b, 13b and 14b, the first initial signal line Vinit1, the second initial signal line Vinit2 and the third initial signal line Vinit3 are located in a same layer.

The phrase "same layer" mentioned in the embodiments of the present disclosure refers to a layer structure formed through a same patterning process by using a same mask in which a film layer for forming specific patterns is formed by using a same film-forming process. Depending on different specific patterns, the same patterning process may include several exposure, development and etching, the specific patterns formed in the layer structure may be continuous or discontinuous, and these specific patterns may also be at different heights or have different thicknesses. In this way, the first initial signal line Vinit1, the second initial signal line Vinit2 and the third initial signal line Vinit3 may be manufactured synchronously, which is conducive to simplifying the manufacturing process of the display panel 100.

In some examples, as shown in FIGS. 4a, 4b, 5 and 6, the plurality of pixel circuits 10 included in the display panel 100 are arranged in a plurality of rows. Pixel circuits 10 included in each row of pixel circuits 10 may be sequentially arranged in the first direction X. The number of pixel circuits included in each of any two adjacent rows of pixel circuits 10 may be the same or different.

For example, any two adjacent rows of pixel circuits 10 may be provided therebetween with first initial signal line(s) Vinit1, second initial signal line(s) Vinit2 and third initial signal line(s) Vinit3, and the number of the first initial signal line(s) Vinit1 may be at least one, the number of the second initial signal line(s) Vinit2 may be at least one, and the number of the third initial signal line(s) Vinit3 may be at least one.

For example, as shown in FIG. 14b, any two adjacent rows of pixel circuits 10 may be provided therebetween with a single first initial signal line Vinit1, a single second initial signal line Vinit2 and a single third initial signal line Vinit3.

For example, the first initial signal line Vinit1, the second initial signal line Vinit2 and the third initial signal line Vinit3 disposed between any two adjacent rows of pixel circuits 10 each extend in the first direction X and are arranged in the second direction Y. A sequence in which the first initial signal line Vinit1, the second initial signal line Vinit2 and the third initial signal line Vinit3 are arranged in the second direction Y may vary.

For example, as shown in FIG. 14b, the third initial signal line Vinit3 is closer to a compensation transistor T2 electrically connected to the third initial signal line Vinit3 than the first initial signal line Vinit1 and the second initial signal line Vinit2. One of the first initial signal line Vinit1 and the second initial signal line Vinit2 is closer to the third initial signal line Vinit3 than the other.

In this way, the third initial signal line Vinit3 and the shielding block B electrically connected thereto may be of the one-piece structure, so that a complexity of film layers of the display panel 100 is simplified.

In some examples, as shown in FIG. 14b, any two adjacent rows of pixel circuits 10 may be provided therebetween with a reset signal line Reset electrically connected to the control electrode of the compensation transistor T2. The reset signal line Reset extends, for example, in the first direction X.

An arrangement among the reset signal line Reset, the first initial signal line Vinit1, the second initial signal line Vinit2 and the third initial signal line Vinit3 that are disposed between any two adjacent rows of pixel circuits 10 varies.

Figure 28:
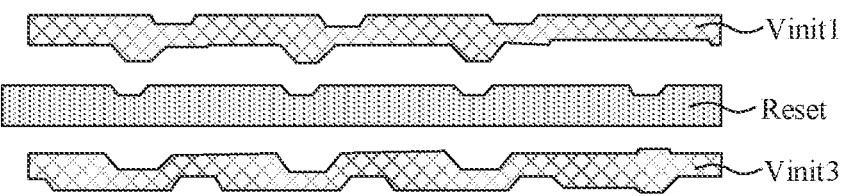
FIG. 28 is a top view of some signal lines in a display panel, in accordance with some embodiments of the present disclosure.

For example, as shown in FIG. 28, an orthographic projection of the reset signal line Reset on the substrate is located between an orthographic projection of the first initial signal line Vinit1 on the substrate and an orthographic projection of the second initial signal line Vinit2 on the substrate.

For another example, as shown in FIGS. 11b, 12b, 13b and 14b, an orthographic projection of the reset signal line Reset on the substrate is located between an orthographic projection of the second initial signal line Vinit2 on the substrate 101 and an orthographic projection of the third initial signal line Vinit3 on the substrate 101.

With the above arrangement, it is possible to optimize a layout space of the first initial signal line Vinit1, the second initial signal line Vinit2, the third initial signal line Vinit3 and the reset signal line Reset of the display panel 100, so as to prevent the third initial signal line Vinit3 from being electrically connected to the respective shielding block B across the reset signal line Reset. Thus, it is possible to not only ensure that the third initial signal line Vinit3 and the shielding block B electrically connected thereto are of the one-piece structure, but also prevent the reset signal transmitted by the reset signal line Reset from affecting an electrical signal on the shielding block B. As a result, a good blocking effect of the shielding block B on the compensation transistor T2 is ensured, thereby ensuring the light-emitting device 20 to emit light normally.

In some examples, as shown in FIGS. 11b, 16b, 17b, 18b, 19b, 20b, 21b and 22b, the reset signal line Reset is located in the first gate conductive layer Gate1. As shown in FIGS. 11a and 11b, the first initial signal line Vinit1, the second initial signal line Vinit2 and the third initial signal line Vinit3 are located in the second gate conductive layer Gate2.

With the above arrangement, a signal interference between the reset signal line Reset and the first initial signal line Vinit1, the second initial signal line Vinit2 and the third initial signal line Vinit3 may be avoided, thereby ensuring accuracies of electrical signals respectively transmitted by the reset signal line Reset, the first initial signal line Vinit1, the second initial signal line Vinit2 and the third initial signal line Vinit3. In addition, with the above arrangement, a wiring space may be enlarged.

For example, pixel circuits 10 shown in FIG. 14b are, for example, an n-th row of pixel circuits 10. Control electrodes of first reset transistors T1 of the n-th row of pixel circuits 10 may be electrically connected to a (n+1)th reset signal line Reset(n+1).

Figure 14D:
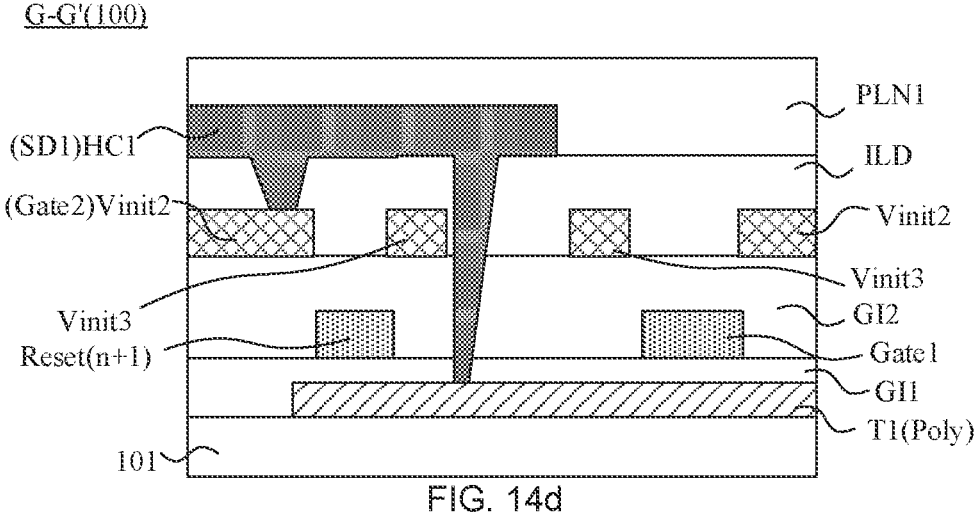
FIG. 14d is a sectional view of the top view shown in FIG. 14b taken along the line G-G'.

For example, as shown in FIG. 14d, the display panel 100 further includes a first transfer block HC1 located in the first source-drain conductive layer SD1. A first electrode of a first reset transistor T1 of a second pixel circuit 12 is electrical connected to an n-th second initial signal line Vinit2(n) via the first layer changing block HC1. An end of the first transfer block HC1 may be electrically connected to the first electrode, that is located in the semiconductor layer Poly (a conductor in the semiconductor layer Poly), of the first reset transistor T1 through a via hole sequentially penetrating the interlayer dielectric layer ILD, the second gate insulating layer GI2 and the first gate insulating layer GI1, and the other end of the first transfer block HC1 may be electrically connected to the n-th second initial signal line Vinit2(n) located in the second gate conductive layer Gate2 through a via hole (as shown in FIG. 12a) penetrating the interlayer dielectric layer ILD.

For example, the display panel 100 further includes a second transfer block HC2 (as shown in FIG. 15b) located in the first source-drain conductive layer SD1. A first electrode of a first reset transistor T1 of a first pixel circuit 11 is electrical connected to an n-th first initial signal line Vinit1 (n) via the second transfer block HC2. An end of the second transfer block HC2 may be electrically connected to the first electrode, that is located in the semiconductor layer Poly (another conductor in the semiconductor layer Poly), of the first reset transistor T1 through another via hole sequentially penetrating the interlayer dielectric layer ILD, the second gate insulating layer GI2 and the first gate insulating layer GI1, and the other end of the second transfer block may be electrically connected to the n-th first initial signal line Vinit1($n$) located in the second gate conductive layer Gate2 through another via hole penetrating the interlayer dielectric layer ILD.

In some examples, as shown in FIG. 11$a$, second plates C2 of at least two storage capacitors Cst in pixel circuits of a same row of pixel circuits are connected to one another to be of a one-piece structure.

That is, the second plates C2 of the at least two storage capacitors Cst in the pixel circuits 10 of the same row of pixel circuits 10 are located in a same film layer (e.g., the second gate conductive layer Gate2) of the display panel 100, and the second plates C2 of the at least two storage capacitors Cst are continuous and not separated.

For example, second plates C2 of two, three, five or even more storage capacitors Cst in respective pixel circuits (e.g., the pixel circuits) of the same row of pixel circuits 10 are connected to one another to be a one-piece structure.

The second plates C2 of the storage capacitors Cst located in the same row are arranged with the above arrangement. In this way, it is possible to not only simplify the manufacturing process of the display panel 100, but also improve a degree in regularity of an arrangement of the second plates C2.

In some examples, as shown in FIGS. 4$a$, 4$b$, 5 and 6, the plurality of pixel circuits 10 included in the display panel 100 may be arranged in a plurality of columns. Pixel circuits 10 included in each column of pixel circuits 10 may be sequentially arranged in the second direction Y. The number of pixel circuits 10 included in each of any two adjacent columns of pixel circuits 10 may be the same or different.

For example, as shown in FIGS. 15$a$ and 15$b$, there may be a plurality of voltage signal lines VDD electrically connected to the pixel circuits. The plurality of voltage signal lines VDD each extend in the second direction Y and are sequentially arranged in the first direction X. As shown in FIG. 15$b$, a voltage signal line VDD is electrically connected, for example, to second plates C2 of storage capacitors Cst in a column of pixel circuits 10.

For example, voltage signals transmitted by the plurality of voltage signal lines VDD are each a constant voltage signal.

Optionally, a voltage signal line VDD may be electrically connected, for example, to second plates C2 of storage capacitors Cst in two, three or more columns of pixel circuits 10.

With the above arrangement, a voltage signal line VDD may be used for providing a voltage signal for second plates C2 of multiple storage capacitors Cst, thereby improving an effect of transmitting the voltage signal.

The second plates C2 of the at least two storage capacitors Cst in the pixel circuits 10 of the same row of pixel circuits 10 are connected to one another to be a one-piece structure, and thus second plates C2 of at least part or even all of the storage capacitors Cst and respective voltage signal lines VDD electrically connected thereto may constitute a grid structure. In this way, it is not only conducive to reducing a voltage drop in the voltage signal line VDD, improving a stability and a uniformity of a voltage value received by the second plate C2 of the storage capacitor Cst and ensuring stabilities of electrical signals of two plates of the storage capacitor Cst, but also conducive to reducing a probability that the display panel 100 is abnormal. Even if a part of the voltage signal lines VDD has a problem of an open circuit, it may be ensured that a second plate of a respective storage capacitor Cst is able to receive the voltage signal from a second plate of a storage capacitor Cst being of a one-piece structure therewith.

In some examples, the second plate of the storage capacitor Cst and the voltage signal line VDD are located in different layers.

For example, as shown in FIGS. 11$a$ and 15$b$, the second plates of the storage capacitors Cst are located in the second gate conductive layer Gate2; as shown in FIG. 15$a$, the plurality of voltage signal lines VDD are located in the second source-drain conductive layer SD2.

In this way, the wiring space may be enlarged, and it is conducive to reducing a wiring difficulty of the second plates of the storage capacitors Cst and the voltage signal lines VDD.

For example, as shown in FIG. 15$c$, the display panel further includes a third transfer block HC3 located in the first source-drain conductive layer SD1. A voltage signal line VDD may be in contact with the third transfer block HC3 through a via hole penetrating the first planarization layer PLN1 to achieve an electrical connection. One end of the third transfer block HC3 may be in contact with a second plate C2 of a storage capacitor Cst through yet another via hole penetrating the interlayer dielectric layer ILD to achieve an electrical connection, so that the second plate C2 of the storage capacitor Cst is electrically connected to the voltage signal line VDD via the third layer changing block HC3. The other end of the third layer changing block HC3 may be in contact with a first electrode s5 of a first light-emitting control transistor T5 through a via hole sequentially penetrating the interlayer dielectric layer ILD, the second gate insulating layer GI2 and the first gate insulating layer GI1 to achieve an electrical connection. Thus, The first electrode s5 of the first light-emitting control transistor T5 is electrically connected to the voltage signal line VDD via the third layer changing block HC3.

In some examples, as shown in FIG. 15$b$, the pixel circuit 10 further includes a transfer portion Z connected to the second electrode of the compensation transistor T2 and the first plate C1 of the storage capacitor Cst. As shown in FIGS. 13$a$ and 15$b$, the transfer portion Z is located in the first source-drain conductive layer SD1.

For example, as shown in FIG. 11$b$, the second plate C2 of the storage capacitor Cst has an opening, and an orthogonal projection of the opening on the substrate is located within an orthographic projection of the first plate C1 of the storage capacitor Cst on the substrate. That is, the opening of the second plate C2 exposes a portion of the first plate C1.

For example, as shown in FIG. 15$d$, one end of the transfer portion Z may be in contact with the second electrode d2 of the compensation transistor T2 through a via hole sequentially penetrating the interlayer dielectric layer ILD, the second gate insulating layer GI2 and the first gate insulating layer GI1 to achieve an electrical connection; the other end of the transfer portion Z may be in contact with the first plate C1 of the storage capacitor Cst through a via hole, of which an orthogonal projection on the substrate is located within the orthogonal projection of the opening on the substrate, sequentially penetrating the interlayer dielectric layer ILD and the second gate insulating layer GI2 to achieve an electrical connection.

For example, the transfer portion Z disposed in the first source-drain conductive layer SD1 may be used for create bridging between the second electrode of the compensation transistor T2 and the first plate C1 of the storage capacitor Cst, which avoids a short circuit formed by the two and a scan signal line due to a direct electrical connection between the two, thereby reducing a wiring difficulty and improving an accuracy of the electrical connection.

For example, as shown in FIG. 15*b*, an orthographic projection of the transfer portion Z on the substrate is located within an orthographic projection of the voltage signal line VDD on the substrate 101.

That is, an area of the orthographic projection of the transfer portion Z on the substrate 101 is less than an area of the orthographic projection of the voltage signal line VDD on the substrate 101. A border of the orthographic projection of the transfer portion Z on the substrate 101 partially coincides with a border of the orthographic projection of the voltage signal line VDD on the substrate 101. Alternatively, the border of the orthographic projection of the transfer portion Z on the substrate 101 is spaced apart from the border of the orthographic projection of the voltage signal line VDD on the substrate 101 at every position.

With the above arrangement, the voltage signal line VDD may completely cover the transfer portion Z, so as to shield the transfer portion Z. In this way, it is possible to prevent a position to which the first node N1 corresponds from overlapping with a position to which the fourth node N4 corresponds, so that a parasitic capacitance generated between a film layer (e.g., an anode layer of the light-emitting device 20 or the connection layer) located on a side of the voltage signal line VDD away from the substrate and the transfer portion Z may be avoided, and in turn, it is possible to prevent the parasitic capacitance from interfering with a signal transmitted by the transfer portion Z and a signal transmitted by the film layer.

In some examples, as shown in FIG. 14*a*, the first planarization layer PLN1 is provided with first via holes H1 and second via holes H2 therein.

Figure 15E:
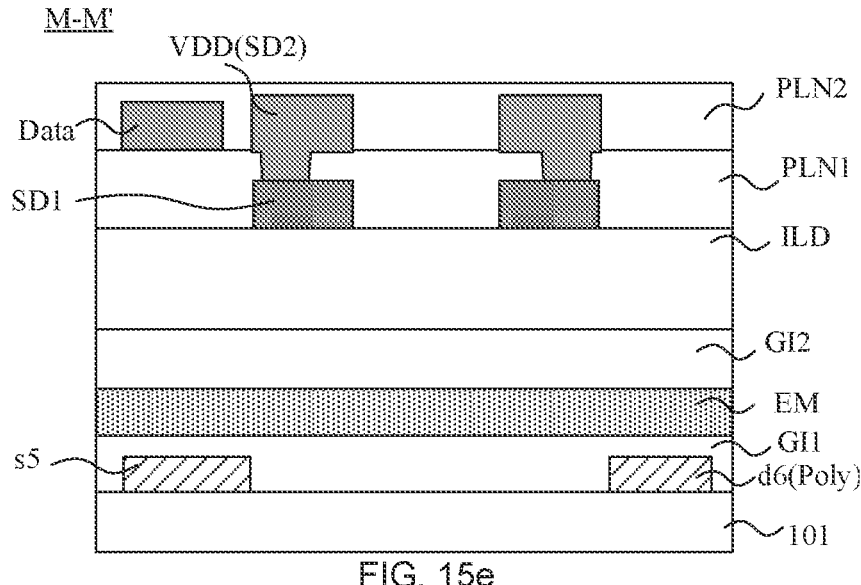
FIG. 15e is a sectional view of the top view shown in FIG. 15b taken along the line M-M'.

For example, the first via holes H1 and the second via holes H2 each extend toward the substrate and sequentially penetrate the interlayer dielectric layer, the second gate insulating layer and the first gate insulating layer. As shown in FIG. 15*b*, a first via hole H1 exposes the first electrode s5 (as shown in FIG. 15*e*) of the first light-emitting control transistor T5, and a second via hole H2 exposes the second electrode d6 (as shown in FIG. 15*e*) of the second light-emitting control transistor T6.

For example, the first electrode s5 of the first light-emitting control transistor T5 is electrically connected to the voltage signal line VDD through the first via hole H1, and the second electrode d6 of the second light-emitting control transistor T6 is electrically connected to the light-emitting device through the second via hole H2.

For example, the first planarization layer PLN1 is generally made of a transparent material, and FIG. 14*a* only shows positions of via holes in the first planarization layer PLN1.

For example, as shown in FIG. 14*a*, the first planarization layer PLN1 is further provided with third via holes H3 therein. As shown in FIG. 15*b*, the first electrode of the switching transistor T4 is electrically connected to the data line Data through a third via hole H3.

For example, as shown in FIG. 15*b*, an enable signal line EM electrically connected to a control electrode of a first light-emitting control transistor T5 and a control electrode of a second light-emitting control transistor T6 that are in a same pixel circuit is located in the first gate conductive layer Gate1. An orthogonal projection, on the substrate, of the first via hole H1 corresponding to the first light-emitting control transistor T5 and an orthogonal projection, on the substrate, of the second via hole H2 corresponding to the second light-emitting control transistor T6 are both located within an orthographic projection of the enable signal line EM on the substrate.

With the above arrangement, the first via holes and the second via holes in the first planarization layer may be arranged regularly, which facilitates manufacturing. In addition, with the above arrangement, a space occupied by the display panel in the second direction may be relatively small, so as to save the space. As a result, it is conducive to a layout design of other film layers (e.g., a first connection layer, a second connection layer, a third connection layer and the anode layer that will be described below) in the second direction.

In some embodiments, the number of the plurality of connection layers in the display panel may be at least two. For example, the number of the connection layers may be two, three, four or more.

For example, the plurality of connection lines 30 included in the display panel 100 may be located in the plurality of connection layers 103, and each connection layer 103 includes at least one connection line 30.

In some examples, as shown in FIG. 25*c*, each connection layer 103 may further include at least one connection portion 1031. The connection portion 1031 and the connection line 30 located in the same connection layer are arranged separately.

In some examples, as shown in FIGS. 17*a*, 19*a*, 21*a* and 25*c*, there are three connection layers 103. The three connection layers 103 include a first connection layer CO1, a second connection layer CO2 and a third connection layer CO3 that are disposed on a side of the second source-drain conductive layer SD2 away from the substrate 101 and sequentially arranged in a direction away from the substrate 101.

For example, as shown in FIG. 25*c*, a second planarization layer PLN2 is provided between the second source-drain conductive layer SD2 and the first connection layer CO1; a third planarization layer PLN3 is provided between the first connection layer CO1 and the second connection layer CO2; a fourth planarization layer PLN4 is provided between the second connection layer CO2 and the third connection layer CO3; a fifth planarization layer PLN5 is provided between the third connection layer CO3 and the light-emitting device layer 104.

Figure 16A:
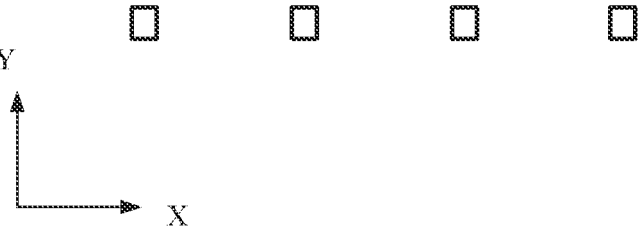
FIG. 16a is a top view of yet another film layer in a display panel, in accordance with some embodiments of the present disclosure.
Figure 16B:
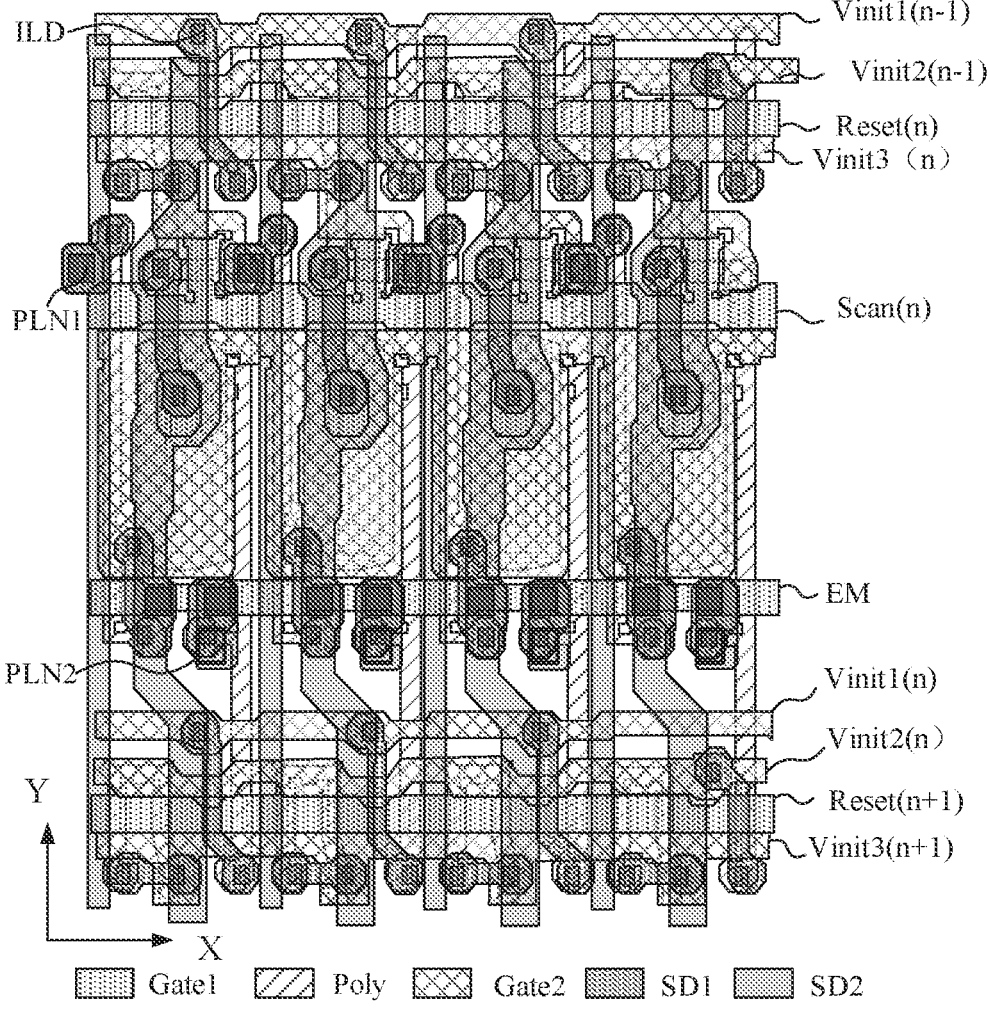
FIG. 16b is a top view of yet another part of film layers in a display panel, in accordance with some embodiments of the present disclosure.
Figure 17A:
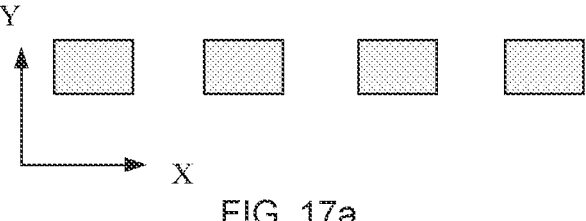
FIG. 17a is a top view of yet another film layer in a display panel, in accordance with some embodiments of the present disclosure.
Figure 17B:
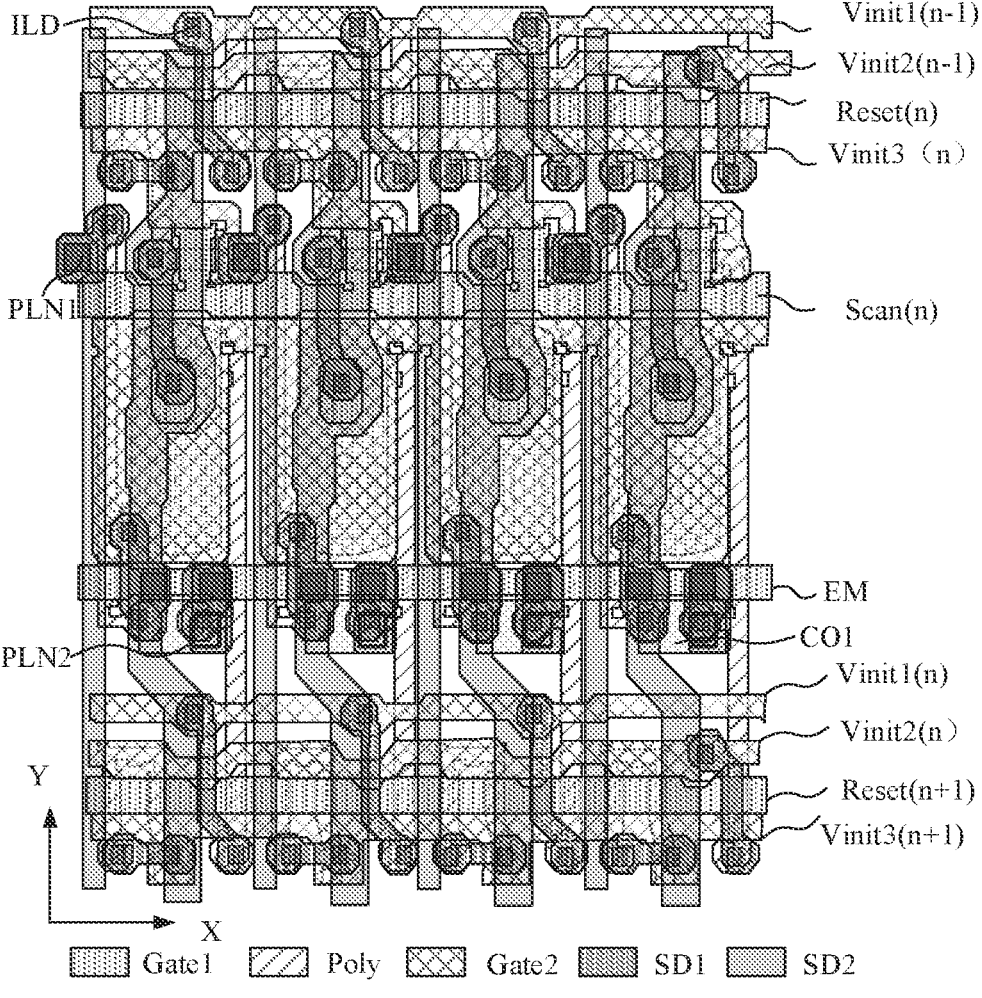
FIG. 17b is a top view of yet another part of film layers in a display panel, in accordance with some embodiments of the present disclosure.
Figure 18A:
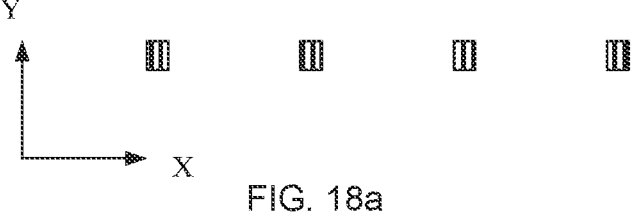
FIG. 18a is a top view of yet another film layer in a display panel, in accordance with some embodiments of the present disclosure.
Figure 18B:
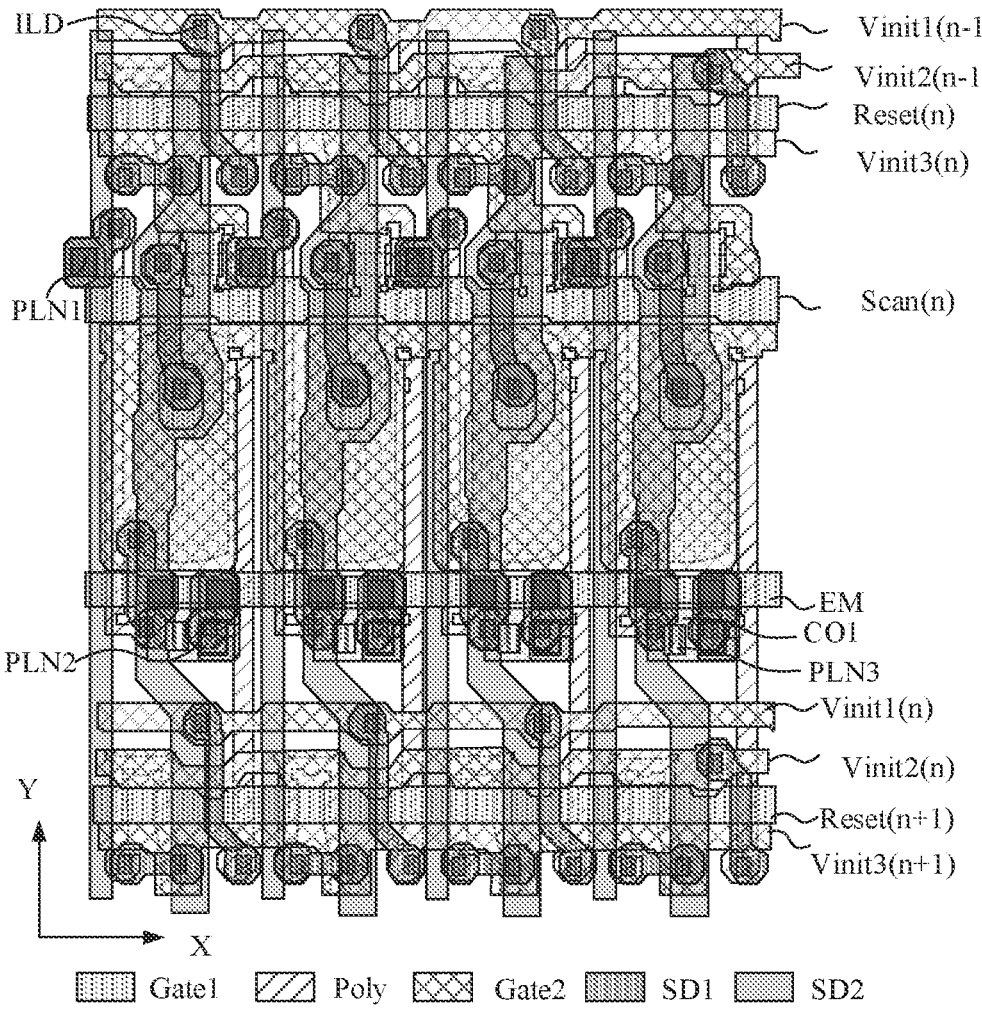
FIG. 18b is a top view of yet another part of film layers in a display panel, in accordance with some embodiments of the present disclosure.
Figure 19A:
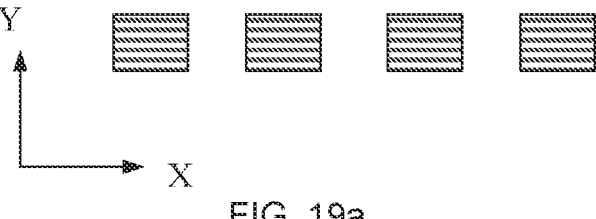
FIG. 19a is a top view of yet another film layer in a display panel, in accordance with some embodiments of the present disclosure.
Figure 19B:
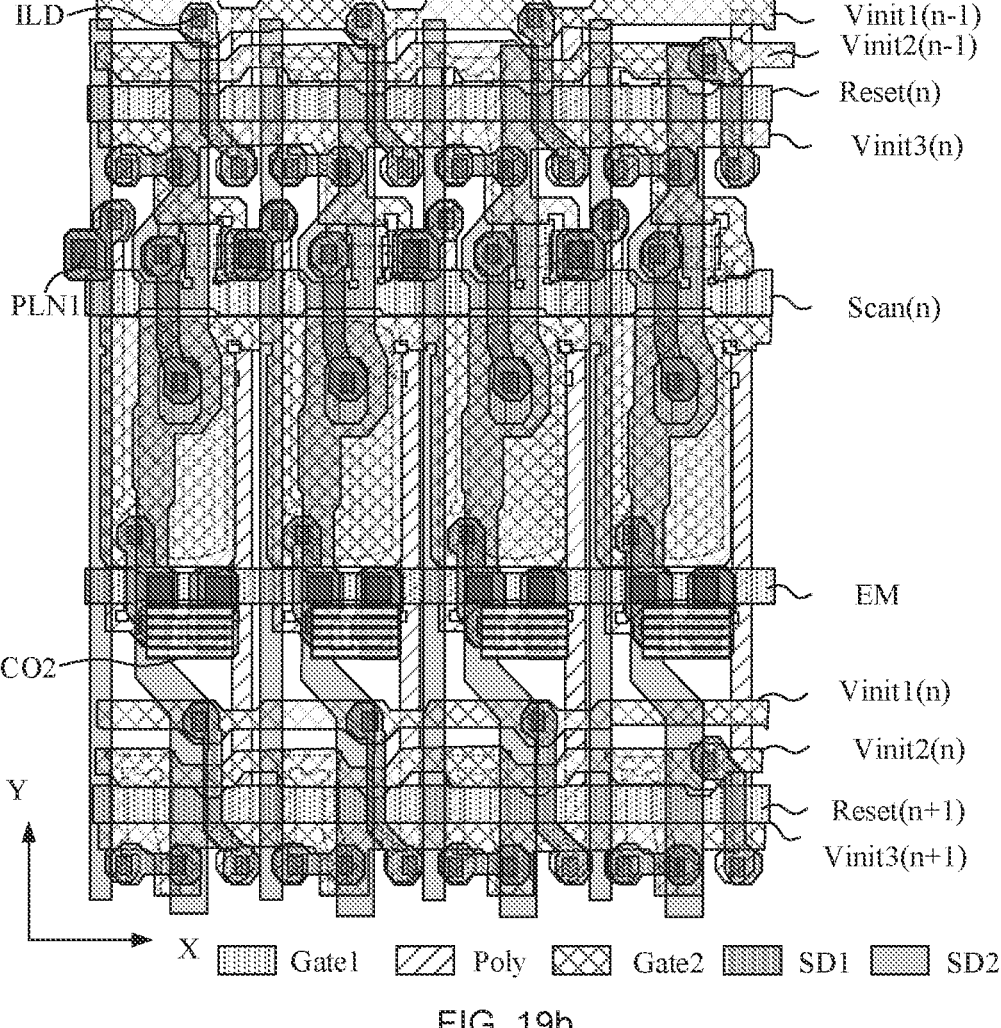
FIG. 19b is a top view of yet another part of film layers in a display panel, in accordance with some embodiments of the present disclosure.
Figure 20A:
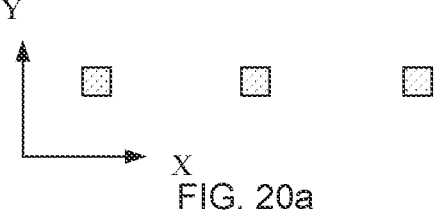
FIG. 20a is a top view of yet another film layer in a display panel, in accordance with some embodiments of the present disclosure.
Figure 20B:
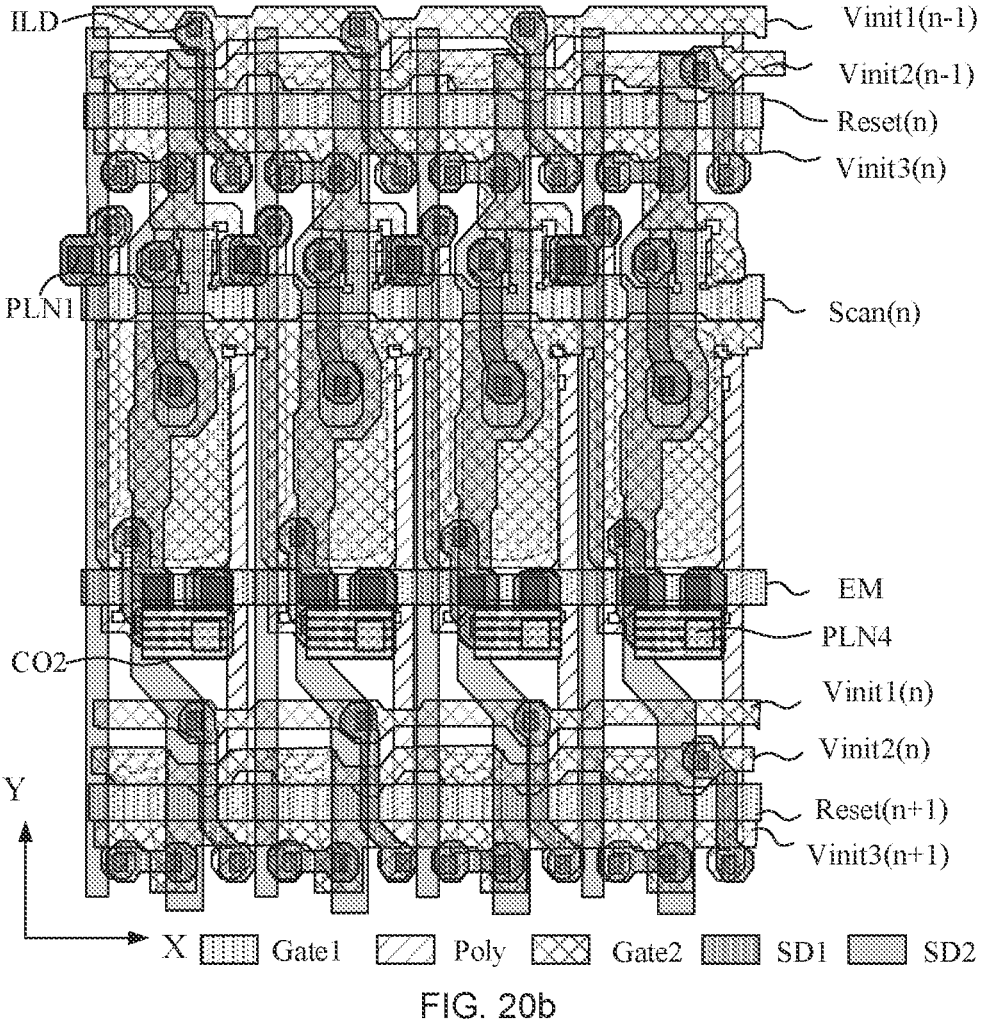
FIG. 20b is a top view of yet another part of film layers in a display panel, in accordance with some embodiments of the present disclosure.
Figure 21A:
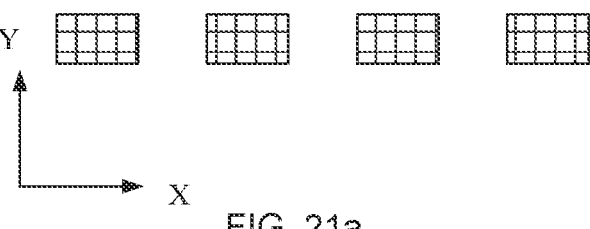
FIG. 21a is a top view of yet another film layer in a display panel, in accordance with some embodiments of the present disclosure.
Figure 21B:
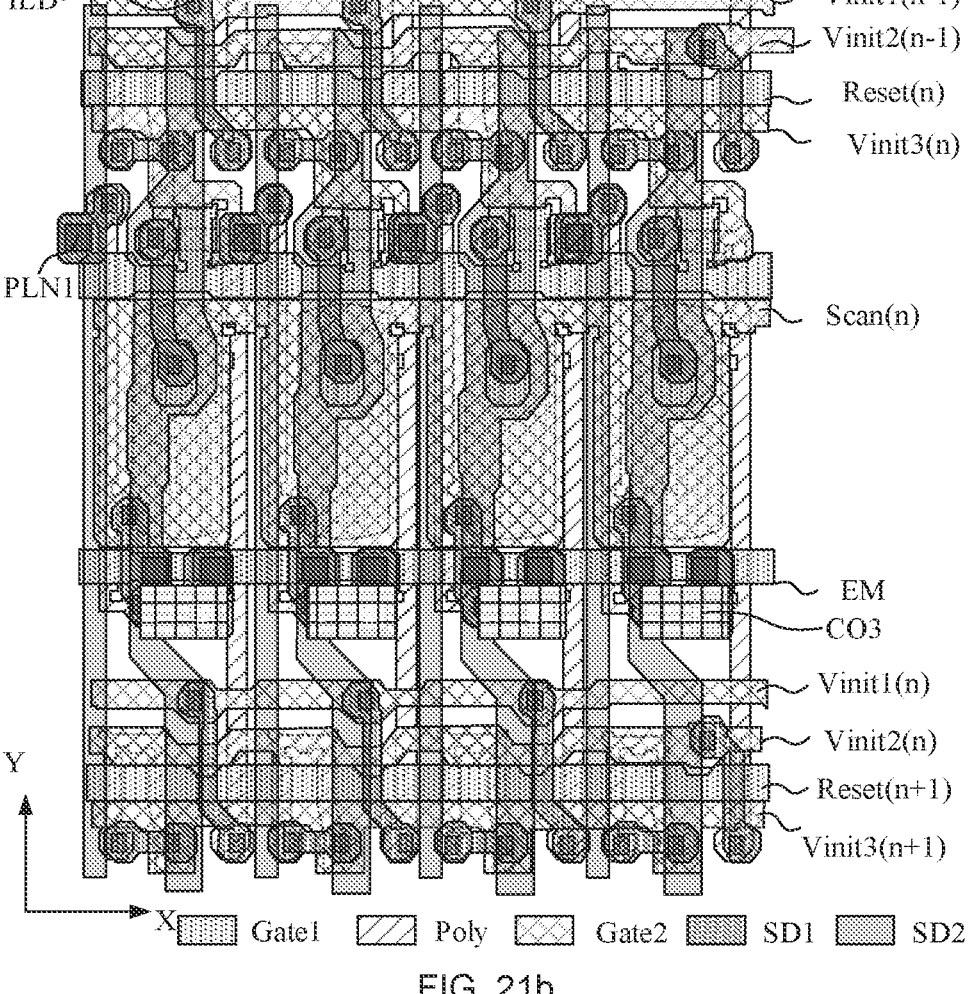
FIG. 21*b* is a top view of yet another part of film layers in a display panel, in accordance with some embodiments of the present disclosure.

FIG. 16*a* illustrates a top view of a structure of the second planarization layer PLN2. FIG. 16*b* illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2 and the second planarization layer PLN2 are stacked in sequence. FIG. 17*a* illustrates a top view of a structure of the first connection layer CO1. FIG. 17*b* illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer PLN2 and the first connection layer CO1 are stacked in sequence. FIG. 18*a* illustrates a top view of a structure of the third planarization layer PLN3. FIG. 18*b* illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer PLN2, the first connection layer CO1 and the third planarization layer PLN3 are stacked in sequence. FIG. 19a illustrates a top view of a structure of the second connection layer CO2. FIG. 19b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer and the second connection layer CO2 are stacked in sequence. FIG. 20a illustrates a top view of a structure of the fourth planarization layer PLN4. FIG. 20b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer CO2 and the fourth planarization layer PLN4 are stacked in sequence. FIG. 21a illustrates a top view of a structure of the third connection layer CO3. FIG. 21b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer, the fourth planarization layer and the third connection layer CO3 are stacked in sequence.

For example, as shown in FIGS. 16a to 22b, for a convenience of illustrating a position and a morphology feature of each film layer in the figures, only positions of via holes on each of the second planarization layer PLN2, the third planarization layer PLN3, the fourth planarization layer PLN4 and the fifth planarization layer PLN5 are illustrated in the figures.

Figure 22A:
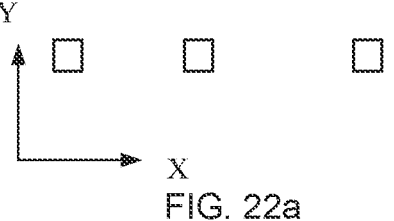
FIG. 22*a* is a top view of yet another film layer in a display panel, in accordance with some embodiments of the present disclosure.
Figure 22B:
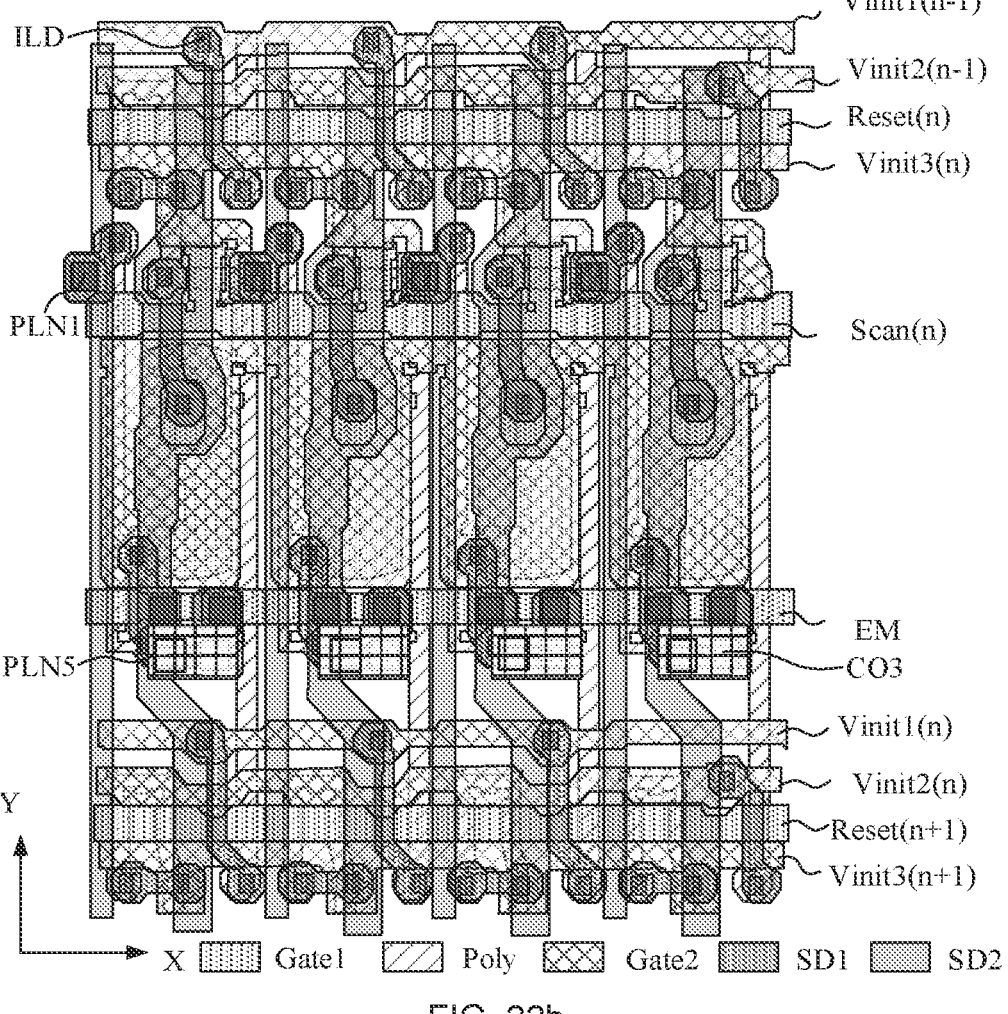
FIG. 22*b* is a top view of yet another part of film layers in a display panel, in accordance with some embodiments of the present disclosure.
Figure 23A:
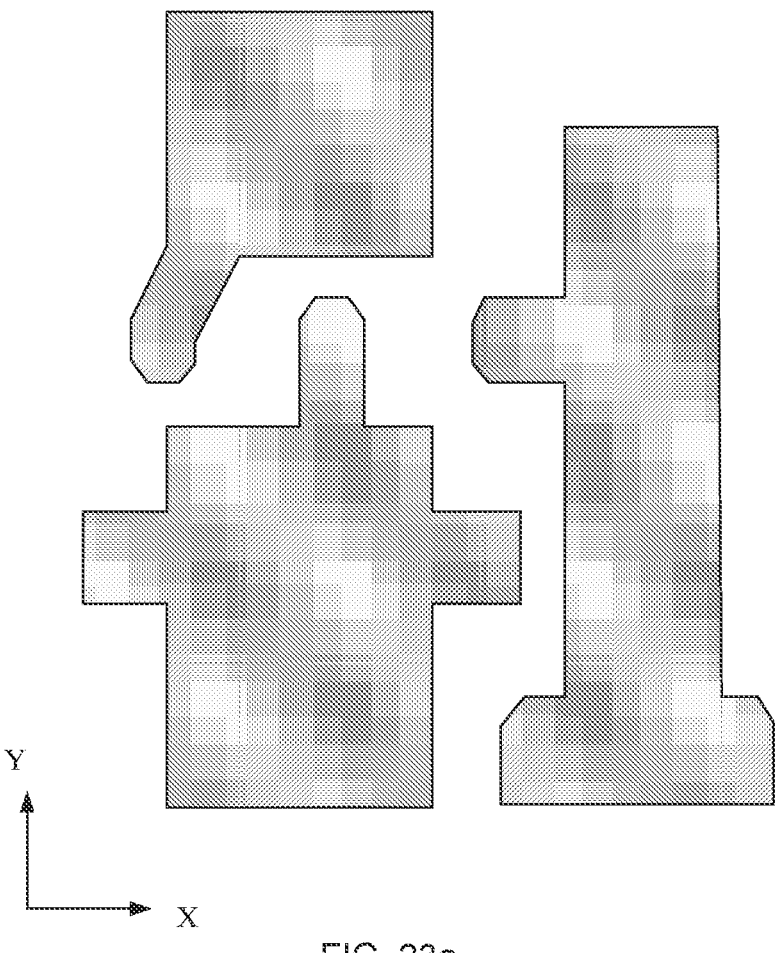
FIG. 23*a* is a top view of yet another film layer in a display panel, in accordance with some embodiments of the present disclosure.
Figure 23B:
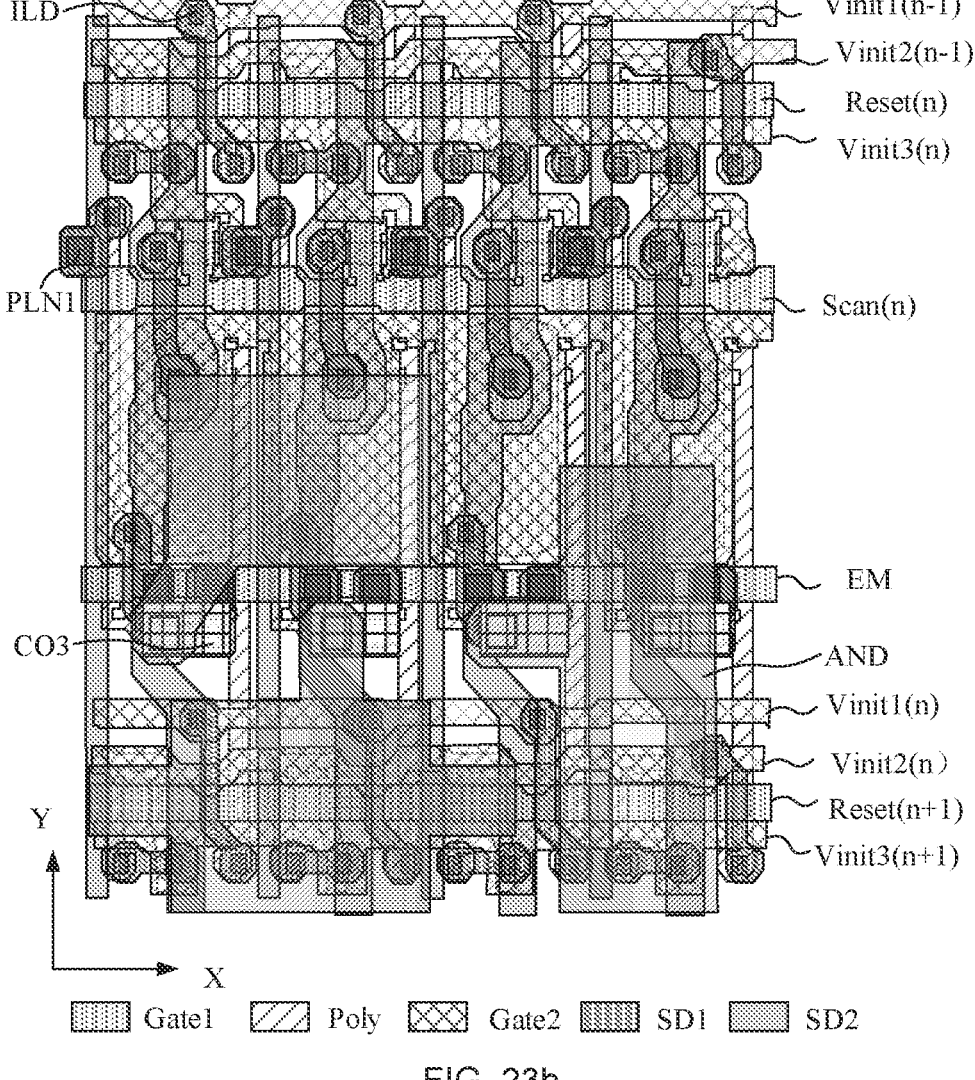
FIG. 23*b* is a top view of yet another part of film layers in a display panel, in accordance with some embodiments of the present disclosure.

FIG. 22a illustrates a top view of a structure of the fifth planarization layer PLN5. FIG. 22b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer, the fourth planarization layer, the third connection layer CO3 and the fifth planarization layer PLN5 are stacked in sequence. FIG. 23a illustrates a top view of a structure of the anode layer AND. FIG. 23b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer, the fourth planarization layer, the third connection layer CO3, the fifth planarization layer and the anode layer AND are stacked in sequence.

Figure 25D:
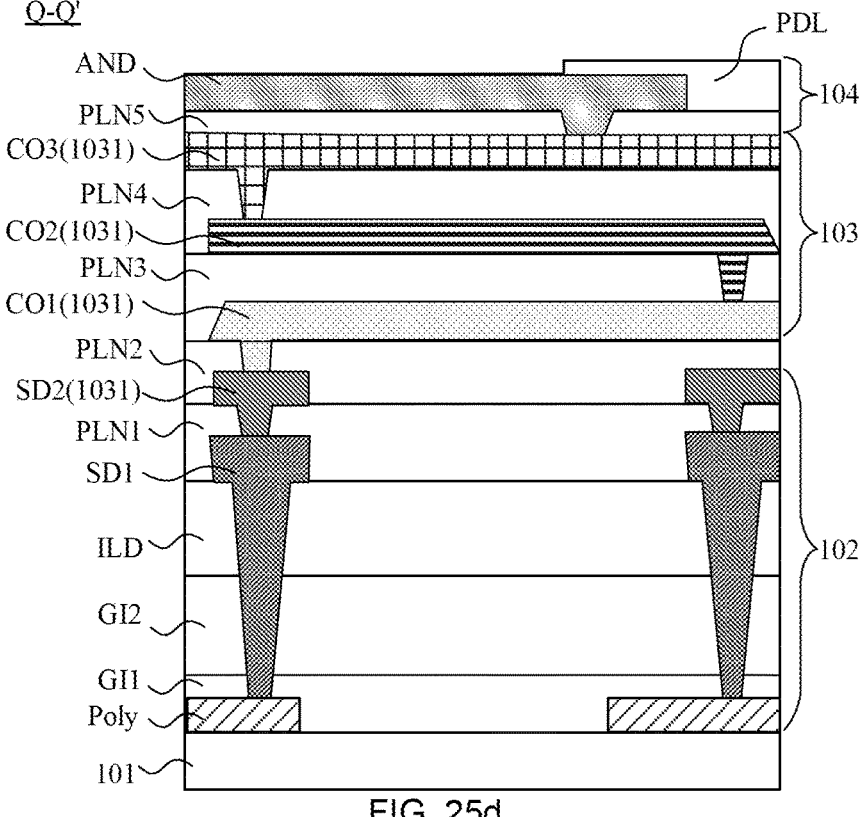
FIG. 25*d* is a sectional view of the top view shown in FIG. 25*b* taken along the line Q-Q'.

For example, as shown in FIG. 25d, the second electrode of the second light-emitting control transistor of the first pixel circuit may be electrically connected to the anode in the anode layer AND of the first light-emitting device via a connection portion 1031 located in the second source-drain conductive layer SD2, a connection portion 1031 located in the first connection layer CO1, a connection portion 1031 located in the second connection layer CO2 and a connection portion 1031 located in the third connection layer CO3 in sequence. The anode layer AND of the first light-emitting device may be electrically connected to the connection portion 1031 located in the third connection layer CO3 through a via hole penetrating the fifth planarization layer PLN5; the connection portion 1031 located in the third connection layer CO3 may be electrically connected to the connection portion 1031 located in the second connection layer CO2 through a via hole penetrating the fourth planarization layer PLN4; the connection portion 1031 located in the second connection layer CO2 may be electrically connected to the connection portion 1031 located in the first connection layer CO1 through a via hole penetrating the third planarization layer PLN3; the connection portion 1031 located in the first connection layer CO1 may be electrically connected to the connection portion 1031 located in the second source-drain conductive layer SD2 through a via hole penetrating the second planarization layer PLN2; the connection portion 1031 located in the second source-drain conductive layer SD2 may be electrically connected to the second electrode of the second light-emitting control transistor of the first pixel circuit through a via hole penetrating the first planarization layer PLN1.

For example, a second electrode of a second light-emitting control transistor T6 of each of a part of the second pixel circuits 12 may be electrically connected to one end of a connection line 30 located in the first connection layer CO1 via another connection portion 1031 located in the second source-drain conductive layer SD2, and the other end of the connection line 30 may be electrically connected to an anode of an anode layer AND of a respective second light-emitting device 22 via another connection portion 1031 located in the second connection layer CO2 and another connection portion 1031 located in the third connection layer CO3 in sequence.

A second electrode of a second light-emitting control transistor T6 of each of another part of the second pixel circuits 12 may be electrically connected to one end of a connection line 30 located in the second connection layer CO2 via yet another connection portion 1031 located in the second source-drain conductive layer SD2 and another connection portion 1031 located in the first connection layer CO1 in sequence, and the other end of the connection line 30 may be electrically connected to an anode of an anode layer AND of a respective second light-emitting device 22 via yet another connection portion 1031 located in the third connection layer CO3.

As shown in FIG. 25c, a second electrode of a second light-emitting control transistor of each of yet another part of the second pixel circuits may be electrically connected to one end of a connection line 30 located in the third connection layer CO3 via yet another connection portion 1031 located in the second source-drain conductive layer SD2, yet another connection portion 1031 located in the first connection layer CO1 and yet another connection portion 1031 located in the second connection layer CO2 in sequence, and the other end of the connection line 30 may be electrically connected to an anode of an anode layer AND of a respective second light-emitting device 22.

An arrangement of the via holes in each planarization layer in this example is the same as that in the above examples, which will not be repeated here.

In some embodiments, as shown in FIGS. 24a, 24b, 25c and 25d, the light-emitting device layer 104 of the display panel may further include a pixel definition layer PDL disposed on a side of the anode layer AND away from the substrate.

Figure 24A:
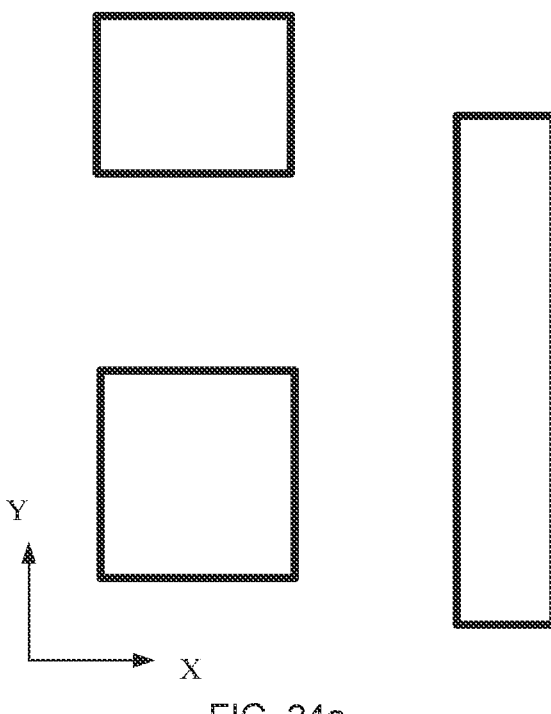
FIG. 24*a* is a top view of yet another film layer in a display panel, in accordance with some embodiments of the present disclosure.
Figure 24B:
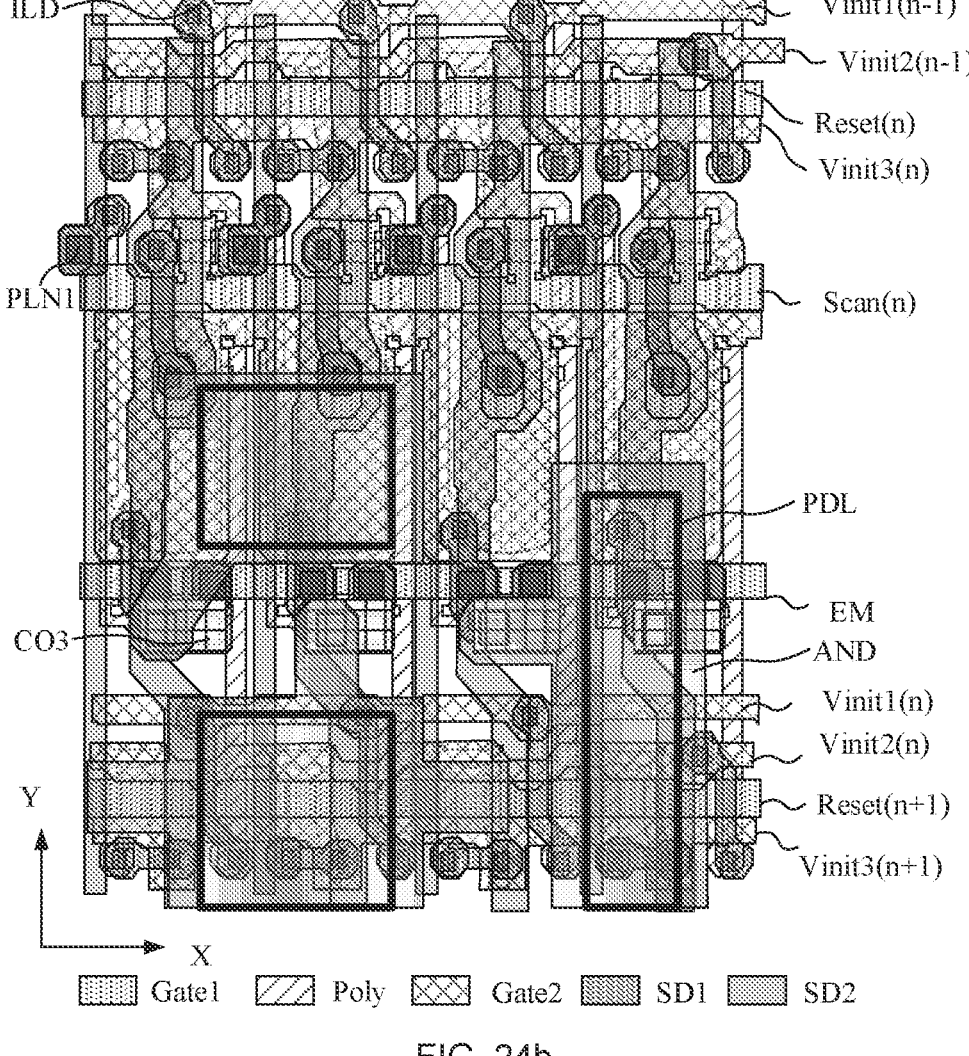
FIG. 24*b* is a top view of yet another part of film layers in a display panel, in accordance with some embodiments of the present disclosure.

FIG. 24a illustrates a top view of a structure of the pixel definition layer PDL. FIG. 24b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer, the fourth planarization layer, the third connection layer CO3, the fifth planarization layer, the anode layer AND and the pixel definition layer PDL are stacked in sequence. FIG. 25a illustrates a top view of a structure of the light-emitting layer EL. FIG. 25b illustrates a top view of a structure of which the semiconductor layer Poly, the first gate conductive layer Gate1, the second gate conductive layer Gate2, the interlayer dielectric layer ILD, the first source-drain conductive layer SD1, the first planarization layer PLN1, the second source-drain conductive layer SD2, the second planarization layer, the first connection layer, the third planarization layer, the second connection layer, the fourth planarization layer, the third connection layer CO3, the fifth planarization layer, the anode layer AND, the pixel definition layer PDL and the light-emitting layer EL are stacked in sequence.

For example, the pixel definition layer PDL is used for defining a magnitude of a light-emitting area of the light-emitting layer EL (as shown in FIGS. 25a and 25b). The anode layer AND (as shown in FIGS. 23a and 23b) is in direct contact or indirect contact with the light-emitting layer EL, so as to provide an anode voltage for the light-emitting layer EL.

Figure 6:
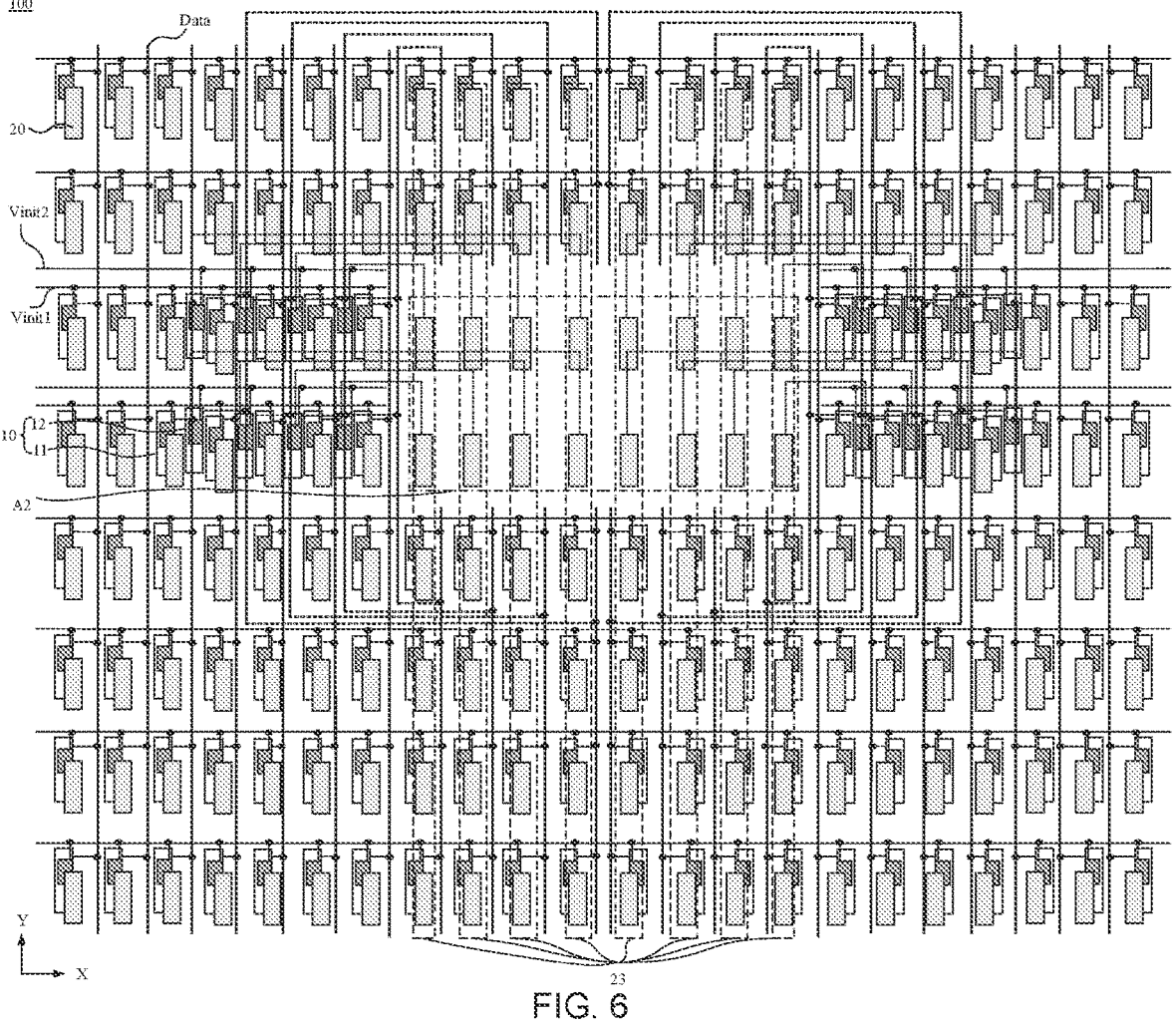
FIG. 6 is a structural diagram of yet another display panel, in accordance with some embodiments of the present disclosure.

In some embodiments, as shown in FIG. 6, the plurality of pixel circuits 10 are arranged in a plurality of rows and a plurality of columns. For example, each row of pixel circuits 10 include multiple pixel circuits 10, and the multiple pixel circuits 10 are sequentially arranged in the first direction X; each column of pixel circuits 10 include multiple pixel circuits 10, and the multiple pixel circuits 10 are sequentially arranged in the second direction Y. The number of pixel circuits 10 included in each of any two adjacent rows of pixel circuits 10 may be the same or different, and the number of pixel circuits 10 included in each of any two adjacent columns of pixel circuits 10 may be the same or different.

In some examples, as shown in FIG. 6, in the pixel circuits 10, the first pixel circuit 11 and the second pixel circuit 12 are located in different columns. That is, a same column of pixel circuits 10 include only first pixel circuits 11 or second pixel circuits 12.

In some examples, as shown in FIG. 15b, control electrodes of first reset transistors T1, compensation transistors T2 and switching transistors T4 of all pixel circuits 10 in a same row of pixel circuits 10 may be electrically connected to a same scan signal line Scan. First electrode of second reset transistors T7 of all pixel circuits 10 in the same row of pixel circuits 10 may be electrically connected to a same third initial signal line Vinit3. Control electrodes of the second reset transistors T7 of all the pixel circuit 10 in the same row of pixel circuits 10 may be electrically connected to a same reset signal line Reset.

Figure 5:
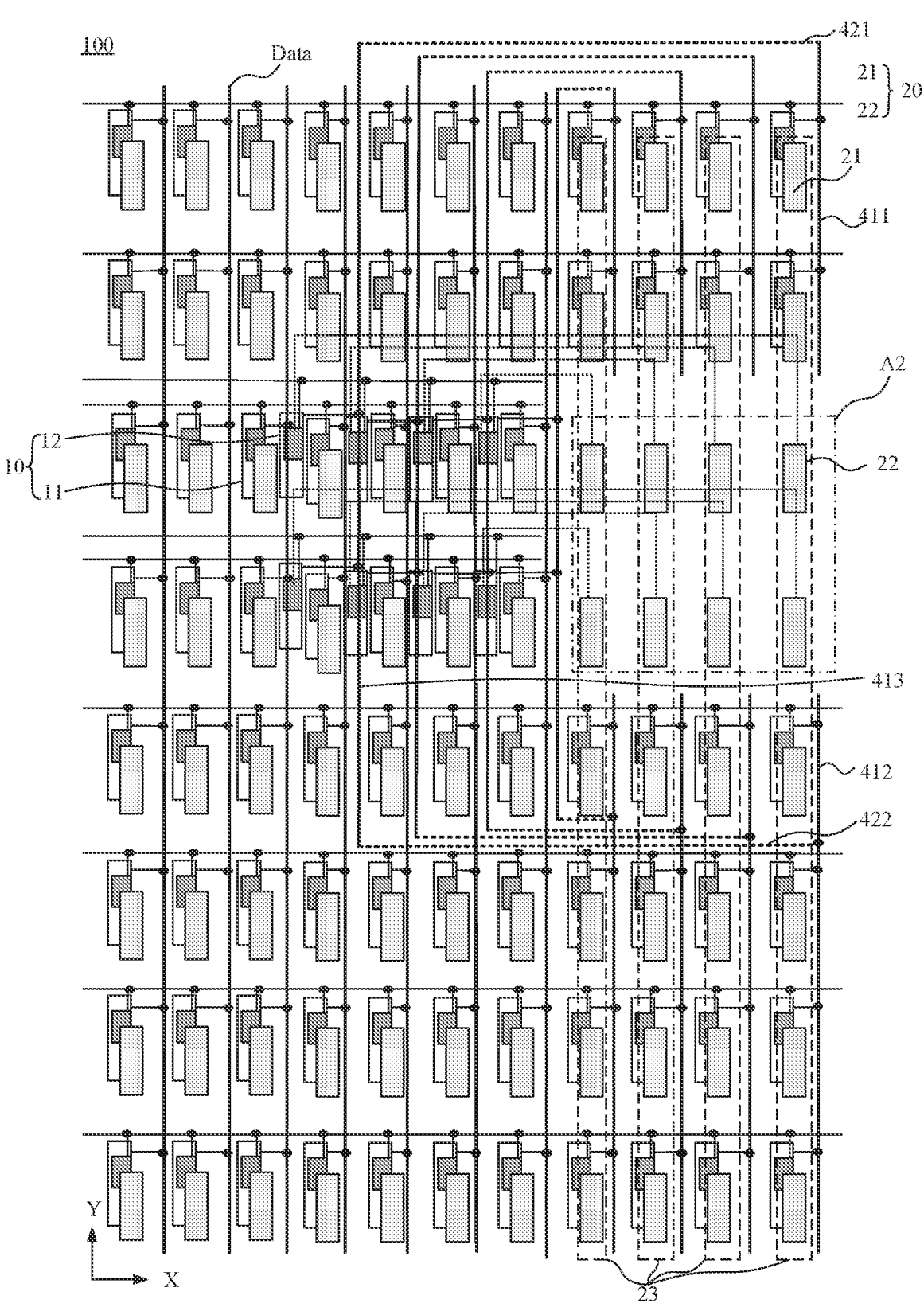
FIG. 5 is a structural diagram of yet another display panel, in accordance with some embodiments of the present disclosure.

In some embodiments, as shown in FIGS. 5 and 6, the plurality of light-emitting devices 20 of the display panel 100 are arranged in an array. For example, the plurality of light-emitting devices 20 are arranged in a plurality of rows and a plurality of columns. Light-emitting devices 20 included in a same row of light-emitting devices 20 are sequentially arranged in the first direction X, and light-emitting devices 20 included in a same column of light-emitting devices 20 are sequentially arranged in the second direction Y.

The number of light-emitting devices 20 included in each of any two adjacent rows of light-emitting devices 20 may be the same or different; the number of light-emitting devices 20 included in each of any two adjacent columns of light-emitting devices 20 may be the same or different.

For example, as shown in FIGS. 5 and 6, the first light-emitting devices 21 of the plurality of light-emitting devices 20 may be arranged in a plurality of rows and a plurality of columns.

For example, as shown in FIGS. 5 and 6, the second light-emitting devices 22 of the plurality of light-emitting devices 20 may be arranged in a plurality of rows and a plurality of columns.

In some embodiments, as shown in FIGS. 5 and 6, the display panel 100 includes a plurality of light-emitting device columns 23 that are sequentially arranged in the first direction X. Each light-emitting device column 23 includes first light-emitting devices 21, of the plurality of first light-emitting devices 21 located in the main display region A1, and second light-emitting devices 22, of the plurality of second light-emitting devices 22 located in the auxiliary display region A2, that are sequentially arranged in the second direction Y.

A same column of light-emitting devices 20 may include only first light-emitting devices 21; alternatively, the same column of light-emitting devices 20 may include only second light-emitting devices 22; alternatively, the same column of light-emitting devices 20 may include first light-emitting devices 21 and second light-emitting devices 22.

For example, a same column of light-emitting devices including both first light-emitting devices 21 and second light-emitting devices 22 are referred to as the light-emitting device column 23 in the embodiments of the present disclosure.

In some examples, as shown in FIGS. 5 and 15a, data lines Data included in the display panel each extend in the second direction Y.

For example, each data line Data of the data lines Data may extend in the second direction Y as a whole. Each data line Data, as a whole, may be or may substantially be in a shape of a straight line or a curve, which is not limited in the embodiments of the present disclosure.

In some examples, as shown in FIG. 5, first pixel circuits 11 electrically connected to the first light-emitting devices 21 in the light-emitting device column 23 and second pixel circuits 12 electrically connected to the second light-emitting devices 22 in the light-emitting device column 23 are electrically connected to a same data line Data.

With this arrangement, the first pixel circuits 11 electrically connected to the first light-emitting devices 21 in the light-emitting device column 23 and the second pixel circuits 12 electrically connected to the second light-emitting devices 22 in the light-emitting device column 23 may receive a data signal from the same data line Data. In this way, during a process of driving the plurality of pixel circuits 10 of the display panel 100 to enable the display panel 100 to perform display, the pixel circuits 10 electrically connected to the same column of light-emitting devices 20 may be provided with the data signal in a column driving manner, which is conducive to simplifying a driving manner of the display panel 100 and ensuring a display uniformity of the display panel 100.

In some embodiments, as shown in FIG. 5, a portion, electrically connected to the second pixel circuits 12, of the data line Data electrically connected to the light-emitting device column 23 is located in the main display region A1.

It will be understood that a light transmittance of the data line Data is relatively small, so that a blocking effect thereof on light is relatively strong.

With the above arrangement used in the embodiments of the present disclosure, the data line Data may be prevented from being disposed in the auxiliary display region A2, so that the portion of the data line Data electrically connected to the second pixel circuits 12 may be prevented from blocking the external light. In this way, it is conducive to enabling the optical element 200 located in the auxiliary display region A2 to collect more light, so that the optical element 200 may be ensured to operate normally.

In some examples, as shown in FIG. 5, the second pixel circuits 12 electrically connected to the second light-emitting devices 22 in the light-emitting device column 23 are sequentially arranged in the second direction Y, and are located on a side of the auxiliary display region A2 in the first direction X.

For example, the second pixel circuits 12 electrically connected to the second light-emitting devices 22 in the light-emitting device column 23 may be separately arranged in a column. That is, in the plurality of pixel circuits 10 included in the display panel 100, a column of pixel circuits 10 include only first pixel circuits 11 or second pixel circuits 12.

In some examples, as shown in FIG. 5, the data line Data electrically connected to the light-emitting device column 23 includes: a first data sub-line 411 and a second data sub-line 412 extending in the second direction Y and respectively located on two opposite sides of the auxiliary display region A2 in the second direction Y, a third data sub-line 413 extending in the second direction Y and located on a side of the auxiliary display region A2 in the first direction X, a first transfer line 421 extending in the first direction X and connected to the first data sub-line 411 and the third data sub-line 413, and a second transfer line 422 extending in the first direction X and connected to the second data sub-line 412 and the third data sub-line 413. The first data sub-line 411 and the second data sub-line 412 are electrically connected to the first pixel circuits 11 in the light-emitting device column, and the third data sub-line 413 is electrically connected to the second pixel circuits 12 in the light-emitting device column.

For example, as shown in FIG. 5, the third data sub-line 413 and the second pixel circuits 12 electrically connected thereto are located on a same side of the auxiliary display region A2.

With the above arrangement, it is possible to not only enable the data lines Data electrically connected to the light-emitting device columns 23 to be arranged regularly, but also ensure the first light-emitting devices 21 and the second light-emitting devices 22 in each light-emitting device column 23 to receive the data signal from the same data line Data. As a result, it may be ensured that there is no difference between an image displayed in the auxiliary display region A2 and an image displayed in the main display region A1, so that the display uniformity of the display panel 100 is ensured.

Figure 26:
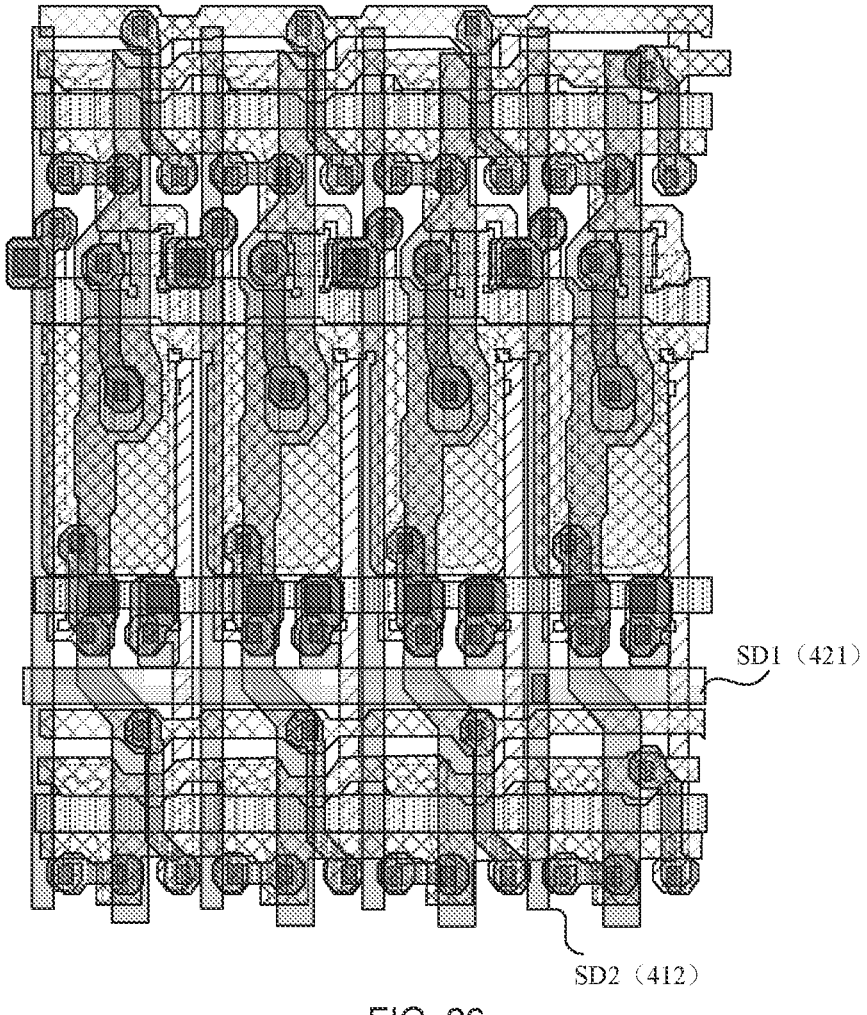
FIG. 26 is a top view of yet another part of film layers in a display panel, in accordance with some embodiments of the present disclosure.

In some examples, as shown in FIG. 26, the first data sub-line, the second data sub-line 412 and the third data sub-line are located in the second source-drain conductive layer SD2, and the first transfer line 421 and the second transfer line (not shown in the figure) are located in the first source-drain conductive layer SD1.

For example, in a case where the material of the second source-drain conductive layer SD2 and the material of the first source-drain conductive layer SD1 are the same, materials of the first data sub-line 411, the second data sub-line 412 and the third data sub-line 413 is the same as materials of the first transfer line 421 and the second transfer line 422, which may prevent a resistance of the data line Data electrically connected to the light-emitting device column 23 from being greatly improved, thereby reducing a loss of the data signal transmitted by the data line Data.

The first data sub-line 411, the second data sub-line 412 and the third data sub-line 413 are disposed in a layer different from a layer in which the first transfer line 421 and the second transfer line 422 are disposed. In this way, it is conducive to enlarging the wiring space and reducing a wiring difficulty of the data line Data.

It will be noted that a layout of the pixel circuits 10 varies, which is not limited in the embodiments of the present disclosure.

In some examples, the main display region A1 is partially compressed.

For example, the main display region A1 includes a normal region and a compression region. As shown in FIG. 4a, the second pixel circuits 12 are located in the compression region; a part of the plurality of first pixel circuits 11 are located in the normal region, and the other part of the first pixel circuits 11 are located in the compression region. In the compression region, at least one first pixel circuit 11 is disposed between two adjacent second pixel circuits 12 in the first direction X. A width of a column region in which the first pixel circuits 11 or the second pixel circuits 12 located in the compression region are located is less than a width of a column region in which the first pixel circuits 11 located in the normal region are located.

For example, a width of a column region in which the first pixel circuits 11 are located refers to a dimension, in the first direction X, of a region occupied by a pixel circuit column in which the first pixel circuits 11 are located. A width of a column region in which the second pixel circuits 12 are located refers to a dimension, in the first direction X, of a region occupied by a pixel circuit column in which the second pixel circuits 12 are located.

The width of the column region in which the first pixel circuits 11 or the second pixel circuits 12 located in the compression region are located is less than the width of the column region in which the first pixel circuits 11 located in the normal region are located, which means that the width of the column region in which the first pixel circuits 11 or the second pixel circuits 12 located in the compression region are located is compressed, and the width of the column region in which the first pixel circuits 11 located in the normal region are located is not compressed.

The width of the column region in which the first pixel circuits 11 or the second pixel circuits 12 located in the compression region are located is compressed, so that a space in the compression region is provided for arranging the second pixel circuits 12.

In some other examples, as shown in FIG. 4b, the entire main display region A1 is compressed. That is, the width of the column region in which the first pixel circuits 11 are located and the width of the column region in which the second pixel circuits 12 are located are both compressed in the first direction X.

In this way, it is conducive to further enlarging the space for arranging the second pixel circuits 12, which facilitates an arrangement of more second pixel circuits 12 in the main display region A1.

Figure 27A:
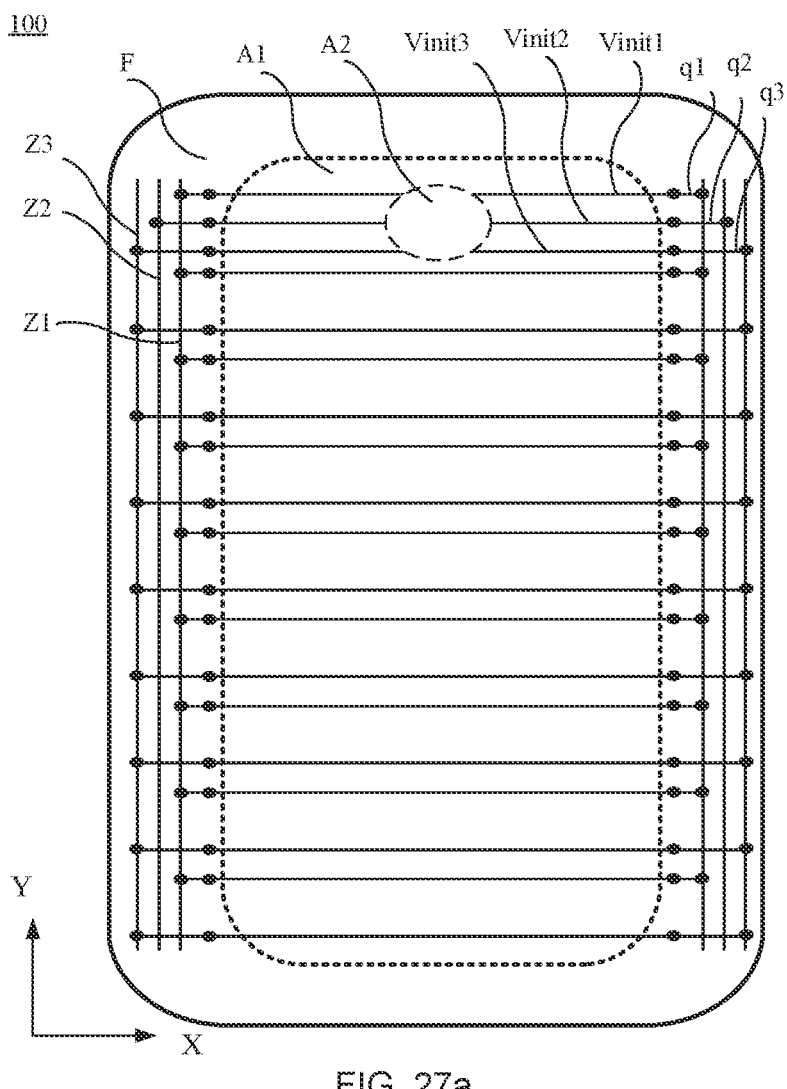
FIG. 27*a* is a structural diagram of yet another display panel, in accordance with some embodiments of the present disclosure.
Figure 27B:
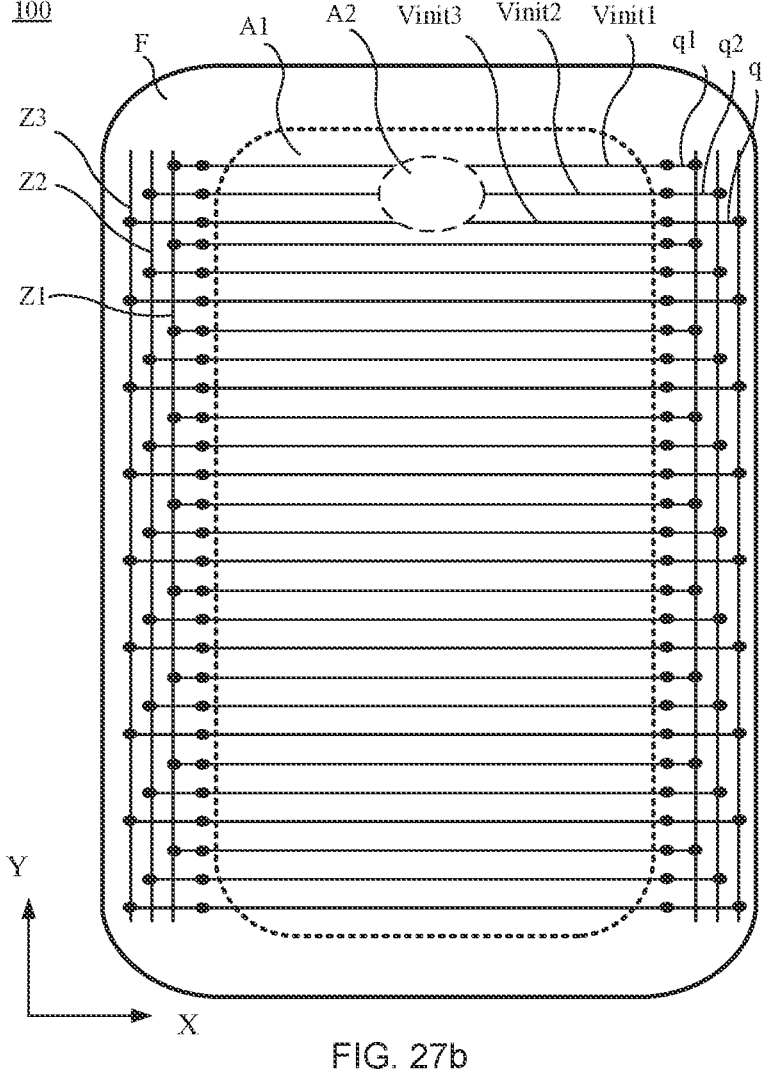
FIG. 27*b* is a structural diagram of yet another display panel, in accordance with some embodiments of the present disclosure.

In some embodiments, as shown in FIGS. 27*a* and 27*b*, the display panel 100 further includes a peripheral region F and lines disposed in the peripheral region F of the display panel 100.

For example, as shown in FIGS. 27*a* and 27*b*, the peripheral region F may be located at peripheries of the main display region A1. The lines may include first initial signal buses Z1, second initial signal buses Z2 and third initial signal buses Z3. The first initial signal buses Z1 are each electrically connected to a first initial signal line Vinit1 via a first bridging line q1, the second initial signal buses Z2 are each electrically connected to a second initial signal line Vinit2 via a second bridging line q2, and the third initial signal buses Z3 are each electrically connected to a third initial signal line Vinit3 via a third bridging line q3.

For example, the first initial signal buses Z1, the second initial signal buses Z2 and the third initial signal buses Z3 are all located in the second source-drain conductive layer SD2 of the display panel 100. The first bridging lines q1, the second bridging lines q2 and the third bridging lines q3 are all located in the first source-drain conductive layer SD1 of the display panel 100. In this case, an orthographic projection of the first initial signal bus Z1 on the substrate, an orthographic projection of the second initial signal bus Z2 on the substrate and an orthographic projection of the third initial signal bus Z3 on the substrate are non-overlapping with one another, and an orthographic projection of the first bridging line q1 on the substrate, an orthographic projection of the second bridging line q2 on the substrate and an orthographic projection of the third bridging line q3 on the substrate are non-overlapping with one another.

It will be understood that the first initial signal bus Z1, the second initial signal bus Z2 and the third initial signal bus Z3 may be respectively located in different layers, and the first bridging line q1, the second bridging line q2 and the third bridging line q3 may be respectively located in different layers. In this case, the orthographic projection of the first initial signal bus Z1 on the substrate, the orthographic projection of the second initial signal bus Z2 on the substrate and the orthographic projection of the third initial signal bus Z3 on the substrate may, for example, overlap with one another; the orthographic projection of the first bridging line q1 on the substrate, the orthographic projection of the second bridging line q2 on the substrate and the orthographic projection of the third bridging line q3 on the substrate may, for example, overlap with one another.

For example, as shown in FIGS. 27*a* and 27*b*, there may be two first initial signal buses Z1, and the two first initial signal buses Z1 may be respectively located on two opposite ends of the first initial signal line Vinit1; there may be two second initial signal buses Z2, and the two second initial signal buses Z2 may be respectively located on two opposite ends of the second initial signal line Vinit2; there may be two third initial signal buses Z3, and the two third initial signal buses Z3 may be respectively located on two opposite ends of the third initial signal line Vinit3.

In some examples, as the layout of the pixel circuits 10 is changed, a layout of the first initial signal lines Vinit1, the second initial signal lines Vinit2 and the third initial signal lines Vinit3 in the display panel 100 may be changed accordingly.

For example, FIG. 27*a* shows the layout of the first initial signal lines Vinit1, the second initial signal lines Vinit2 and the third initial signal lines Vinit3 in the display panel 100 in a case where the main display region A1 is partially compressed. FIG. 27*b* shows the layout of the first initial signal lines Vinit1, the second initial signal lines Vinit2 and the third initial signal lines Vinit3 in the display panel 100 in a case where the entire main display region A1 is compressed.

In some examples, in the case where the main display region A1 is partially compressed, the second pixel circuits may, for example, be located only on two opposite sides of the auxiliary display region A2 in the first direction X.

For example, as shown in FIG. 27*a*, the second initial signal lines Vinit2 are disposed only in a region in which the second pixel circuits are disposed, and are electrically connected to the respective second pixel circuits. The remaining region is only provided with the first initial signal lines Vinit1 and the third initial signal lines Vinit3.

In some other examples, in the case where the entire main display region is compressed, the plurality of pixel circuits in the display panel further includes a plurality of dummy second pixel circuits. The plurality of dummy second pixel circuits are located in respective column regions in which the second pixel circuits are located. Fourth nodes of the plurality of dummy second pixel circuits are each in a floating state and not electrically connected to a second light-emitting device.

For example, as shown in FIG. 27*b*, a first initial signal line Vinit1, a second initial signal line Vinit2 and a third initial signal line Vinit3 may be cyclically arranged in the second direction Y. A part of second initial signal lines Vinit2 are each electrically connected to a respective second pixel circuit, and the other part of the second initial signal lines Vinit2 are each electrically connected to a respective dummy second pixel circuit.

In some examples, a distribution density of the second light-emitting devices 22 is less than or equal to a distribution density of the first light-emitting devices 21. In this way, it is conducive to ensuring that the portion of the display panel 100 located in the auxiliary display region A2 has the relatively high light transmittance.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a main display region and an auxiliary display region; the display panel comprising:

a plurality of pixel circuits located in the main display region; the plurality of pixel circuits including a plurality of first pixel circuits and a plurality of second pixel circuits;

a plurality of light-emitting devices including a plurality of first light-emitting devices located in the main display region and a plurality of second light-emitting devices located in the auxiliary display region; wherein the plurality of first pixel circuits are electrically connected to the plurality of first light-emitting devices; the plurality of second pixel circuits are electrically connected to the plurality of second light-emitting devices; and a plurality of first initial signal lines and a plurality of second initial signal lines;

wherein a first pixel circuit is electrically connected to a first initial signal line and a first light-emitting device, and is configured to transmit a first initial signal transmitted by the first initial signal line to the first light-emitting device, so as to reset the first light-emitting device; a second pixel circuit is electrically connected to a second initial signal line and a second light-emitting device, and is configured to transmit a second initial signal transmitted by the second initial signal line to the second light-emitting device, so as to reset the second light-emitting device; and a voltage value of the second initial signal is greater than a voltage value of the first initial signal.

2. The display panel according to claim 1, further comprising a plurality of connection lines; wherein the second pixel circuit is electrically connected to the second light-emitting device via a connection line; and a material of the plurality of connection lines includes a light-transmissive conductive material.

3. The display panel according to claim 2, wherein a difference between the voltage value of the second initial signal and the voltage value of the first initial signal is positive correlation with a length of the connection line.

4. The display panel according to claim 1, wherein the display panel comprises a plurality of light-emitting device columns that are sequentially arranged in a first direction; a light-emitting device column includes first light-emitting devices, of the plurality of first light-emitting devices located in the main display region, and second light-emitting devices, of the plurality of second light-emitting devices located in the auxiliary display region, that are sequentially arranged in a second direction;

the display panel further comprises a plurality of data lines each extending in the second direction; wherein the first direction intersects the second direction;

first pixel circuits electrically connected to the first light-emitting devices in the light-emitting device column and second pixel circuits electrically connected to the second light-emitting devices in the light-emitting device column are electrically connected to a same data line.

5. The display panel according to claim 4, wherein a portion, electrically connected to the second pixel circuits, of the data line is located in the main display region.

6. The display panel according to claim 5, wherein the second pixel circuits electrically connected to the second light-emitting devices in the light-emitting device column are sequentially arranged in the second direction, and are located on a side of the auxiliary display region in the first direction;

the data line includes: a first data sub-line and a second data sub-line that extend in the second direction and are respectively located on two opposite sides of the auxiliary display region in the second direction, a third data sub-line extending in the second direction and located on a side of the auxiliary display region in the first direction, a first transfer line extending in the first direction and connected to the first data sub-line and the third data sub-line, and a second transfer line extending in the first direction and connected to the second data sub-line and the third data sub-line;

wherein the first data sub-line and the second data sub-line are electrically connected to the first pixel circuits in the light-emitting device column, and the third data sub-line is electrically connected to the second pixel circuits in the light-emitting device column.

7. The display panel according to claim 6, further comprising:

a substrate, and a first source-drain conductive layer and a second source-drain conductive layer that are sequentially arranged, in a direction away from the substrate, on a side of the substrate; wherein the first data sub-line, the second data sub-line and the third data sub-line are located in the second source-drain conductive layer, and the first transfer line and the second transfer line are located in the first source-drain conductive layer.

8. The display panel according to claim 1, wherein a pixel circuit includes a compensation transistor;

the compensation transistor includes an active pattern and a gate pattern that are arranged in sequence in a direction away from the substrate; the active pattern includes a first semiconductor portion, a conductor portion and a second semiconductor portion that are connected in sequence; the gate pattern includes a first sub-gate and a second sub-gate that are connected to each other; the first semiconductor portion is partially opposite to the first sub-gate, and the second semiconductor portion is partially opposite to the second sub-gate;

the display panel further comprises a third initial signal line electrically connected to the pixel circuit and a shielding block electrically connected to the third initial signal line; wherein the shielding block is partially opposite to the conductor portion.

9. The display panel according to claim 8, wherein the shielding block and the third initial signal line are of a one-piece structure.

10. The display panel according to claim 8, wherein the first initial signal lines, the second initial signal lines and the third initial signal line are located in a same layer;

the plurality of pixel circuits are arranged in a plurality of rows;

in a first initial signal line, a second initial signal line and the third initial signal line that are located between two adjacent rows of pixel circuits, the third initial signal line is closer to the compensation transistor electrically connected to the third initial signal line than the first initial signal line and the second initial signal line.

11. The display panel according to claim 10, wherein the pixel circuit further includes a second reset transistor; a first electrode of the second reset transistor is electrically connected to the third initial signal line, and a second electrode of the second reset transistor is electrically connected to a second electrode of the compensation transistor;

the display panel further comprises a reset signal line electrically connected to a control electrode of the second reset transistor; wherein the second reset transistor is configured to transmit a third initial signal transmitted by the third initial signal line to the second electrode of the compensation transistor under control of a reset signal transmitted by the reset signal line; and an orthographic projection of the reset signal line on the substrate is located between an orthographic projection of the first initial signal line on the substrate and an orthographic projection of the second initial signal line on the substrate or located between the orthographic projection of the second initial signal line on the substrate and an orthographic projection of the third initial signal line on the substrate.

12. The display panel according to claim 11, further comprising a substrate, and a first gate conductive layer and a second gate conductive layer that are sequentially arranged, in a direction away from the substrate, on a side of the substrate; wherein the reset signal line is located in the first gate conductive layer;

the first initial signal lines, the second initial signal lines and the third initial signal line are located in the second gate conductive layer.

13. The display panel according to claim 1, wherein the plurality of pixel circuits are arranged in a plurality of rows and a plurality of columns;

each pixel circuit includes a storage capacitor;

the storage capacitor includes a first plate and a second plate that are arranged in sequence;

wherein second plates of at least two storage capacitors in a same row of pixel circuits are connected to each other to be of a one-piece structure.

14. The display panel according to claim 13, further comprising a plurality of voltage signal lines each extending in a second direction; wherein a voltage signal line is electrically connected to second plates of storage capacitors in a column of pixel circuits; the column of pixel circuits extend in the second direction.

15. The display panel according to claim 14, wherein the display panel further comprises a substrate, and a second gate conductive layer and a second source-drain conductive layer that are sequentially arranged, in a direction away from the substrate, on a side of the substrate;

the second plates are located in the second gate conductive layer, and the plurality of voltage signal lines are located in the second source-drain conductive layer.

16. The display panel according to claim 15, wherein the pixel circuit further includes a compensation transistor and a transfer portion that is connected to a second electrode of the compensation transistor and the first plate of the storage capacitor;

the display panel further comprises a first source-drain conductive layer located between the second gate conductive layer and the second source-drain conductive layer;

the transfer portion is located in the first source-drain conductive layer;

an orthographic projection of the transfer portion on the substrate is located within an orthographic projection of a voltage signal line electrically connected to the pixel circuit on the substrate.

17. The display panel according to claim 15, further comprising a first gate conductive layer disposed on a side of the second gate conductive layer away from the second source-drain conductive layer and a first planarization layer disposed between the second gate conductive layer and the second source-drain conductive layer; wherein the pixel circuit further includes a first light-emitting control transistor and a second light-emitting control transistor;

the first planarization layer is provided with first via holes and second via holes therein; a first electrode of the first light-emitting control transistor is electrically connected to a voltage signal line electrically connected to the pixel circuit through a first via hole, and a second electrode of the second light-emitting control transistor is electrically connected to a light-emitting device through a second via hole; and the display panel further comprises an enable signal line electrically connected to a control electrode of the first light-emitting control transistor and a control electrode of the second light-emitting control transistor; wherein the enable signal line is located in the first gate conductive layer;

orthogonal projections of the first via hole and the second via hole on the substrate are located within an orthographic projection of the enable signal line on the substrate.

18. The display panel according to claim 17, further comprising a plurality of data lines each extending in the second direction, and a plurality of third initial signal lines, a plurality of scan signal lines and a plurality of reset signal lines each extending in a first direction; wherein the first direction intersects the second direction; wherein the pixel circuit further includes a driving transistor, a compensation transistor, a first reset transistor, a second reset transistor and a switching transistor;

a control electrode of the compensation transistor is electrically connected to a scan signal line, and a second electrode of the compensation transistor is electrically connected to a first node;

a control electrode of the second reset transistor is electrically connected to a reset signal line, a first electrode of the second reset transistor is electrically connected to a third initial signal line, and a second electrode of the second reset transistor is electrically connected to the first node;

a second electrode of the first light-emitting control transistor is electrically connected to a second node;

a control electrode of the driving transistor is electrically connected to the first node, a first electrode of the driving transistor is electrically connected to the second node, and a second electrode of the driving transistor is electrically connected to a third node;

a control electrode of the switching transistor is electrically connected to the scan signal line, a first electrode of the switching transistor is electrically connected to a data line, and a second electrode of the switching transistor is electrically connected to the second node;

a first electrode of the second light-emitting control transistor is electrically connected to the third node;

the first plate of the storage capacitor is electrically connected to the first node;

a control electrode of the first reset transistor is electrically connected to the scan signal line; a first electrode of a first reset transistor of the first pixel circuit is electrically connected to the first initial signal line, and a second electrode of the first reset transistor of the first pixel circuit is electrically connected to a first light-emitting device; a first electrode of a first reset transistor of the second pixel circuit is electrically connected to the second initial signal line, and a second electrode of the first reset transistor of the second pixel circuit is electrically connected to a second light-emitting device.

19. A display module, comprising:

the display panel according to claim 1;

a cover plate located on a light exit side of the display panel; and a protective layer located on a non-light exit side of the display panel.

20. A display apparatus comprising: the display module according to claim 19; and an optical element located on the non-light exit side of the display panel of the display module; wherein the optical element is located in the auxiliary display region of the display panel.

* * * * *